United States Patent [19]
Shindo et al.

[11] Patent Number: 5,817,185
[45] Date of Patent: Oct. 6, 1998

[54] METHOD FOR WASHING SUBSTRATES

[75] Inventors: Naoki Shindo, Nirasaki; Shigenori Kitahara, Kikuchi-gun; Takayuki Toshima, Nirasaki, all of Japan; Kenji Yokomizo, Austin, Tex.

[73] Assignee: Tokyo Electron Limited, Japan

[21] Appl. No.: 976,262

[22] Filed: Nov. 21, 1997

Related U.S. Application Data

[62] Division of Ser. No. 583,979, Jan. 11, 1996, Pat. No. 5,730,162.

[30] Foreign Application Priority Data

| Jan. 12, 1995 | [JP] | Japan | 7-019820 |
| Jan. 12, 1995 | [JP] | Japan | 7-019821 |
| Jan. 12, 1995 | [JP] | Japan | 7-019822 |
| Jan. 12, 1995 | [JP] | Japan | 7-019823 |
| Jan. 12, 1995 | [JP] | Japan | 7-019824 |
| Jan. 12, 1995 | [JP] | Japan | 7-019825 |

[51] Int. Cl.⁶ .................................................. B08B 13/00
[52] U.S. Cl. .................... 134/25.4; 134/15; 134/26; 134/66; 134/32; 134/82; 134/902; 414/222
[58] Field of Search ................... 134/32, 902, 66, 134/82, 25.4, 15, 26; 414/222

[56] References Cited

U.S. PATENT DOCUMENTS

| 5,236,515 | 8/1993 | Ueno et al. | 134/25.4 |
| 5,261,431 | 11/1993 | Ueno et al. | 134/66 |
| 5,261,776 | 11/1993 | Burck et al. | 414/416 |
| 5,327,921 | 7/1994 | Mokuo et al. | 134/182 |
| 5,445,171 | 8/1995 | Ohuori et al. | 134/902 |
| 5,503,171 | 4/1996 | Yokomizo et al. | 134/902 |
| 5,520,744 | 5/1996 | Fujikawa et al. | 134/902 |
| 5,575,079 | 11/1996 | Yokomizo et al. | 34/78 |
| 5,730,162 | 3/1998 | Shindo et al. | 134/66 |

FOREIGN PATENT DOCUMENTS

| 62-136825 | 6/1987 | Japan . |
| 64-81230 | 3/1989 | Japan . |
| 1-120828 | 5/1989 | Japan . |
| 1-138721 | 5/1989 | Japan . |
| 2-130827 | 5/1990 | Japan . |
| 3-116731 | 5/1991 | Japan . |
| 4-15920 | 1/1992 | Japan . |
| 4-196531 | 7/1992 | Japan . |
| 4-332129 | 11/1992 | Japan . |
| 5-182946 | 7/1993 | Japan . |
| 5-53241 | 7/1993 | Japan . |
| 5-326476 | 12/1993 | Japan . |
| 6-204201 | 7/1994 | Japan . |

Primary Examiner—Jill Warden
Assistant Examiner—Sharidan Carrillo
Attorney, Agent, or Firm—Graham & James LLP

[57] ABSTRACT

A method of washing substrates arranged at a substantially equal pitch internal in a cassette which includes steps of (a) transferring the substrates to a holder a pitch interval narrower than the arrangement pitch interval in said cassette; (b) supplying a washing solution into a processing bath; (c) conveying the holder holding the substrates into the processing bath; (d) dipping the substrates in the washing solution in the processing bath to wash the substrates; and (e) supplying a rinse solution into the processing bath to substitute the washing solution with the rinse solution to rinse the substrates in the processing bath.

7 Claims, 42 Drawing Sheets

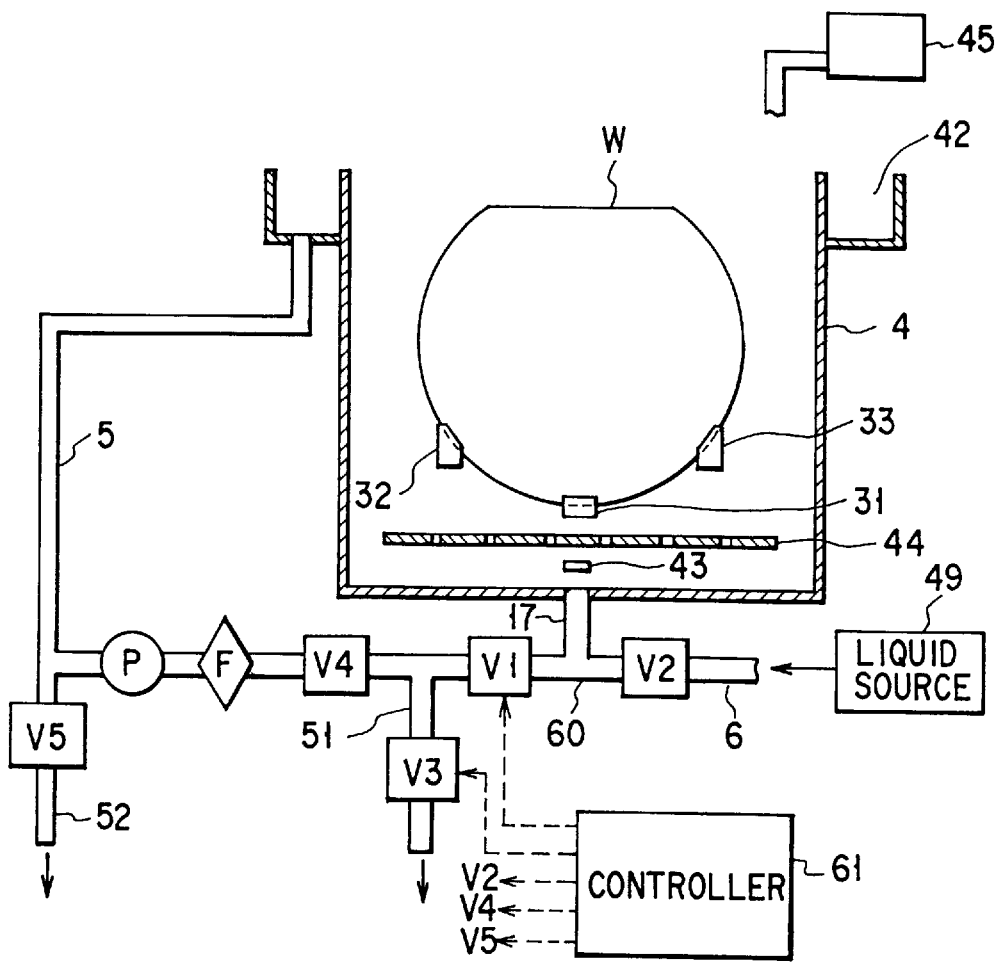
F I G. 3
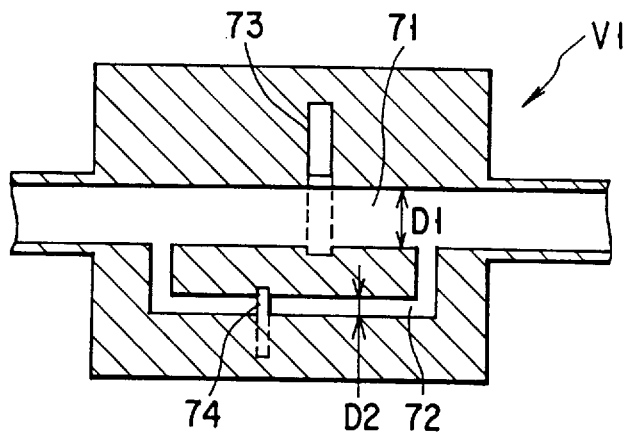
F I G. 4

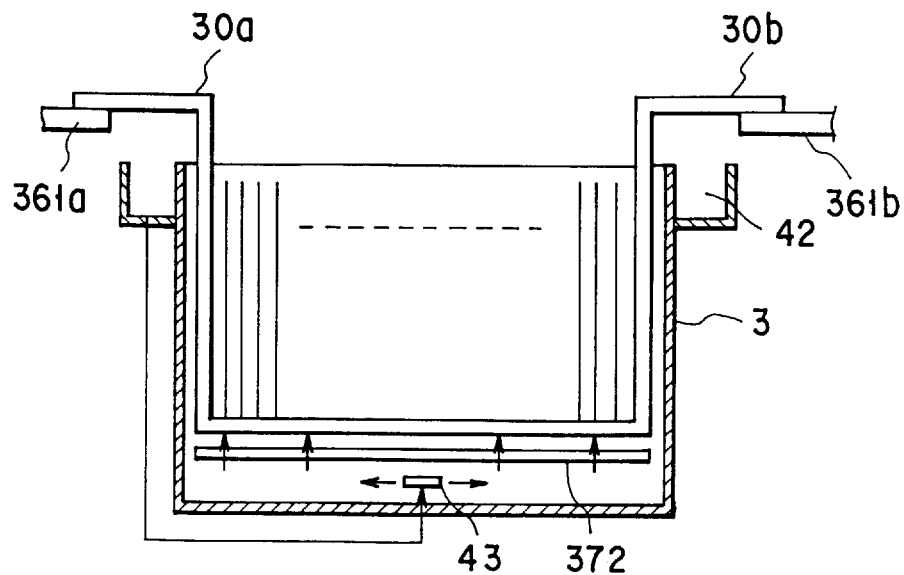
F I G. 21A
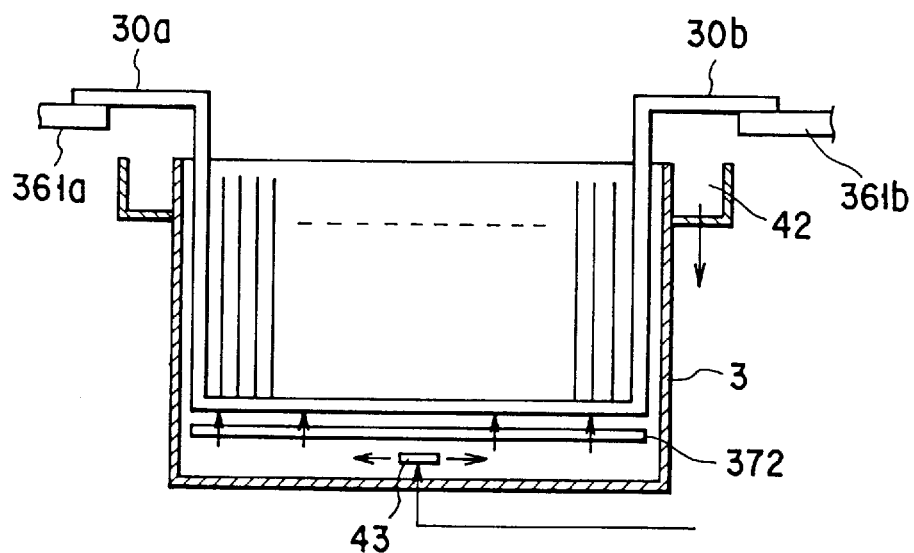
F I G. 21B

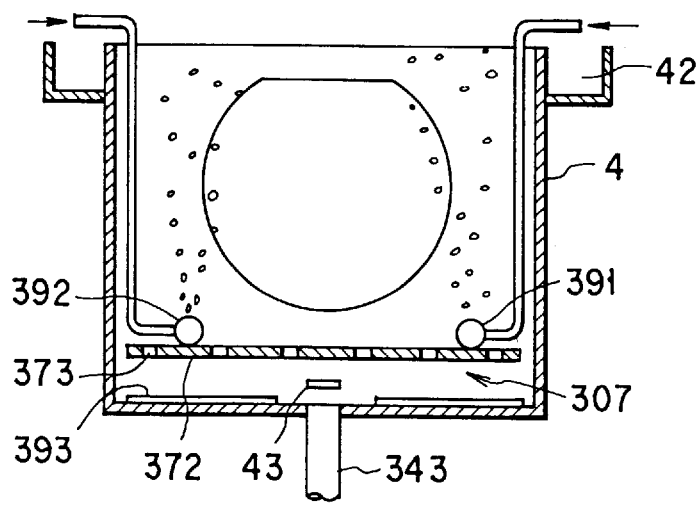
F I G. 24

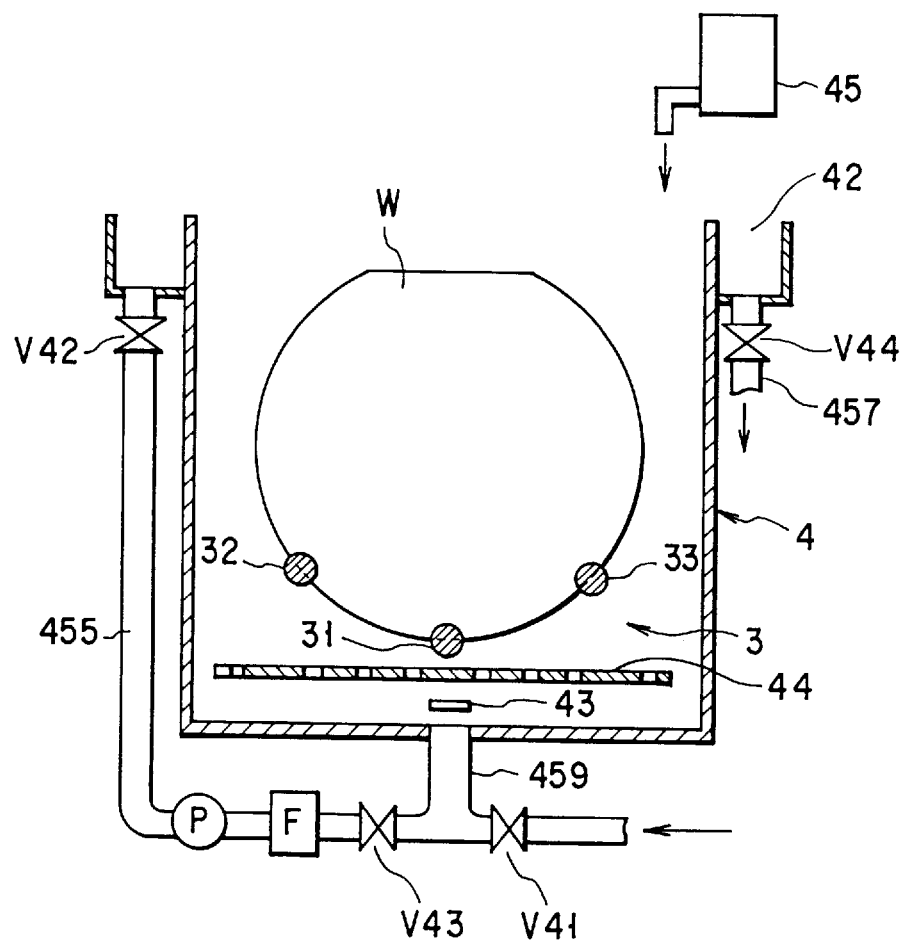
F I G. 29

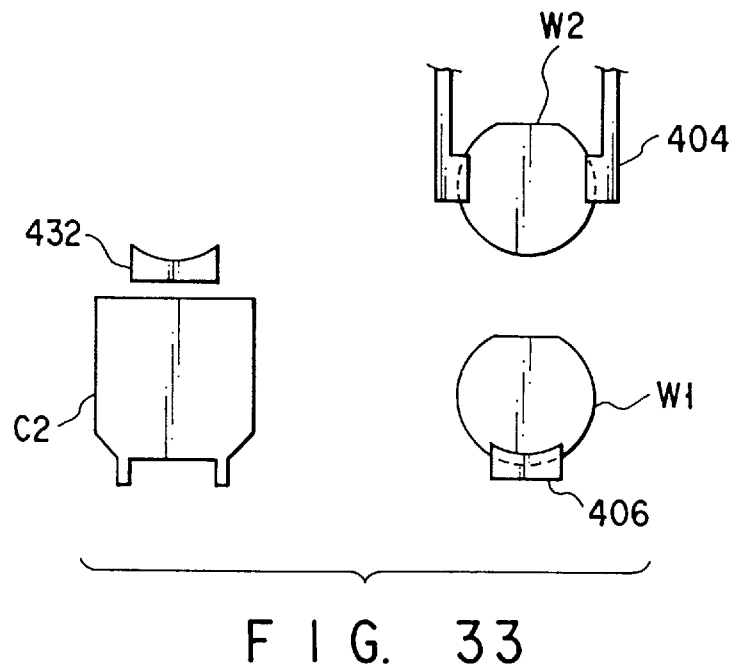
F I G. 33
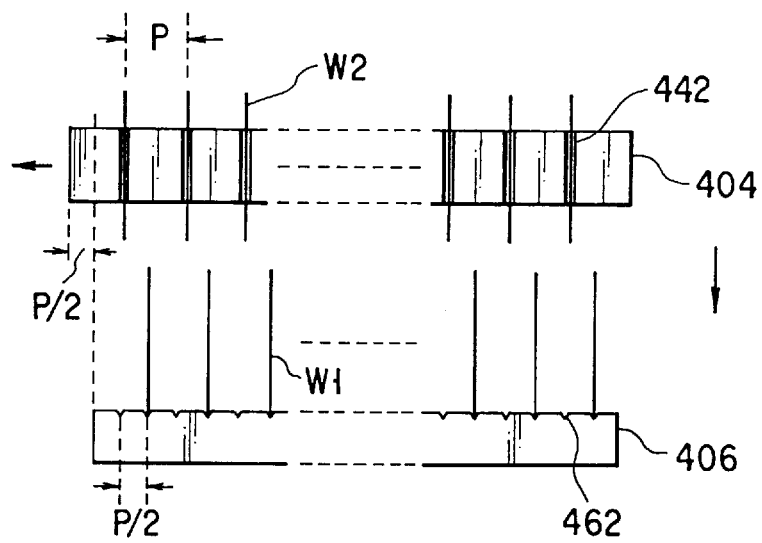
F I G. 34

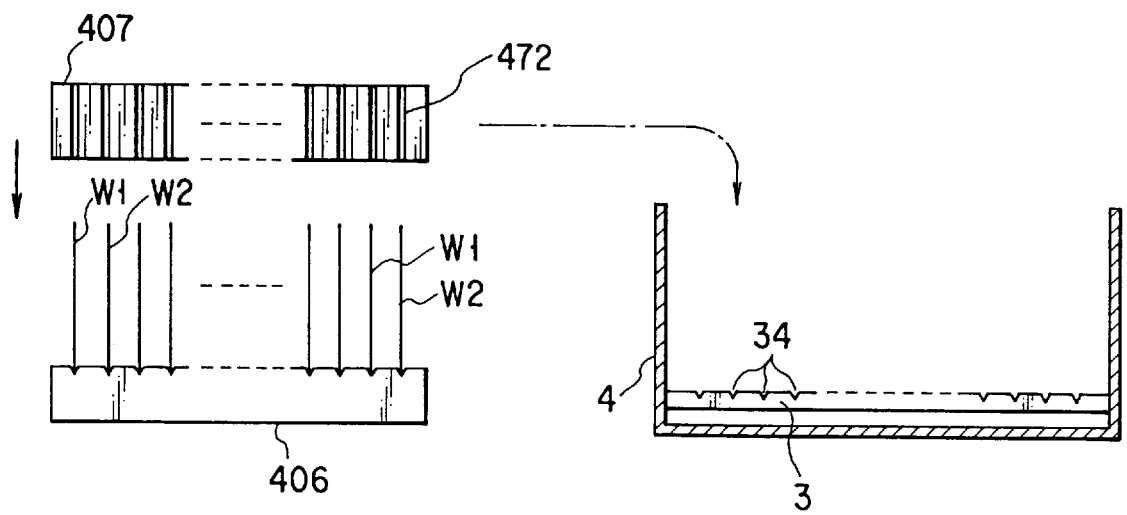
F I G. 35
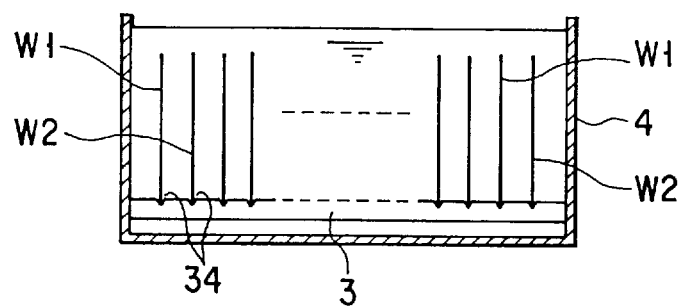
F I G. 36

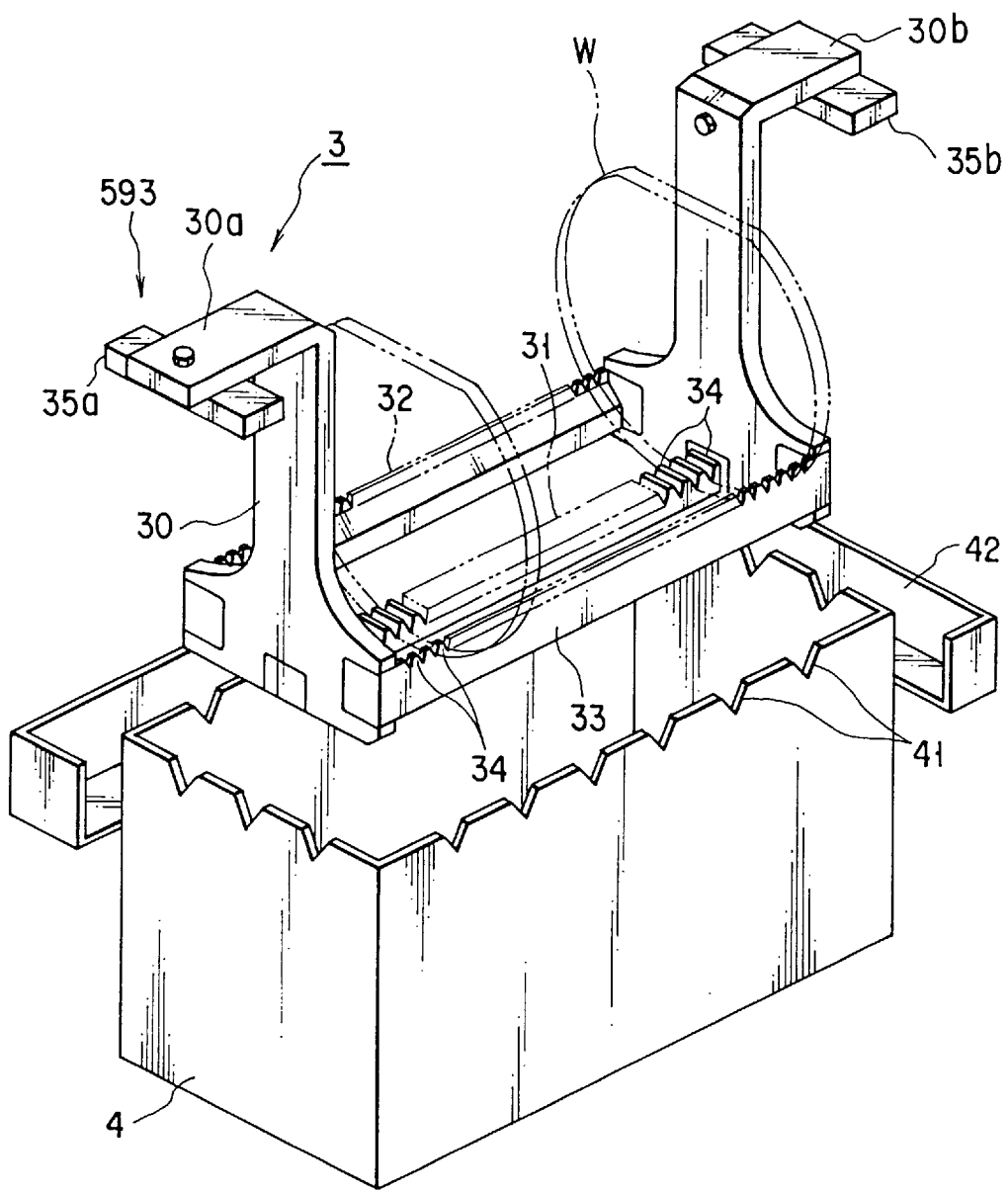
F I G. 37

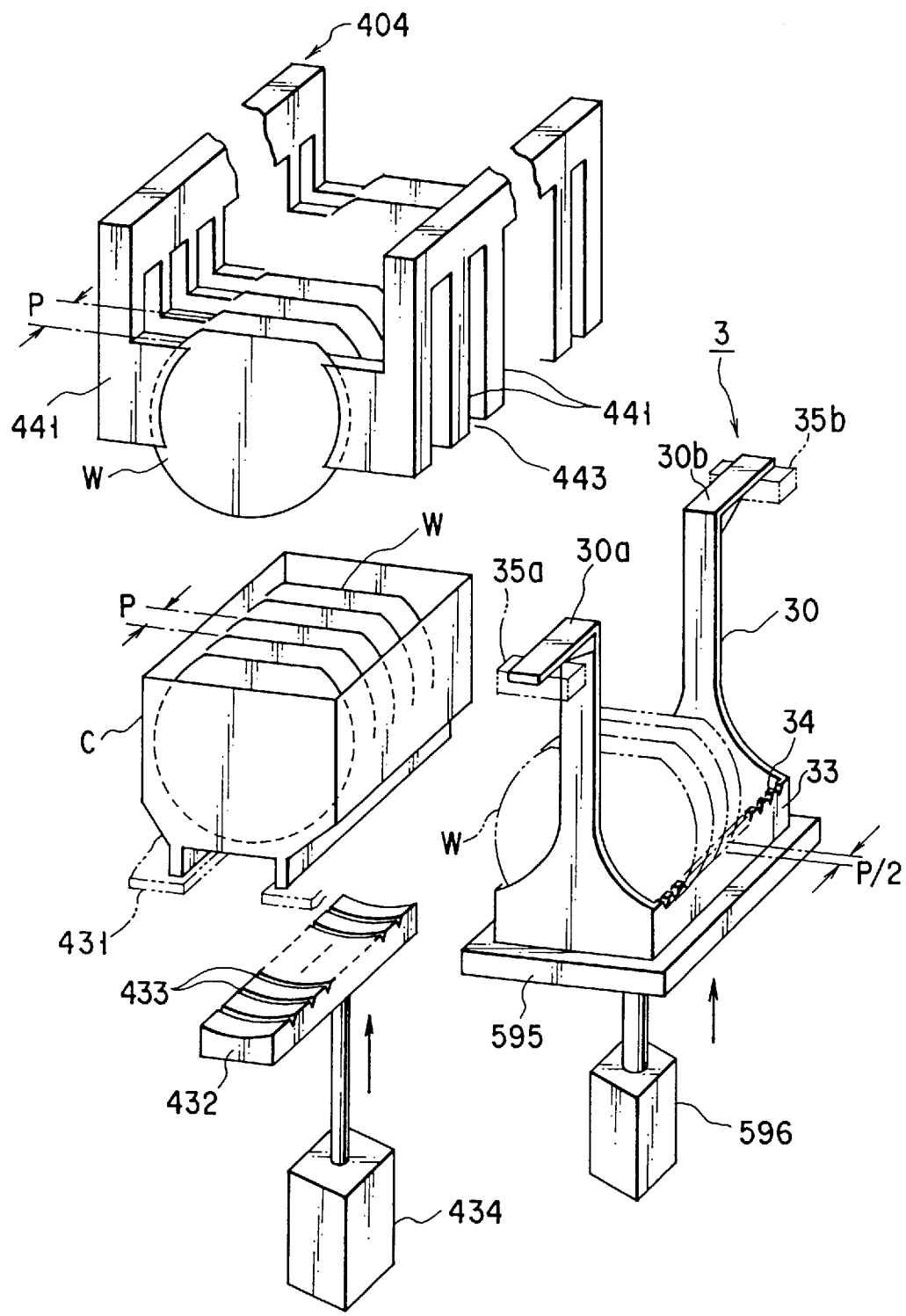
F I G. 38

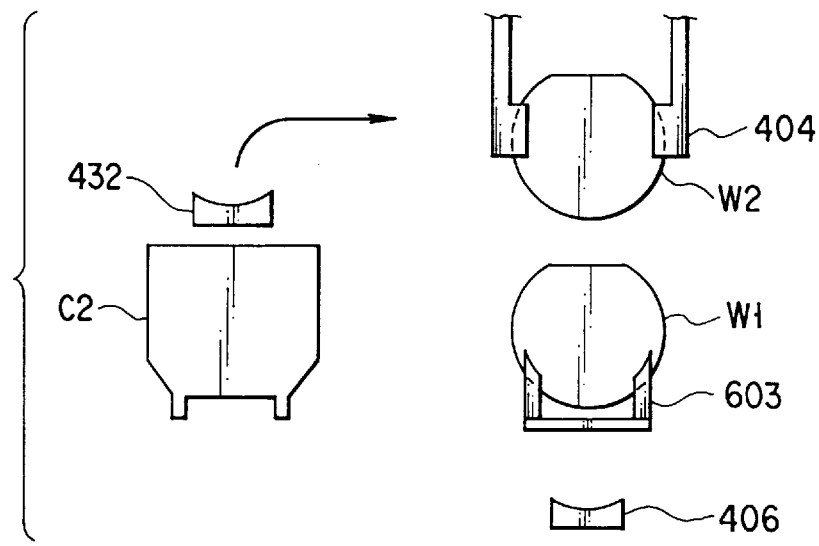
F I G. 42C
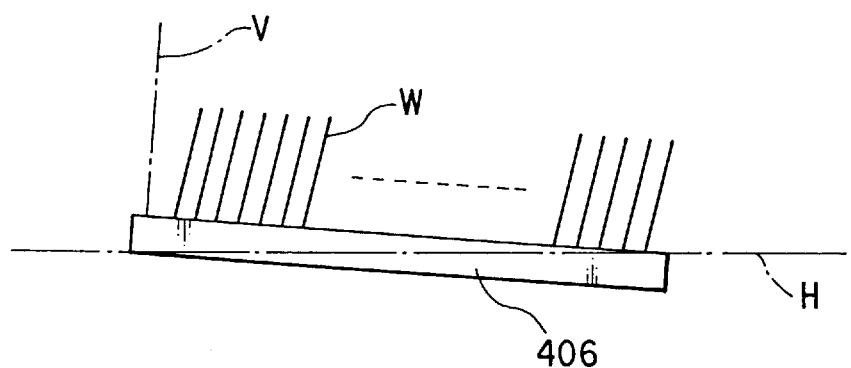
F I G. 43

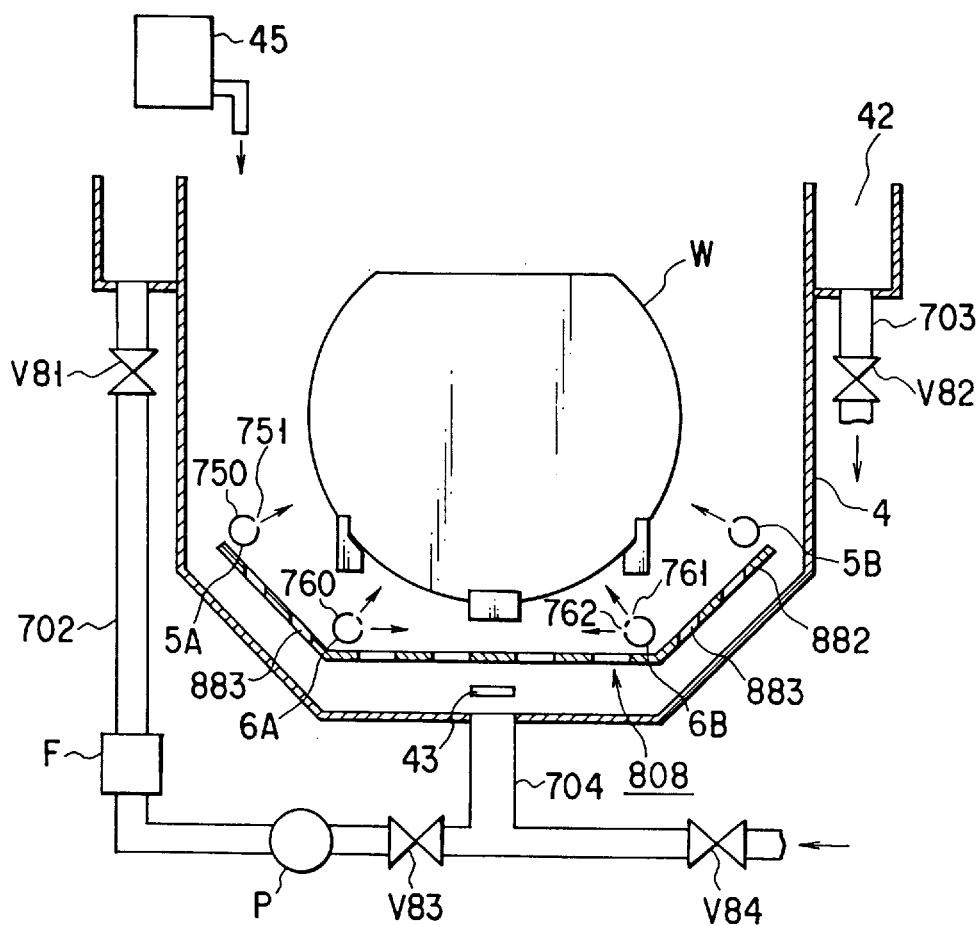
F I G. 50
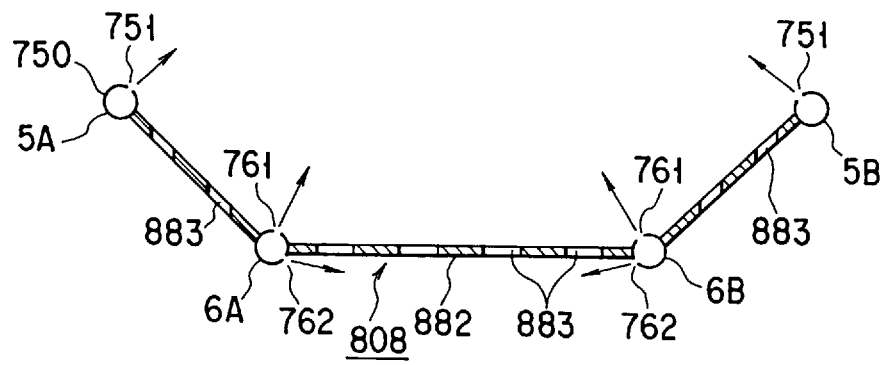
F I G. 51

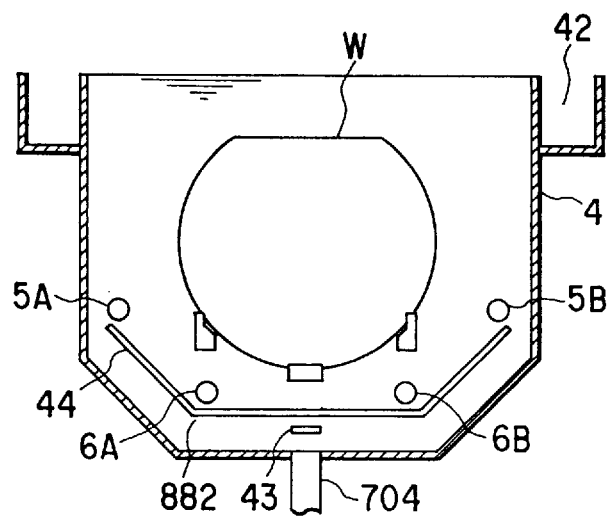
F I G. 52A
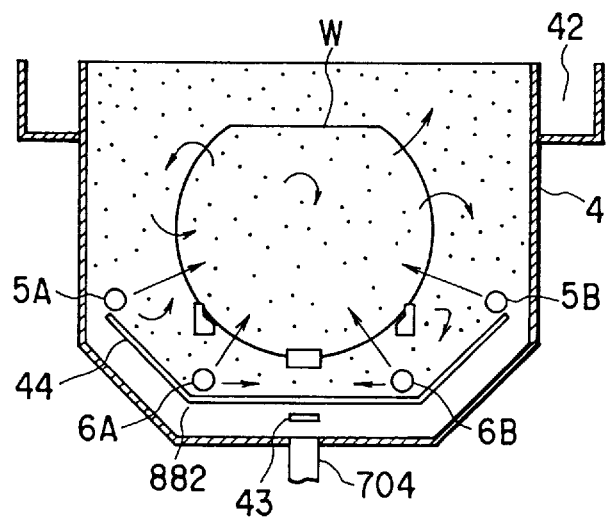
F I G. 52B
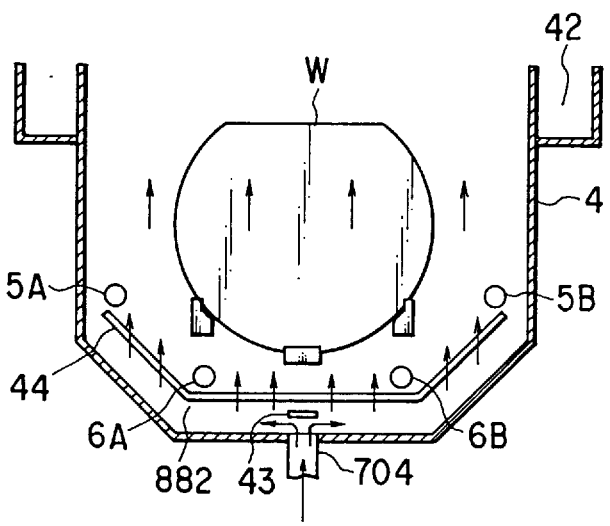
F I G. 52C

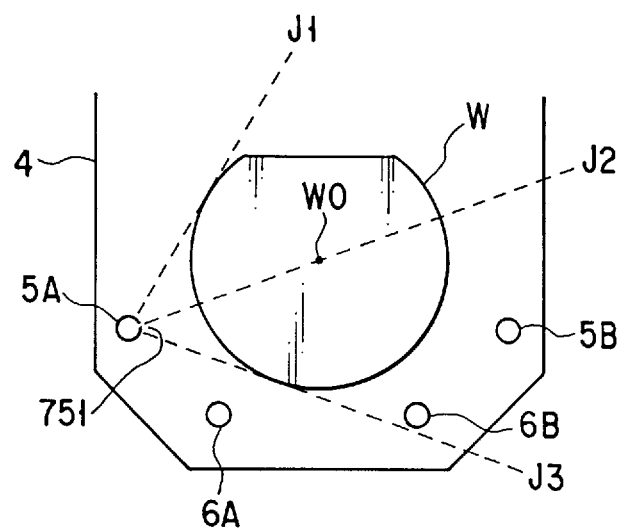
F I G. 53
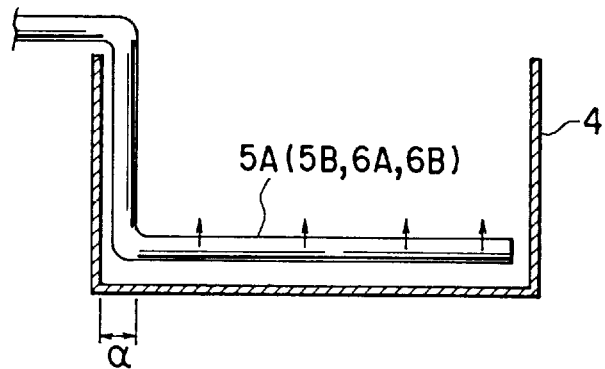
F I G. 54A
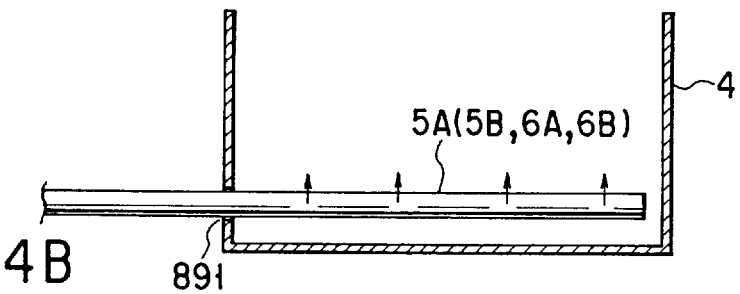
F I G. 54B

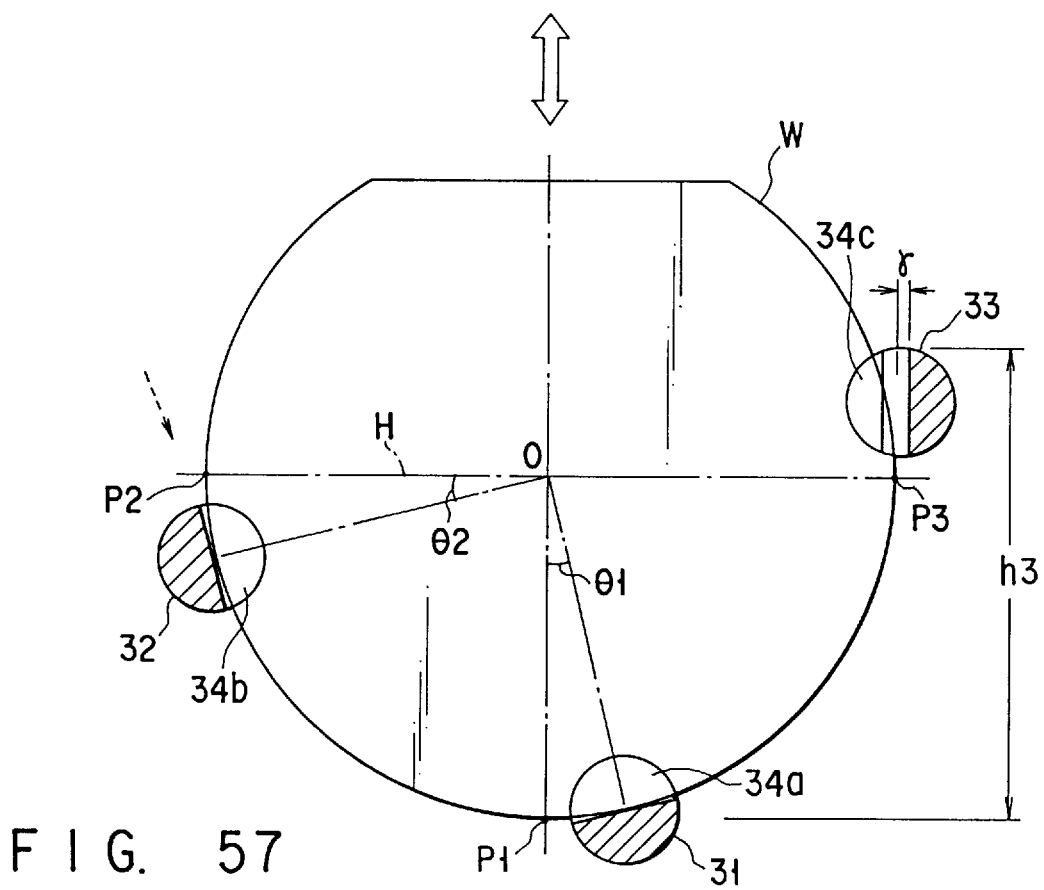
F I G. 57

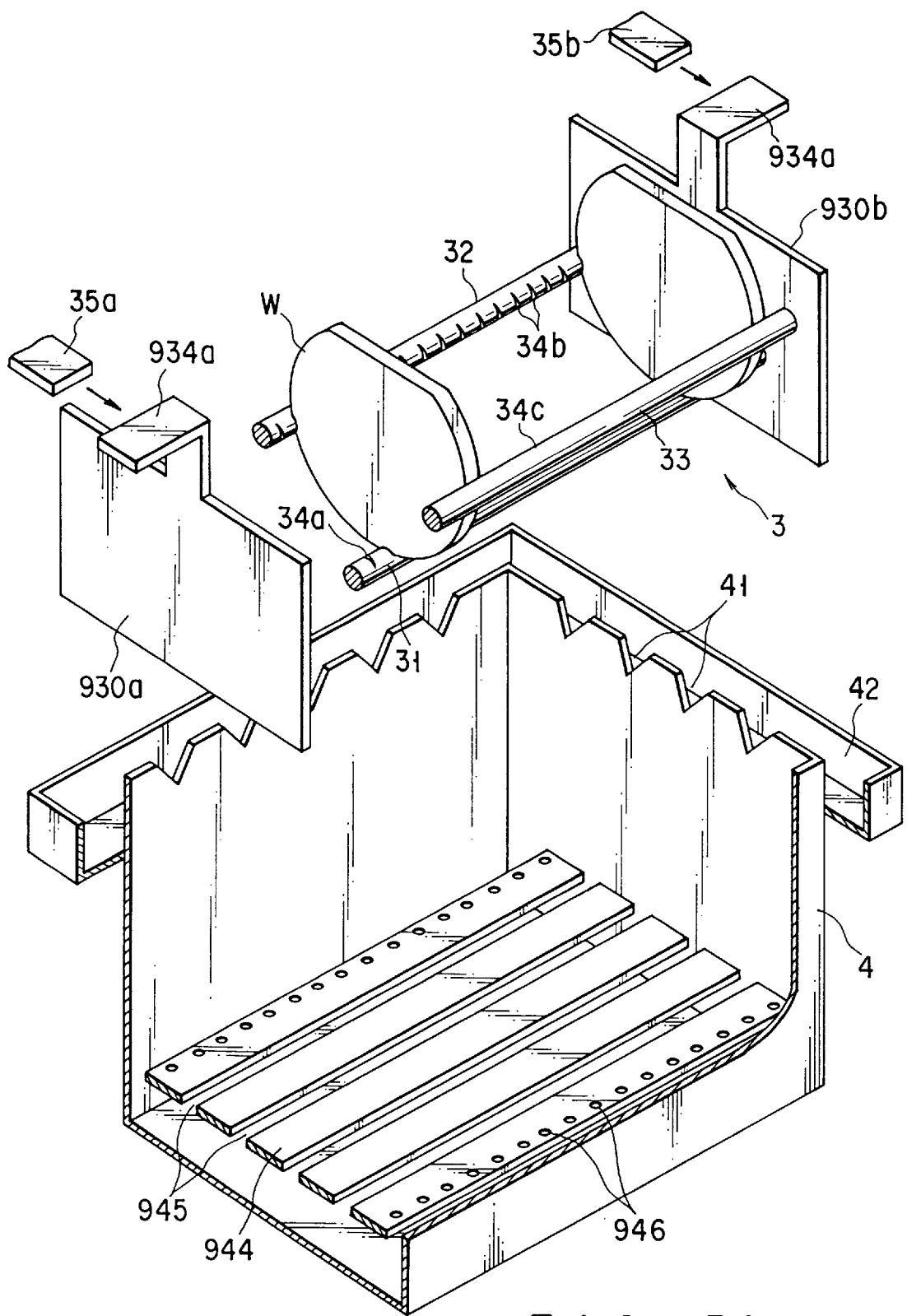
F I G. 56

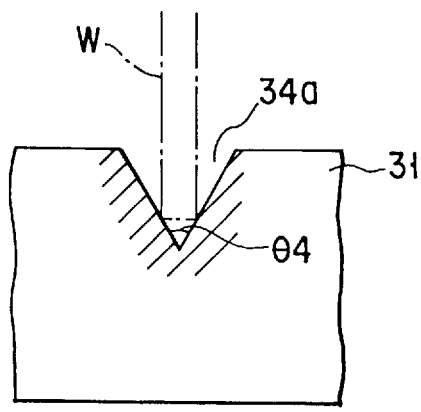
F I G. 58A
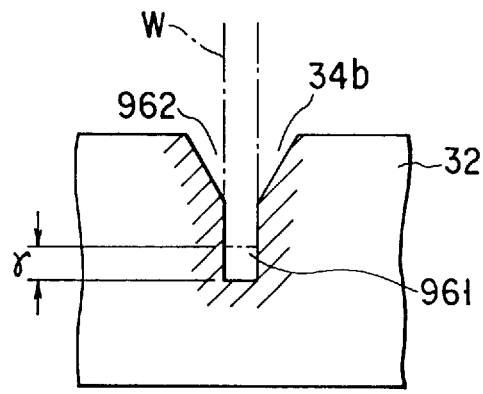
F I G. 58B
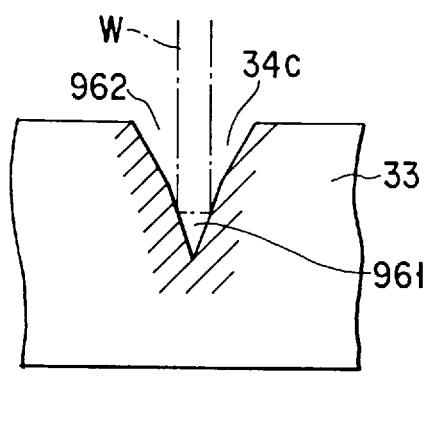
F I G. 58C
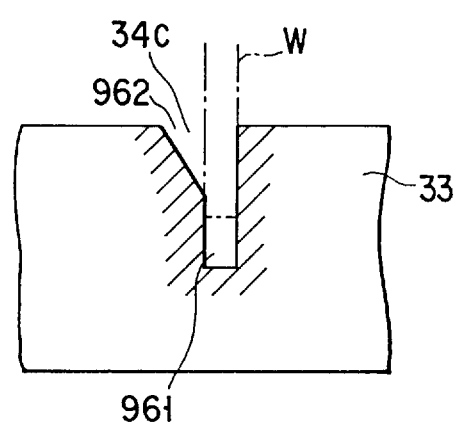
F I G. 58D

METHOD FOR WASHING SUBSTRATES

This is a division of application Ser. No. 08/583,979, filed on Jan. 11, 1996, now U.S. Pat. No. 5,730,162.

BACKGROUND OF THE INVENTION

1. Detailed Description of the Invention

The present invention relates to a substrate washing apparatus and substrate washing method for washing substrates such as semiconductor wafers.

2. Prior Art

In the manufacturing process of semiconductor devices, washing apparatuses are used to remove particles, organic contaminants, contamination such as metal impurities from the surfaces of semiconductor wafers. Of these apparatuses, a wet washing apparatus is widely available because it can effectively remove the contamination, and batch processing can be performed to achieve a high throughput.

In the washing apparatus of this type, after wafers are processed with chemicals such as ammonia, hydrofluoric acid, and hydrochloric acid in a chemical bath, the wafers are rinsed with, e.g., pure water in a rinse bath. The apparatus is arranged such that pairs of chemical baths and rinse baths are arranged in series with each other for respective chemicals, and a convey system for sequentially conveying, e.g., about 50 wafers to each bath at once is provided. A chemical or a rinse solution is supplied from the bottom portion of the chemical or rinse bath and goes up through a straightening plate along the plate surfaces of a group of wafers. In recent years, to downsize the apparatus, a washing apparatus of a so-called one-bath system using a bath common to a chemical bath and a rinse bath has been examined.

FIG. 8 is a sectional view showing the main part of an example of a conventional washing apparatus. A reception bath 10 for receiving an overflowing solution is arranged at the peripheral edge of the upper portion of a processing bath 4. A rinse solution supply pipe 11 serving as part of a washing solution circulating path is connected to two portions on the bottom portion of the processing bath 4. Diffusion plates 12a are attached to rinse solution supply ports 12 of the processing bath 4, and a straightening plate 13 having a plurality of communication holes 13a is disposed thereabove.

A washing step using this apparatus will be described. First of all, an aqueous hydrofluoric acid solution as a washing solution is circulated and supplied from a washing solution supply portion (not shown) into the processing bath 4. Next, e.g., about 50 wafers W are vertically aligned on and held by a holder 14, and dipped in a chemical. Upon completion of washing processing, a rinse solution, e.g., pure water is supplied into the processing bath 4 through the rinse solution supply pipe 11. The chemical is substituted with the rinse solution to perform rinse processing.

FIG. 9 is a schematic view for explaining a solution circulating system of the washing apparatus in FIG. 8. Referring to FIG. 9, reference numeral 15 denotes a washing solution flow path serving as a washing solution circulating path; 16, a rinse solution supply path for supplying a rinse solution; and 17, a common flow path connected to the processing bath 4. Reference symbol P denotes a pump; symbol F denotes a filter; and symbol Va to Vc denotes valves.

In the above apparatus, in washing the wafers W, the valves Va and Vc are closed, and the valve Vb is opened. A washing solution is circulated in the processing bath 4 through the washing solution flow path 15 and the common flow path 17 by the pump P to etch oxide films on the surfaces of the wafers W. On the other hand, in rinsing the wafers W, the valve Vb is closed, and the valves Va and Vc are opened. A rinse solution is supplied into the processing bath 4 through the rinse solution supply path 16 and the common flow path 17. The overflowing washing solution is stored in the reception bath 10 and discharged through the washing solution flow path 15 and the valve Va.

In the washing apparatus shown in FIG. 9, however, when the washing solution is to be substituted with the rinse solution, the rinse solution is supplied while the valve Vb is kept closed, and the valves Va and Vc are open. Owing to this arrangement, the following problem is posed. That is, a so-called dead zone as a washing solution trapping portion exists between the valve main body of the valve Vb and a branch point T as the connection point of the flow path 17 present between the valves Vb and Vc. When the rinse solution is supplied into the processing bath 4 through the rinse solution supply path 16, the washing solution remaining in this dead zone is gradually mixed in the rinse solution. Accordingly, in rinse processing, the substitution time (more specifically, a resistivity recovery time) with the rinse solution is prolonged to consume a large amount of rinse solution, resulting in a decrease in rinse efficiency.

It is an object of the present invention to provide a substrate washing apparatus in which a resistivity recovery time is short, the throughput is high, and an amount of rinse solution used is small when washing processing and rinse processing are performed in the same processing bath.

A conventional washing apparatus will be described with reference to FIG. 15. A straightening plate 13 is arranged on the bottom portion of a processing bath 4. First, a hydrofluoric acid solution as a washing solution is supplied into the processing bath 4 and circulated through a circulating path 15. For example, 50 wafers W are held parallel to each other by a holder 14 having holding rods 14a to 14c and dipped in the chemical. Then, the circulation of the chemical is stopped, and pure water as a rinse solution is supplied into the processing bath 4 through a rinse solution supply path 16. At the same time, the overflowing solution is discharged through a drain pipe 15a. The washing solution in the processing bath 4 is substituted with the rinse solution to rinse the wafers W. Note that reference symbols Va, Vb, Vc, and Vd denote valves; P, a pump; and F, a filter.

In the above-mentioned method, since the chemical is discharged upon substitution with the pure water, the consumption of the chemical becomes large to increase the cost. In addition, since the substitution time with the pure water, i.e., a time required for recovering the resistivity of the solution to the value of the pure water is long, an increase in throughput is avoided.

On the other hand, a method of discharging a chemical from a processing bath 4 upon completion of chemical processing, and filling pure water in the processing bath 4 through a rinse solution supply path 16 has been examined. In this case, the pure water is supplied from the bottom portion of the processing bath 4 into the processing bath 4 through a PFA (tetrafluoroethylene-perfluoroalkylvinyl ether copolymer) tube having an outer diameter of ¾ inches, so that the flow rate of the rinse solution is 50 l/min at most. In this manner, since pure water cannot be rapidly supplied, a time interval between the start of discharging a washing solution and completion of filling the rinse solution in the processing bath requires 20 to 25 sec or more in a processing bath for an 8" wafer W.

As a result, the lower portion of the wafer W is in contact with a hydrofluoric acid solution because the lower portion is wet, but its upper portion is dry due to the shortage of the hydrofluoric acid solution. The wet portion and the dry portion are nonuniformly etched, degrading the etching uniformity. Surfaces are nonuniformly processed not only in etching processing with a hydrofluoric acid solution but also in another washing processing.

It is an object of the present invention to provide a substrate washing apparatus and substrate washing method capable of uniformly processing surfaces.

FIG. 25 is a view showing the main part of a conventional washing apparatus. In the conventional washing apparatus, e.g., 50 wafers W are gripped from their two sides by a wafer chuck 7 at once. First, the wafers W are transferred to a wafer boat 14A in a chemical bath 1A and dipped in a chemical. While circulating the chemical, the wafers W are washed. Then, the wafers W on the wafer boat 14A are gripped by the wafer chuck 7, transferred to a wafer boat 14B in a rinse bath 1B, and dipped. For example, pure water is supplied from the bottom portion of the rinse bath 1B to rinse the wafers W.

25 wafers W are normally stored in a resin wafer cassette C when the wafers W is to be loaded into the washing apparatus. If 50 wafers W are to be processed at once, wafers corresponding to two cassettes are gripped by the wafer chuck 7. To increase versatility, the wafer cassette holds wafers W at a predetermined pitch, e.g., at a pitch of 6.35 mm for 8" wafers, or at a pitch of 4.76 mm for 6" wafers. The length of the wafer line gripped by the wafer chuck 7 is a dimension obtained by adding the total pitch length to the total wafer thickness. For this reason, the size of each bath in the wafer arrangement direction becomes large. In addition, since entrance/exit spaces of the wafer chuck 7 are required on the two sides of the wafers in each bath, the width also becomes large. Consequently, both the washing bath and the rinse bath become bulky.

In a so-called carrier-less system in which wafers are extracted from a cassette, transferred to a wafer boat, and washed, the wafers are gripped by and released from a wafer chuck in each wafer transfer operation. Owing to this operation, the wafers may be contaminated with particles due to the contact between the wafers and the chuck. Further, a high-precision wafer chuck must be manufactured, resulting in an increase in cost.

Note that a method of washing wafers while being stored in a cassette is attempted. Also in this case, however, to assure a wafer cassette introduction space, each bath is increased in size. In general, in a washing apparatus of this type, wafers are washed with a plurality of types of chemicals. Pairs of chemical baths and rinse baths are arranged in series with each other, as described above. Therefore, the whole apparatus becomes bulky, resulting in an increase in cost.

It is an object of the present invention to provide a washing apparatus which can be downsized.

In the conventional washing apparatus, after wafers are processed with chemicals such as ammonia, hydrofluoric acid, and hydrochloric acid in a washing bath, the wafers are rinsed with, e.g., pure water in a rinse bath. As for the arrangement of this apparatus, pairs of chemical baths and rinse baths are arranged in series with each other for respective chemicals, and a convey system for sequentially conveying, e.g., about 50 wafers at once is provided.

FIG. 25 is a view showing the main part of a conventional washing apparatus. In this apparatus, 50 wafers transferred from a wafer cassette (not shown) to a jig are gripped from their two sides by the wafer chuck 7 at once. First, the wafers are transferred to the wafer boat 14A in the chemical bath 1A and dipped in a chemical. While circulating the chemical, the wafers are washed. Then, the wafers W on the wafer boat 14A are gripped by the wafer chuck 7 and transferred to the wafer boat 14B in the rinse bath 1B to be dipped. Pure water is supplied from the bottom portion of the rinse bath 1B to rinse the wafers W.

In general, 25 wafers W are stored in a wafer cassette C as a resin vessel when the wafers W are to be loaded into the washing apparatus. If 50 wafers W are to be processed at once, wafers corresponding to two cassettes are gripped by the wafer chuck 7. To increase versatility, the wafer cassette holds the wafers W at a predetermined pitch interval, e.g., at a pitch interval of 6.35 mm for 8" wafers, or at a pitch interval of 4.76 mm for 6' wafers. The length of the wafer array gripped by the wafer chuck 7 is a dimension obtained by adding the total pitch length to the total wafer thickness.

On the other hand, to increase the throughput, the number of wafers to be dipped in a processing bath at once must be increased. Consequently, the length of each of the chemical baths 1A and 1B is increased, and the processing bath is increased in size with an increase in wafer diameter, resulting in an increase in cost. In addition, the consumption of a washing solution and a rinse solution is increased.

It is an object of the present invention to provide a compact substrate washing apparatus and substrate washing method which can cope with an increase in wafer diameter.

The washing apparatus shown in FIG. 8 has an advantage in that, when a chemical is substituted with a rinse solution, the resistivity recovery time (substitution time with pure water) is short due to the straightening effect of the straightening plate 13 with respect to solution flows in the processing bath, and the rinse efficiency is high. However, washing processing is nonuniform. That is, as shown in FIG. 55, a chemical is gradually substituted with a rinse solution from the lower portion of a processing bath 4. When an oxide film on a wafer is to be etched by using, e.g., a hydrofluoric acid solution as a washing solution, the etching amount is larger at the upper portion of the wafer because the chemical concentration is high at the upper portion. For this reason, the etching amount varies in the vertical direction, causing a decrease in yield. Note that the etching amount can be suppressed to a great degree with a decrease in chemical concentration. However, this prolongs the etching time to decrease the throughput.

It is an object of the present invention to provide a substrate washing apparatus and method capable of highly uniformly performing washing processing when washing processing and rinse processing are performed in the same processing bath.

FIG. 61 is a view showing the main part of a conventional washing apparatus. In the conventional washing apparatus, a transfer operation of 25 wafers by a wafer chuck (not shown) is performed twice in advance to transfer a total of 50 wafers W to a wafer holder 11. The wafer holder 11 is dipped in a chemical by a holder convey means. While circulating the chemical, the wafers W are washed, e.g., etched. Then, the wafers W on the holder 11 are gripped by the holder convey means, transferred to a rinse bath (not shown), and rinsed.

As shown in FIGS. 61 and 62, the conventional holder 11 comprises a holding rod 12 for holding the lower end of each wafer W, and holding rods 13 and 14 for holding the left and right ends of the wafer W, i.e., the two ends on a horizontal line passing through the center of the wafer W. Pluralities of holding grooves 12a, 13a, and 14a in which the peripheral portion of the wafer W is fitted are formed in the holding rods 12 to 14 in the longitudinal direction at intervals, respectively. Each wafer is entered downward or extracted upward, as indicated by an arrow.

FIG. 63 shows another example of a conventional holder. A holder 11 comprises a holding rod 12A for holding the lower end of each wafer W, and holding rods 13A and 14A for holding obliquely left and right portions of the wafer W, respectively. Holding grooves 15a, 16a, and 17a in which the peripheral portion of the wafer W is fitted are formed in the holding rods 12A to 14A, respectively.

However, to enter/extract the wafer w by a wafer chuck or through a means for pushing the wafer W upward, the holder shown in FIG. 62 requires clearance α of about 0.5 to 1 mm with respect to the wafer W in the left and right holding grooves 13a and 14a. In conveying the wafer W, the wafer W rolls in accordance with the size of the clearance and contacts the holding grooves 13a and 14a to be contaminated with particles.

In the holder shown in FIG. 63, since the left and right holding grooves 16a and 17a are positioned lower than the left and right ends of the wafer W, clearances for entering/extracting the wafer W are not required between the holding grooves 16a and 17a and the wafer W. Only a small clearance β is set between the holding groove 15A at the lower end and the wafer W, so the wafer W hardly rolls.

The inclination amount (longitudinal inclination amount) of the wafer W held by a holder is determined by the shapes of the holding grooves, and a wafer holding length h of the holder (the length of a point where the wafer W contacts a holding groove at the lower end, and the vertical lengths of points where the wafer W contacts left and right holding grooves). As the groove width is narrower, or the support length h2 is larger, the inclination amount becomes smaller. A support length h2 of the holder shown in FIG. 63 is not so large, so that the inclination amount of the wafer W becomes large. When the wafer W is gripped by the wafer chuck, the peripheral portion of the wafer W may be taken off from gripping grooves of the wafer chuck or holding grooves of the push-up means to fail to receive the wafer W.

To downsize a chemical bath and a rinse bath, it has been examined to narrow the arrangement pitch of the wafers W. In this case, if the support length h is small, a bridge phenomenon in which the wafers W come into contact with each other due to the surface tension of a solution easily occurs. Also in the holder shown in FIG. 62, this bridge phenomenon is difficult to certainly prevent at a small arrangement pitch because a support length h1 is as small as about the radius of the wafer W. Prevention of the bridge phenomenon is a future subject.

It is an object of the present invention to provide a compact substrate holder and substrate washing apparatus capable of suppressing particle contamination.

3. Summary of the Invention

According to the present invention, there is provided a substrate washing apparatus for washing a plurality of substrates at once, comprising a processing bath for storing a plurality of substrates to be washed, a washing solution supply source for supplying a washing solution into the processing bath, a first flow path for allowing the washing solution overflowing from the processing bath to return into the processing bath, a rinse solution supply source for supplying a rinse solution, a second flow path for passing the rinse solution therethrough, a common flow path communicating with the first and second flow paths and also with a bottom portion of the processing bath, a first valve arranged on the first flow path, a second valve arranged on the second flow path, a discharge flow path branched from the first flow path to discharge the washing solution, a third valve arranged on the discharge flow path, and a control section for controlling operations of the first, second, and third valves, wherein the first valve comprises a first valve body for opening/closing the first flow path, a third flow path arranged parallel to the first flow path and having a diameter smaller than a diameter of the first flow path, and a second valve body for opening/closing the third flow path, and the first valve body of the first valve is opened, the second valve body is closed, and the third valve is closed to allow the washing solution to flow into the processing bath, and on the other hand, the first valve body of the first valve is closed, the second valve body is opened, and the third valve is opened to allow the rinse solution to flow into the processing bath, and the washing solution remaining in the first and third flow paths is discharged together with the rinse solution through the discharge flow path.

In performing rinse processing upon completion of washing processing, a rinse flows through the third small-diameter flow path in the flow path switching valve and the discharge flow path. A washing solution remaining in a dead zone is discharged, thereby preventing the washing solution from being mixed into the processing bath. In addition, since the third small-diameter flow path is open to discharge the washing solution, the washing solution in the processing bath is prevented from flowing out through the third flow path.

Note that the rinse solution is discharged through the second flow path switching valve and the third discharge valve, and its flow rate is decreased by adjusting the valves. Therefore, the washing solution in the processing bath is prevented from flowing out, while the washing solution is prevented from being mixed into the processing bath.

Since the flow path diameter is set larger than the length of the dead zone, the washing solution remaining in the dead zone is easily substituted with the rinse solution in supplying the rinse solution into the processing bath. Accordingly, the washing solution is prevented from being mixed into the processing bath.

A substrate washing apparatus comprises a processing bath for storing a plurality of substrates to be washed, a washing solution supply source for supplying a washing solution into the processing bath, a first flow path for allowing the washing solution overflowing from the processing bath to return into the processing bath, a rinse solution supply source for supplying a rinse solution, a second flow path for passing the rinse solution therethrough, a common flow path communicating with the first and second flow paths and also with a bottom portion of the processing bath, a first valve arranged on the first flow path, a second valve arranged at a communication portion between the first and second flow paths and the common flow path, a discharge flow path branched from the first flow path to discharge the washing solution, a third valve arranged on the discharge flow path, and a control section for controlling operations of the first, second, and third valves, wherein the first valve comprises a first valve body for opening/closing the first flow path, a third flow path arranged parallel to the first flow path and having a diameter smaller than a diameter of the first flow path, and a second valve body for opening/closing the third flow path, and the second valve comprises connection pipes connected to pipes which form the first and second flow paths and the common flow path, and a third valve body for opening/closing the first flow path.

Further, a substrate washing apparatus comprises a processing bath for storing a plurality of substrates to be washed, a washing solution supply source for supplying a washing solution into the processing bath, a washing solution discharge portion for discharging the washing solution from the processing bath, a first rinse solution supply portion for rapidly supplying a rinse solution from above the processing bath after the washing solution in the processing bath is discharged from the washing solution discharge portion, and a second rinse solution supply portion for supplying a new rinse into the processing bath after the rinse solution is supplied from the first rinse solution supply portion into the processing bath.

A substrate washing method comprises the steps of (a) introducing a washing solution into a processing bath, (b) dipping a plurality of substrates into the washing solution in the processing bath to perform washing processing, (c) rapidly discharging the washing solution from the processing bath to temporarily keep the discharged washing solution outside the processing bath, (d) rapidly supplying a rinse solution into the processing bath to substitute the washing solution in the processing bath with the rinse solution, (e) rapidly discharging the rinse solution from the processing bath, and (f) filtering the temporarily kept washing solution to return the washing solution into the processing bath, wherein a time interval between time when part of the substrates is exposed from a surface of the washing solution in the step (c) and time when the rinse solution is supplied into the processing bath to dip all the substrates in the rinse solution in the step (d) is within 10 sec.

Still further, a substrate washing apparatus comprises a holder having a plurality of holding grooves for holding substrates at a pitch interval narrower than an arrangement pitch interval in a cassette, transfer means for extracting the substrates from the cassette to transfer the substrates to the holder, a processing bath for receiving the substrates, washing the substrates with a washing solution, and rinsing the substrates with a rinse solution, a washing solution supply portion for supplying the washing solution into the processing bath, a rinse solution supply portion for supplying the rinse solution into the processing bath, and holder convey means for conveying the holder holding the substrates to dip the substrates in the washing solution together with the holder, wherein, after the substrates are washed with the washing solution, the rinse solution is introduced from the rinse solution supply portion into the processing bath to substitute the washing solution with the rinse solution in the processing bath.

In this manner, since the arrangement pitch of the substrates in the processing bath is small, the processing bath can be downsized. In addition, since washing processing and rinse are performed in a common processing bath, particle contamination does not occur even with a small arrangement pitch, thereby realizing downsizing of the whole apparatus.

A substrate washing method comprises the steps of (a) transferring a plurality of substrates to a holder at a pitch interval narrower than an arrangement pitch interval in a cassette, (b) supplying a washing solution into a processing bath, (c) conveying the holder holding the substrates into the processing bath, (d) dipping the substrates into the washing solution in the processing bath together with the holder to wash the substrates, and (e) introducing a rinse solution into the processing bath to substitute the washing solution in the processing bath with the rinse solution after the substrates are washed with the washing solution.

A substrate washing method comprises (a) the step of preparing first and second gripping means for gripping substrates in a cassette at once, and an intermediate holding portion capable of holding substrates whose number is an integral multiple of a number of substrates that each gripping means can hold, (b) the first transfer step of transferring the substrates from the cassette to the intermediate holding portion by the first gripping means at an arrangement pitch interval in the cassette, (c) the moving step of relatively moving the first gripping means and the intermediate holding portion from relative positions in the first transfer step to positions shifted in an arrangement direction of the substrates by a pitch interval m/n (n is an integer of not less than 2, and m is an integer of not less than 1) times the arrangement pitch interval in the cassette, and (d) the second transfer step of transferring the substrate from the intermediate holding portion to a holder in the processing bath by the second gripping means at a pitch interval 1/n times the arrangement pitch interval of the substrates, wherein the intermediate holding portion holds the substrates at the pitch interval 1/n times the arrangement pitch interval in the cassette by repeating the first transfer step (b) and the moving step (c) so as to perform the first transfer step (b) n times, and the second gripping means extracts the substrates from the intermediate holding portion to transfer the substrates to a holding member in the processing bath at once.

A substrate washing method comprises (a) the step of preparing gripping means for gripping substrates in a cassette at once, and a holder for receiving the substrates from the gripping means to hold the substrates, (b) the transfer step of transferring the substrates from the cassette to the holder by the gripping means at an arrangement pitch interval in the cassette, and (c) the moving step of relatively moving the gripping means and the holder from relative positions in the transfer step to positions shifted in an arrangement direction of the substrates by a distance m/n (n is an integer of not less than 2, and m is an integer of not less than 1) times the arrangement pitch interval in the cassette, wherein the holder holds the substrates at a pitch interval 1/n times the arrangement pitch interval in the cassette by repeating the transfer step (b) and the moving step (c) so as to perform the transfer step (b) n times, and the holder holding the substrates is conveyed into the processing bath to dip the substrates in the washing solution together with the holder.

Moreover, a substrate washing apparatus comprises a holding portion for aligning a plurality of substrates at a substantially equal pitch interval to hold the substrates, a processing bath for washing the plurality of substrates held by the holding portion with a washing solution, and then rinsing the substrates with a rinse solution, a washing solution supply portion for supplying the washing solution into the processing bath, and a rinse solution blow-off portion which is arranged on a lower portion side of the substrates in the processing bath and in which a plurality of blow-off holes for blowing off the rinse solution into the processing bath are formed along arrangement of the substrates, wherein the rinse solution is introduced from the rinse solution blow-off portions into the processing bath to substitute the washing solution with the rinse solution after the substrates is washed with the washing solution.

A substrate washing method comprises the steps of (a) dipping a plurality of substrates into a washing solution in a processing bath while the substrates are aligned, (b) blowing off a rinse solution from a plurality of blow-off ports aligned on a lower portion side of the substrates in an arrangement direction of the substrates to decrease a concentration of the washing solution in the processing bath, and (c) supplying the rinse solution upward from a bottom portion of the processing bath through straightening means to substitute the washing solution in the processing bath with the rinse solution.

BRIEF DESCRIPTION OF THE DRAWINGS

FIG. 3 is a partially cutaway sectional block diagram showing the substrate washing apparatus according to the first embodiment of the present invention;

FIG. 4 is a longitudinal sectional view showing the internal structure of a valve attached to the apparatus of the first embodiment;

FIGS. 21A and 21B are schematic sectional views, respectively, for explaining a washing operation;

FIG. 24 is a sectional block diagram showing an apparatus of a modification of the third embodiment;

FIG. 29 is a sectional block diagram showing a substrate washing apparatus;

FIG. 33 is a schematic view for explaining a wafer transfer operation;

FIG. 34 is schematic view for explaining the aligned state of wafers on a boat;

FIG. 35 is a schematic view for explaining a wafer transfer operation;

FIG. 36 is a sectional view showing a washing processing bath in which wafers are dipped;

FIG. 37 is a schematic perspective view showing a substrate washing apparatus; FIG. 38 is an exploded perspective view showing a substrate washing apparatus according to the fifth embodiment of the present invention;

FIGS. 42A, 42B, and 42C are schematic views, respectively, for explaining the operation of the apparatus;

FIG. 43 is a view showing wafers aligned on a boat when viewed from the side;

FIG. 50 is a sectional block diagram showing the substrate washing apparatus according to the eighth embodiment;

FIG. 51 is a sectional view showing nozzles attached to a straightening plate;

FIGS. 52A, 52B, and 52C are sectional views, respectively, for explaining the movement of a washing solution and the movement of a rinse solution;

FIG. 53 is a view for explaining the solution spray range of a nozzle;

FIGS. 54A and 54B are schematic views showing various types of nozzles, respectively;

FIG. 56 is a cutaway exploded perspective view showing a substrate washing apparatus according to the ninth embodiment of the present invention;

FIG. 57 is a longitudinal view showing a wafer boat when viewed from the longitudinal direction;

FIGS. 58A, 58B, 58C, and 58D are longitudinal sectional views showing holding grooves of the wafer boats, respectively;

PREFERRED EMBODIMENTS OF THE INVENTION

Preferable embodiments of the present invention will be described below with reference to the accompanying drawings.

Figure 1:
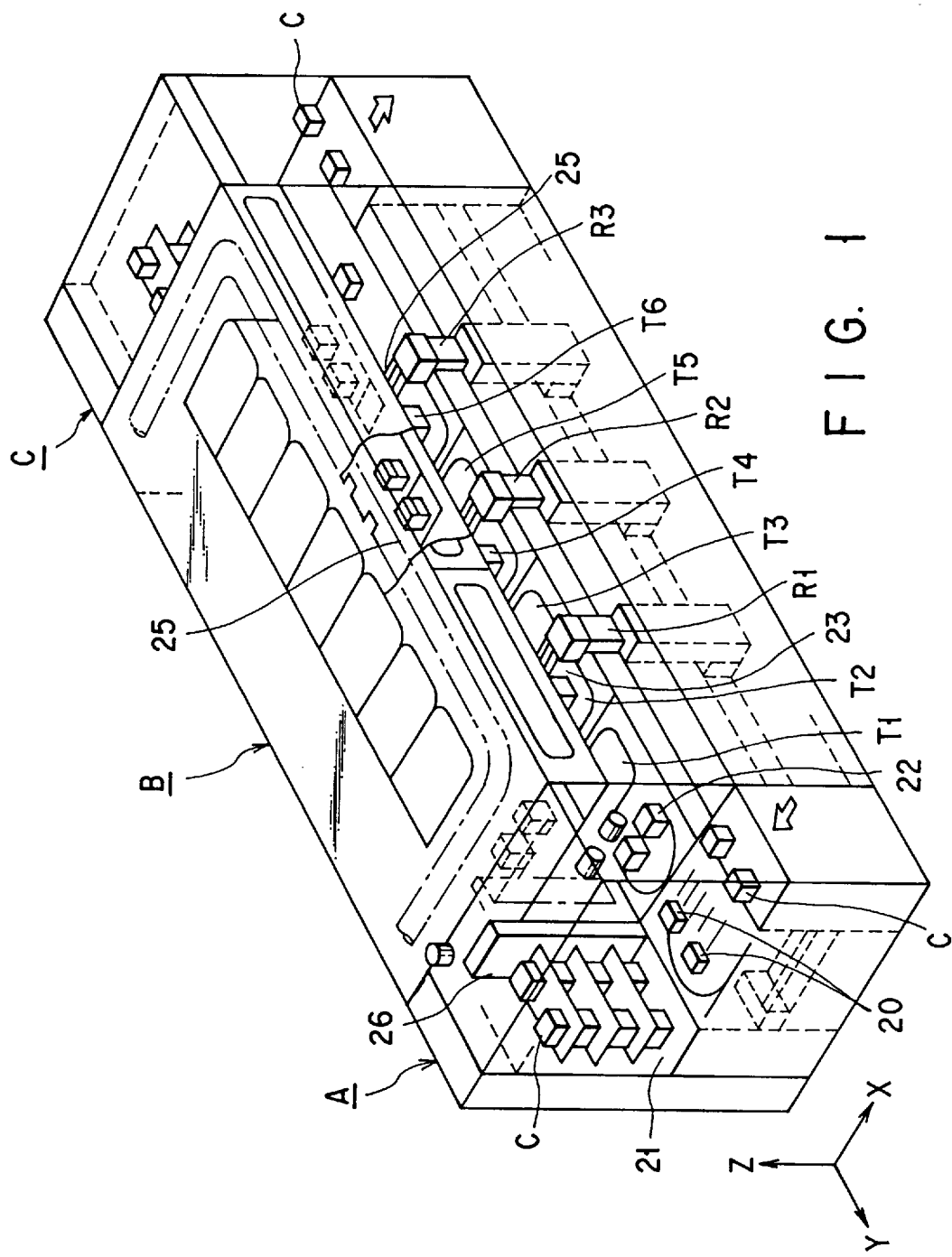
FIG. 1 is a schematic view showing a whole washing processing system.

Prior to a description of the main part of a substrate washing apparatus according to an embodiment of the present invention, a whole apparatus including a convey system will be described in short with reference to FIG. 1. The whole apparatus is constituted by three zones, i.e., a loading section A for storing target substrates, e.g., semiconductor wafers, before washing processing in units of cassettes, a washing section B for washing the wafers, and an unloading section C for extracting the washed wafers in units of cassettes.

In the loading section A, a cassette C storing, e.g., 25 wafers is temporarily loaded from the outside to a waiting portion 21 by a cassette convey means 20, and then conveyed to a loader portion 22. At this portion, wafers in the cassette C are transferred to an exclusive wafer holder by a wafer chuck (not shown). In the washing section B, e.g., three wafer convey mechanisms R1 to R3 are arranged along a line connecting the loading section A and the unloading section C. Each of the wafer convey mechanisms R1 to R3 comprises a holder convey means for conveying the wafer holder holding the wafers into the apparatus. A washing/drying bath T1 for washing/drying a holder convey means 23 of the wafer convey mechanism R1, three processing baths T2 to T4, a washing/drying bath T5 for washing/drying a holder convey means 24 of the wafer convey mechanism R3, and a wafer drying bath T6 for drying wafers with steam are sequentially arranged from the loading section A side.

Each of the processing baths T2 to T4 is constituted such that wafers are washed with a washing solution and rinsed with, e.g., pure water. For example, 50 wafers are held by an exclusive holder (to be described later) at once and sequentially washed in the processing baths T2 to T4 through the wafer convey mechanisms R1 to R3. A washing/drying line 25 for washing/drying the hollow cassette C from which the wafer chuck extracts wafers is arranged at an upper portion in the washing section B. The cassette C is supplied to this washing/drying line at the loader portion 22 by an elevating mechanism 26.

Figure 2:
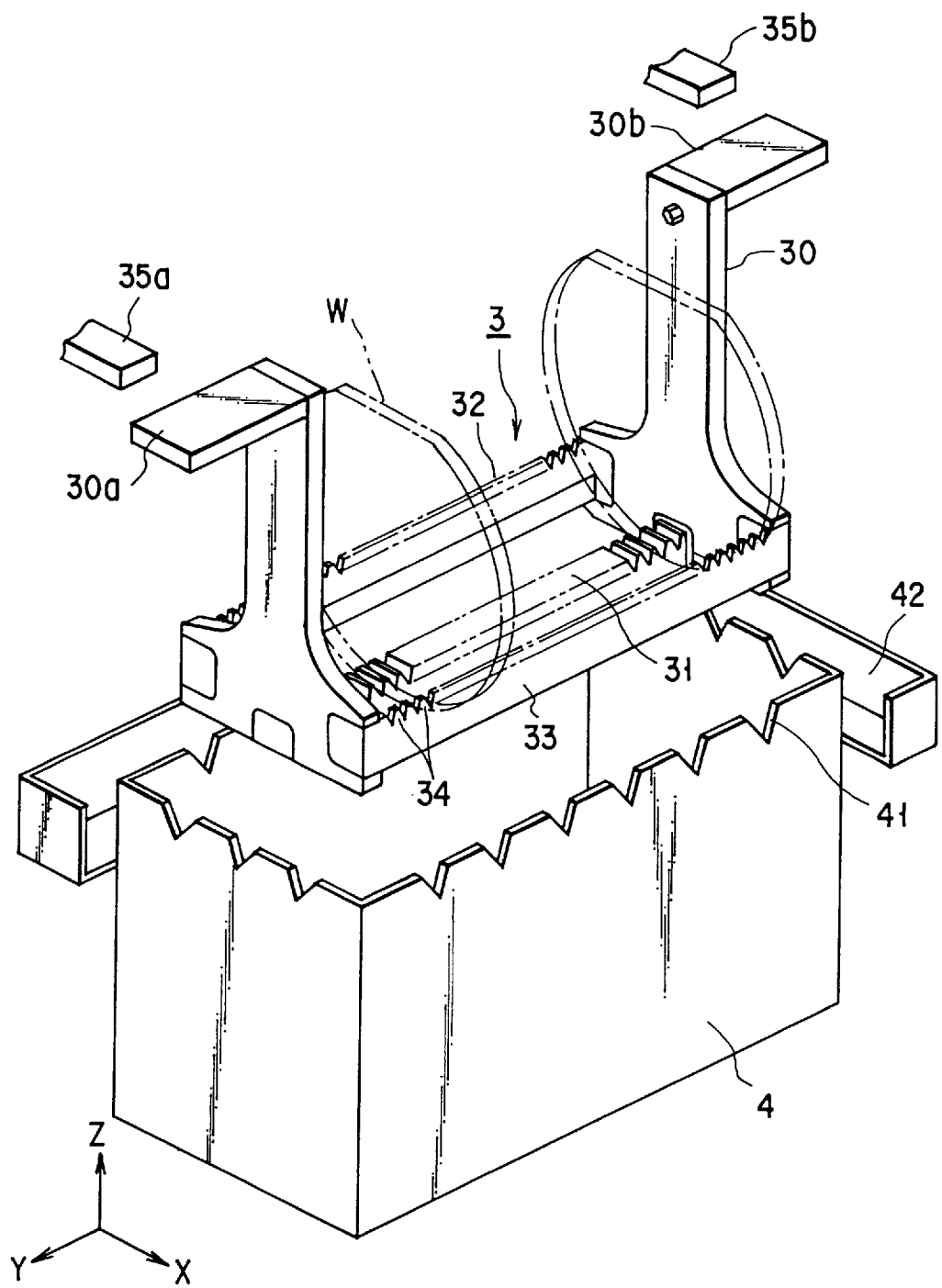
FIG. 2 is a schematic perspective view showing a substrate washing apparatus.

FIG. 2 shows the schematic outer appearance of the above-mentioned exclusive wafer holder and processing bath unit. A wafer holder 3 is constituted such that a holding rod 31 for holding the lower ends of wafers W, and holding rods 32 and 33 for holding the two sides of the lower portions of each wafer W are arranged on a holder main body 30. For example, 50 holding grooves 34 for holding the corresponding wafers W are formed in these holding rods 31 to 33 at a predetermined pitch. The holder convey means is constituted by a pair of arms 61a and 61b for supporting the lower surfaces of corresponding supported portions 30a and 30b which are respectively bent forward and backward at the upper portions of the wafer holder 3.

The three processing baths T2 to T4 have the same structure. An example of the arrangement of each processing bath 3 (T2 to T4) and related units will be described with reference to FIGS. 2 and 3. The processing bath 4 has, e.g., a rectangular shape. Triangular notched portions 41 are formed in the upper edge portion of the processing bath 4. A reception bath 42 for receiving an overflowing solution is arranged outside the upper edge portion of the processing bath 4.

A washing solution flow path 5 is arranged between the bottom portion of the reception bath 42 and the bottom portion of the processing bath 4 so as to supply a washing solution in the reception bath 42 to the bottom portion of the processing bath 4, i.e., so as to circulate a washing solution overflowing from the processing bath 4 to the bottom portion of the processing bath 4 through the outside of the processing bath 4. A rinse solution supply path 6 communicates with the intermediate portion of the washing solution flow path 5 near the bottom portion of the processing bath 4 at a connection portion 60. A flow path 17 between the connection portion 60 and the bottom portion of the processing bath 4 is commonly used by the washing solution flow path 5 and the rinse solution supply path 6. Flow path switching valves V1 and V2 for switching the flow paths are interposed in the washing solution flow path 5 and the rinse solution supply path 6 near the connection portion 60, respectively.

A first discharge path 51 in which a discharge valve V3 is interposed is branched on the upstream side of the valve V1 in the washing solution flow path 5. A valve V4, a filter F, and a pump P are interposed in the washing solution flow path 5 from the branch point toward the more upstream side. A second discharge path 52 in which a valve V5 is interposed is branched on the upstream side of the pump P in the washing solution flow path 5.

As shown in FIG. 4, the flow path switching valve V1 comprises a flow path obtained by aligning a first flow path 71 having an inner diameter D1 of ¾ inches, and a second flow path 72 having an inner diameter D2 of ⅛ inch parallel to each other, and valve bodies 73 and 74 for opening/closing the corresponding flow paths 71 and 72. Note that the first flow path 71 may have any flow path shape as far as it can pass a washing solution therethrough at a flow rate of 10 l/min or more. In addition, the second flow path 72 may have any flow path shape as far as it can pass a washing solution and a rinse solution therethrough at a flow rate of 2 l/min or less. The apparatus of this embodiment has a control section 61 for controlling the above-mentioned valves V1 to V5 in accordance with a predetermined sequence. Note that each of the above-mentioned flow paths is formed of a tube made from PFA (Perfluoroalkoxy Fluoropolymer).

In the processing bath 4, a diffusion plate 43 is arranged near the outlet of the washing solution flow path 5, and a straightening plate 44 is arranged immediately above the diffusion plate 43. A washing solution supply portion 45 is disposed above the processing bath 4 at a position not to interfere with convey operation of the holder 3.

Next, the operation of the above-mentioned embodiment will be described.

Figure 5A:
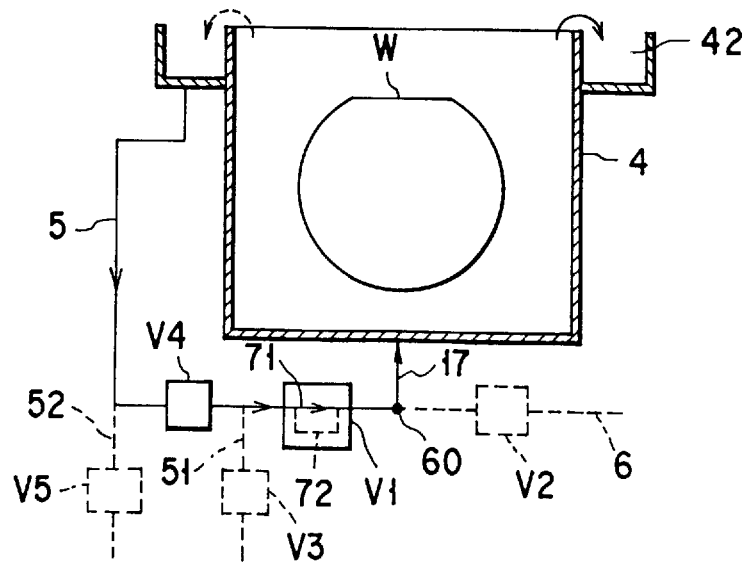
FIGS. 5A and 5B are sectional block diagrams, respectively, for explaining the operation of the substrate washing apparatus.

First of all, a 0.5%-hydrofluoric acid solution as a washing solution is supplied from the washing solution supply portion 45 into the processing bath 4. As shown in FIG. 5A, the first flow path 71 of the valve V1, and the valve V4 are opened. The washing solution is circulated by the pump P. At this time, the second flow path 72 of the valve V1, and the valves V2, V3, and V5 are kept closed.

The wafer holder 3 on which, e.g., 50 wafers W are arranged parallel to each other is loaded to the processing bath 4 by arms 35a and 35b of the holder convey means. The wafers W are dipped in the washing solution for a predetermined time to wash the wafers W. Note that the wafer holder 3 is supported by a support portion (not shown) in the processing bath 4.

Figure 5B:
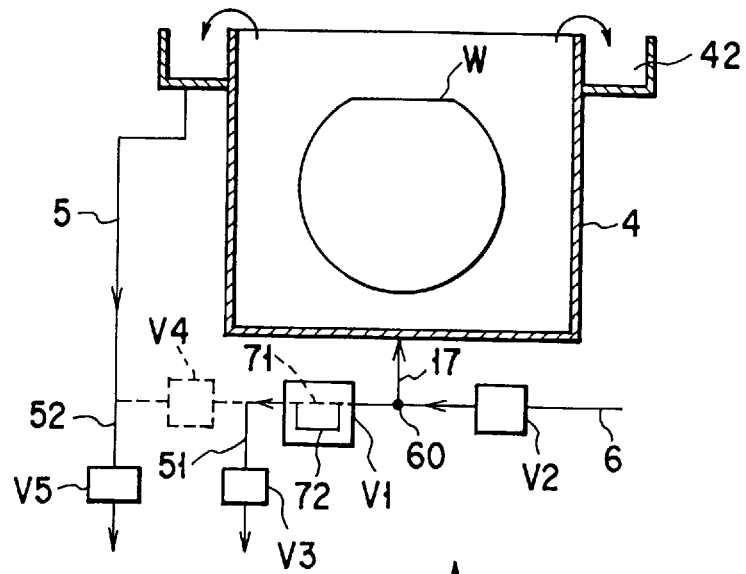

Then, the pump P is stopped. At the same time, as shown in FIG. 5B, the first flow path 71 of the valve V1, and the valve V4 are closed, and the second flow path 72 of the valve V1, and the valves V2, V3, and V5 are opened. A rinse solution is supplied from a rinse solution supply source 49 to the rinse solution supply path 6. As the rinse solution, pure water having a resistivity of 18 MΩ·cm or more is used.

The rinse solution is supplied from the connection portion 60 into the processing bath 4 through the bottom portion of the processing bath 4, while the rinse solution flows into the washing solution flow path 5 and is discharged from the first discharge path 51 through the second flow path 72 of the valve V1.

After the valve V2 is opened, the washing solution remaining in the second flow path 72 is sufficiently rinsed to an extent not to influence the resistivity in the processing bath 4, i.e., the washing solution remaining at the connection portion 60 and at the connection portion of the second flow path 72 is sufficiently substituted with the rinse solution. After 30 seconds, the second flow path 72 of the valve 1 is closed, and all the rinse solution flowing through the rinse solution supply path 6 is supplied into the processing bath 4.

The rinse solution is diffused in the processing bath 4 through the diffusion plate 43 and straightened through the straightening plate 44, and goes up. The washing solution in the processing bath 4 is substituted with the pure water to perform rinse processing. After the resistivity of the solution in the processing bath 4 becomes equal to the resistivity of the pure water, the supply of the rinse solution is stopped to complete the rinse processing. Note that the solution overflowing from the processing bath 4 is discharged through the second discharge path 52, and the solution in the processing bath 4 is discharged through, e.g., the first flow path 71 of the valve 1 and the first discharge path 51 after the wafer holder 3 is unloaded. Such a series of valve opening/closing operations are executed on the basis of control signals from the control section 61.

According to the above-mentioned embodiment, after the first flow path 71 of the valve V1 is closed to stop the circulation of the washing solution, the second flow path 72 of the valve V1 is opened to allow the rinse solution to reversely flow through the washing solution flow path, and the rinse solution is discharged. The washing solution in the washing solution flow path 5 between the connection portion 60 and the valve V1 is substituted with the rinse solution, so that it can be avoided that the washing solution is mixed in the rinse solution and enters into the processing bath 4. Accordingly, a time required for substituting the solution in the processing bath 4 with the rinse solution can be shortened to shorten the rinse processing time, thereby decreasing the consumption of the rinse solution. When the rinse solution reversely flows through the washing solution flow path 5, it passes through the second small-diameter flow path 72 of the valve 1, so the supply of the rinse solution from the rinse solution supply path 6 into the processing bath 4 can substantially hardly be affected.

When the rinse solution reversely flows through the washing solution flow path 5, at least one portion between the connection portion 60 and the discharge port of the discharge path 51 must be small in diameter so as not to increase the flow rate of the reversely flowing rinse solution. For this purpose, instead of using the above-mentioned master-slave valves as the valve V1, it can be possible to set the flow rate of at least one of the valves V1 and V3 to be adjustable. Alternatively, another flow-rate-adjustable valve may be arranged. The flow rate can be decreased by throttling the valve upon reception of a control signal from the control section 61 during the reverse flow of the rinse solution (reverse flow through the washing solution flow path 5). Still further, a valve having a slight flow path even in a closed state so as not to completely close a flow path may be used as the valve V1. In rinse processing, the valve v3 is opened, and the valve V1 is closed to allow the rinse solution to reversely flow through this slight flow path.

To discharge the rinse solution through the washing solution flow path 5 at a low flow rate during rinse processing, the reverse flow rate of the rinse solution is preferably within a range of 0.4 to 0.5 l/min when the tube diameter of the PFA (tetrafluoroethylene-perfluoroalkylvinyl ether copolymer) tube is ¾ inches, the flow rate of the rinse solution in the rinse solution supply path 6 is 15 l/min, and the capacity of the processing bath 4 is 12 to 20l. This is because, if the flow rate is as small as about 0.2 to 0.3 l/min, the washing solution remaining between the valve V1 and the connection portion 60 is mixed in the flow of the rinse solution toward the processing bath 4, delaying the rise of the resistivity of the solution. On the other hand, if the reverse flow rate of the rinse solution exceeds 0.5 l/min, almost the rinse solution from the rinse solution supply path 6 is discharged through the discharge path 51, degrading the rise of the resistivity.

Figure 6:
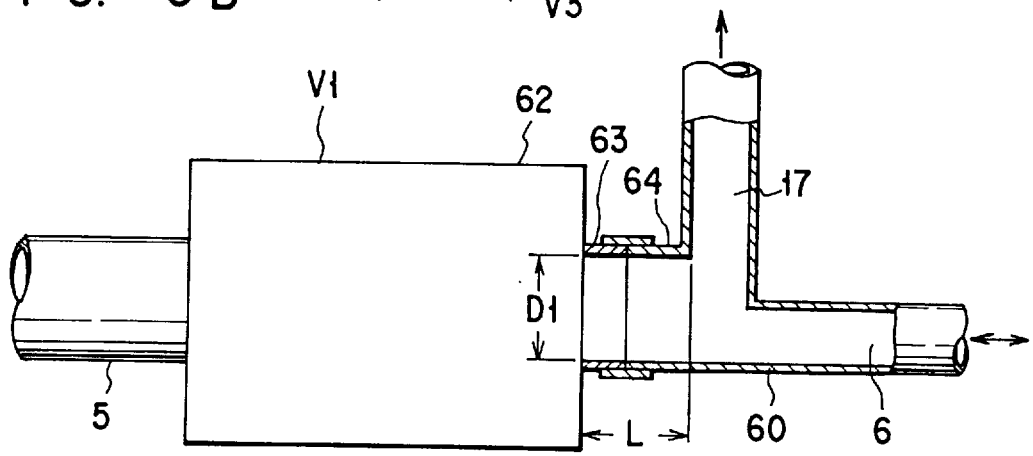
FIG. 6 is a partially enlarged sectional view showing a pipe common to a washing solution and a rinse solution.

Further, as shown in FIG. 6, a valve having a normal opening/closing function may be used as the valve V1. When a total (dead zone length) of the length of a connection pipe 63 projecting from a valve main body 62 of the valve V1 and the length of a pipe 64 on the connection portion 60 side, i.e., the length from the downstream end of the valve main body 62 to the connection portion 60 is defined as L, and its tube diameter is defined as D, D may be set larger than L.

The present inventors measured the resistivity recovery of a solution when the length L and the diameter D were respectively set to ½ inch and ¾ inches, and when the length L and the diameter D were respectively set to ¾ inches and ¾ inches. The recovery time was greatly shortened in the latter case compared to the former case. Therefore, it can be understood that, when the circulation of the washing solution is stopped, and the rinse solution is supplied to the rinse solution supply path 6, the washing solution remaining in the dead zone is rapidly substituted with the rinse solution with the tube diameter D larger than the dead zone length L.

Figure 7:
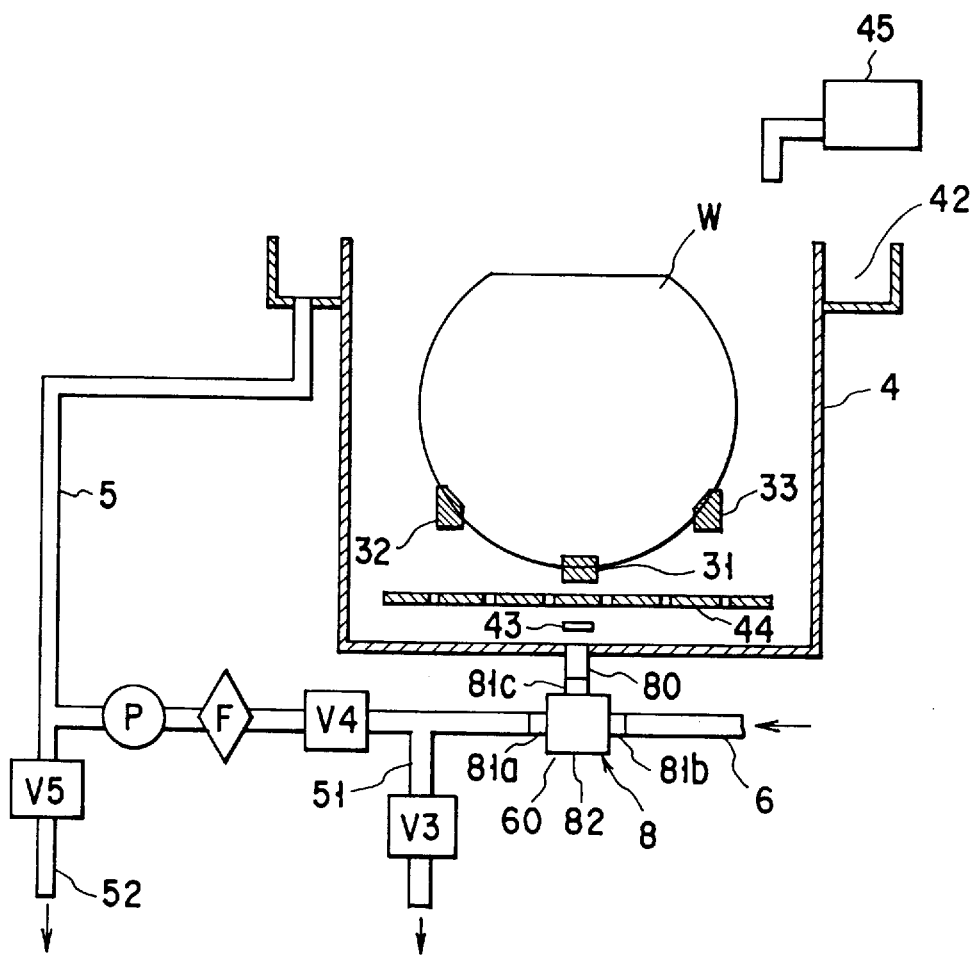
FIG. 7 is a sectional block diagram showing an apparatus of a modification of the first embodiment.
Figure 8:
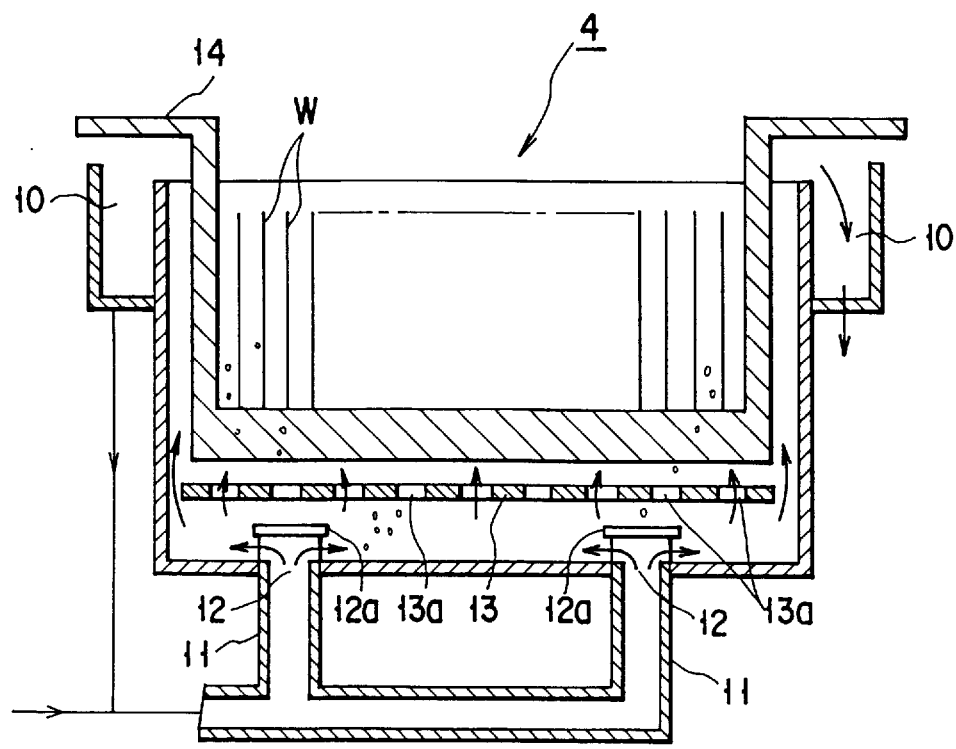
FIG. 8 is a longitudinal sectional view showing a conventional apparatus.
Figure 9:
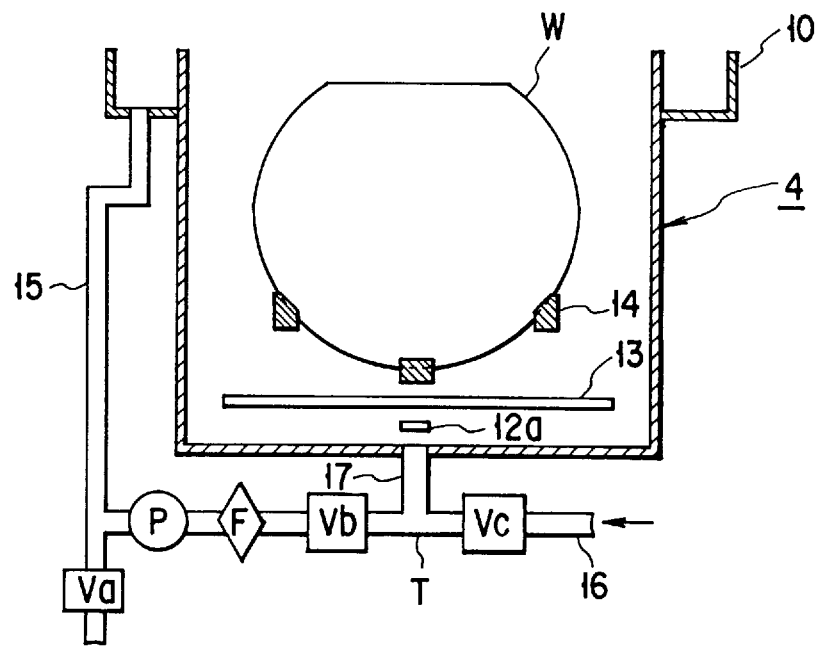
FIG. 9 is a sectional block diagram showing a conventional apparatus.

As shown in FIG. 7, a valve 8 having connection pipes 81a to 81c which are respectively connected to the washing solution flow path 5, the rinse solution supply path 6, and a common flow path 80 may be arranged at the connection portion 60 between the washing solution flow path 5 and the rinse solution supply path 6. In addition, a flow path switching valve body for connecting one of the washing solution flow path 5 and the rinse solution supply path 6 to the common flow path may be arranged in a valve main body 82 of the valve 8. Alternatively, this valve 8 may have only a valve body for opening/closing the washing solution flow path 5, and an exclusive valve for opening/closing the rinse solution supply path 6 may be separately arranged in the rinse solution supply path 6. If the so-called integrated valve 8 is arranged at the connection portion 60, almost no dead zone exists to rise the resistivity fast. Note that, in the embodiment shown in FIG. 7, to discharge a solution in the processing bath 4, the second discharge path may be arranged as in the above embodiment, or another discharge path may be connected to the processing bath 4.

As described above, the present invention can be applied to an apparatus in which a washing solution is supplied from a washing solution supply source into a processing bath through a washing solution flow path, and the washing solution is not circulated. In addition, the present invention can be applied to not only a case in which an oxide film is etched with a hydrofluoric acid solution, but also a case in which a nitride film is etched with a phosphoric acid solution, and a case in which aluminum is etched with a solution mixture of phosphoric acid, acetic acid, and nitric acid. In another washing processing, particles may be removed with an APM solution (ammonia+hydrogen peroxide solution+pure water), metal contamination may be washed with an HPM solution (hydrochloric acid+hydrogen peroxide solution+pure water), or organic matters in a resist film may be removed with an SPM solution (sulphuric acid+hydrogen peroxide solution). Note that a target substrate may include a liquid crystal substrate and a printed board.

As described above, according to the present invention, when a rinse solution is supplied into a processing bath through a rinse solution supply path upon processing with a washing solution, the washing solution in a washing solution flow path can be prevented from being gradually mixed in the processing bath. As a result, the substitution time with the rinse solution can be shortened to perform rinse processing within a short time. At the same time, the consumption of the rinse solution can be reduced.

The second embodiment of the present invention will be described below with reference to FIGS. 10 to 14.

Figure 10:
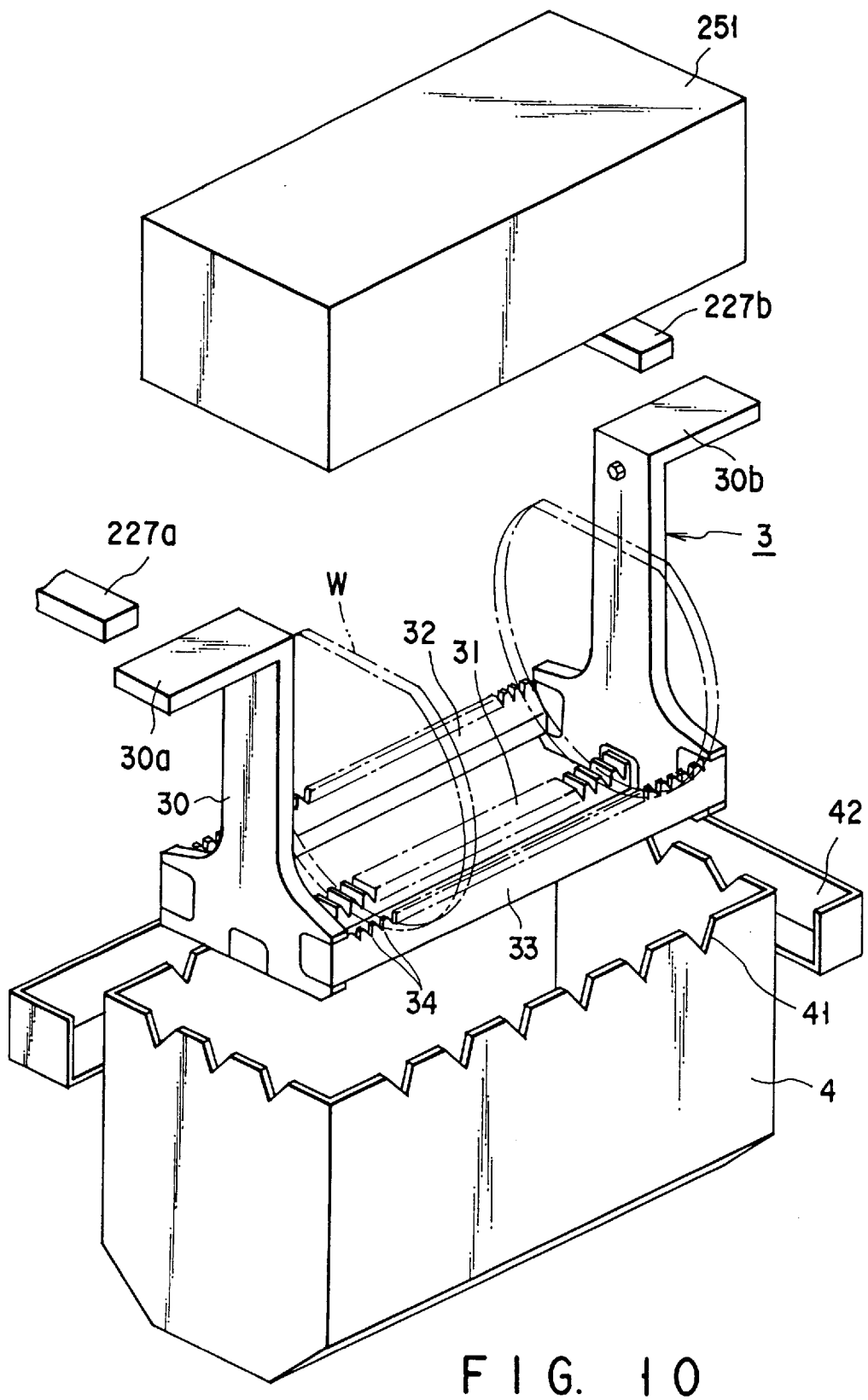
FIG. 10 is a schematic perspective view showing a substrate washing apparatus.

As shown in FIG. 10, a wafer holder 3 comprises a first holding rod 31, a second holding rod 32, and a third holding rod 33 which are interposed between a pair of end plates 30a and 30b. For example, 50 holding grooves 34 for holding the peripheral portion of a wafer W are formed parallel to each other in each of the holding rods 31 to 33. Supported portions 35a and 35b respectively bent forward and backward are formed at the upper end portions of the corresponding end plates 30a and 30b.

As shown in FIG. 10, a holder convey means comprises a pair of arms 227a and 227b. The arms 227a and 227b support the lower surfaces of the corresponding supported portions 35a and 35b of the wafer holder 3 to convey the wafer holder 3 into above-mentioned units T2 to T4. Note that the three processing baths T2 to T4 have substantially the same structure.

Figure 11:
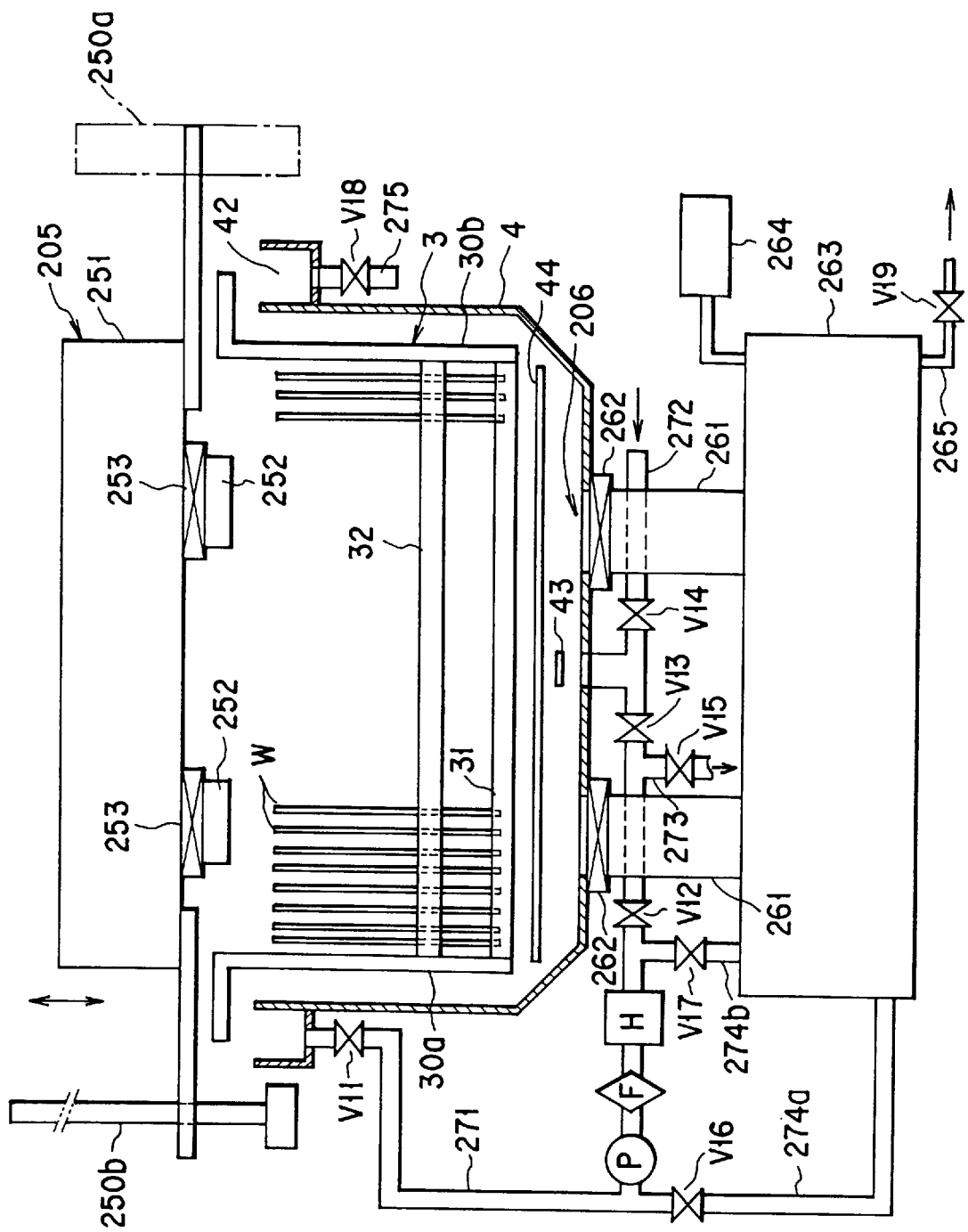
FIG. 11 is a partially cutaway sectional block diagram showing a substrate washing apparatus according to the second embodiment of the present invention.
Figure 12:
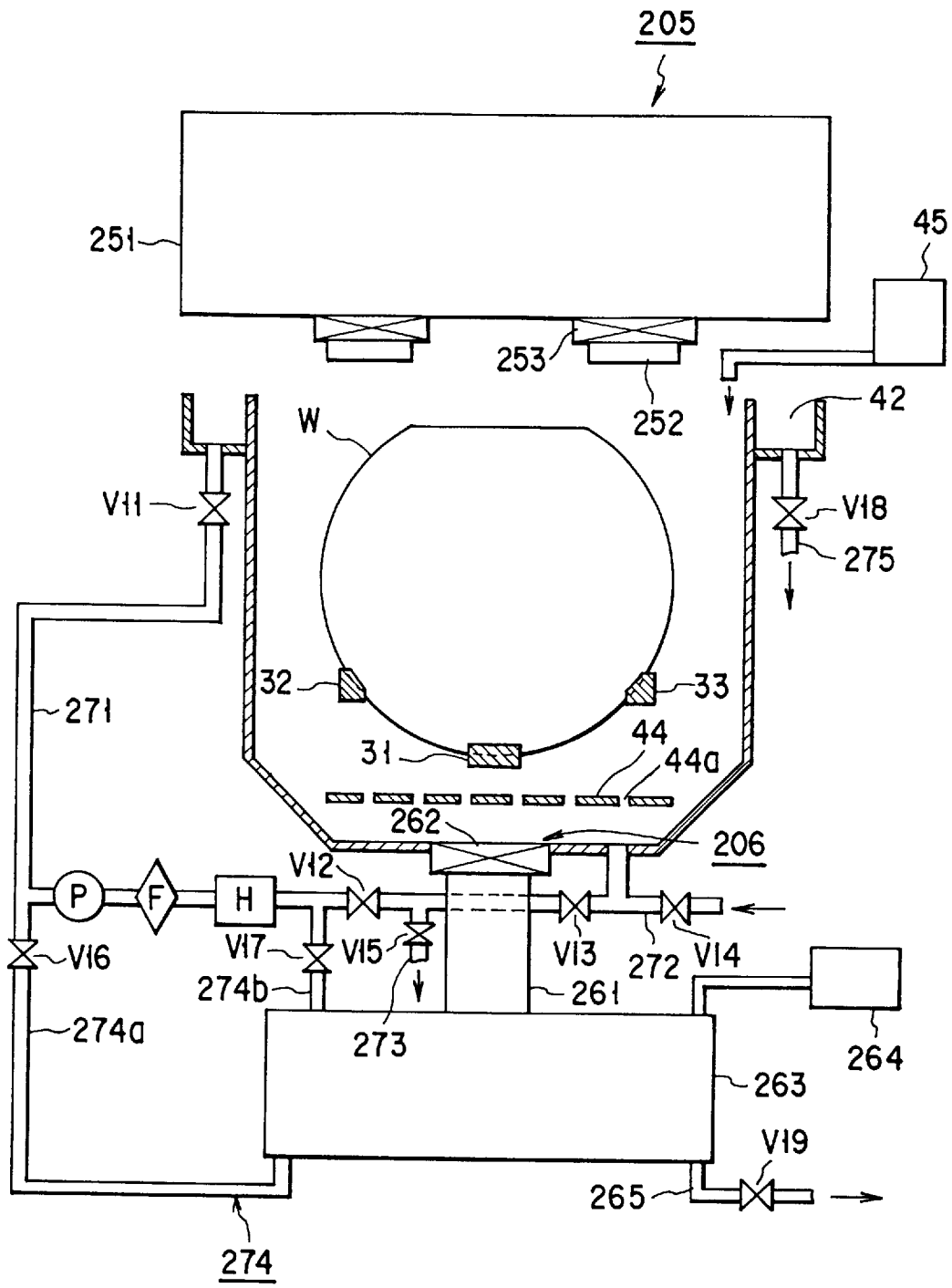
FIG. 12 is a partially cutaway sectional block diagram showing the substrate washing apparatus according to the second embodiment of the present invention.

Next, each processing bath 4 (T2 to T4) will be described with reference to FIGS. 10 to 12.

The processing bath 4 has a rectangular shape in which the peripheral edge of a bottom portion is inclined. In addition, triangular notched portions 41 for overflow are formed at the upper edge portion of the processing bath 4, and a reception bath 42 for receiving an overflowing solution is arranged outside the upper edge portion of the processing bath 4. A first rinse solution supply portion 205 for rapidly supplying pure water as a rinse solution into the processing bath 4 is arranged above the processing bath 4. The first rinse solution supply portion 205 can be elevated between an upper position not to interfere with the convey operation of the wafer holder 3 and a position immediately above the processing bath 4. Note that reference numeral 250b denotes a guide rod.

The first rinse solution supply portion 205 comprises a rinse solution vessel 251 for storing a rinse solution, a supply pipe 252 constituted by arranging 2×2, i.e., a total of 4 rinse solution supply paths on the bottom surface of the rinse solution vessel 251, and a valve 253 for opening/closing the supply pipe 252. The rinse solution vessel 251 is filled with the rinse solution supplied from a rinse solution supply source (not shown). As shown in FIG. 12, a washing solution supply portion 45 is arranged above the processing bath 4 at a position not to interfere with the holder convey means.

On the other hand, a washing solution discharge portion 206 for rapidly discharging a washing solution in the processing bath 4 is arranged in the bottom portion of the processing bath 4. The washing solution discharge portion 206 comprises discharge pipes 261 connected to two portions in the longitudinal direction on the bottom portion of the processing bath 4, and valves 262 arranged near the opening portions of the upper ends of the corresponding discharge pipes 261. A washing solution recovery vessel 263 is connected to the downstream side of the discharge pipes 261.

The washing solution discharge portion 206 is used to rapidly discharge the washing solution from the processing bath 4, while the first rinse solution supply portion 205 is used to rapidly supply the rinse solution into the processing bath 4. For this purpose, the numbers and inner diameters of each supply pipe 252 and each discharge pipe 261 are set in accordance with the size and processing number of wafers W so as to set, e.g., the exposure time of the wafer W within 10 sec.

A first washing solution circulating path 271 serving as a circulating/filtering portion in which a valve V11, a pump P, a filter F, a temperature controller H, and valves V12 and V13 are sequentially interposed from the reception bath 42 side is arranged between the bottom portion of the processing bath 4 and the reception bath 42. A rinse solution supply path 272 is branched between the valve V13 of the washing solution circulating path 271 and the bottom portion of the processing bath 4. The rinse solution supply path 272 communicates with a rinse solution supply source (not shown) through a valve V14 to form the second rinse solution supply portion. Therefore, part of the washing solution circulating path 271 also serves as the rinse solution supply path 272.

A drain pipe 273 is branched from the washing solution circulating path 271 between the valves V12 and V13. The drain pipe 273 is used to discharge the rinse solution from the processing bath 4 upon completion of rinse processing. A valve V15 is arranged in the drain pipe 273.

A branch path 274a is branched from the washing solution circulating path 271 on the reception bath 42 side with respect to the pump P. A branch path 274b is branched from the washing solution circulating path 271 between the temperature controller H and the valve V12. A valve V1G is arranged on the branch path 274a, while a valve V17 is arranged on the branch path 274b.

These branch paths 274a and 274b are, respectively, connected to the bottom portion and upper portion of the recovery vessel 263. A second washing solution circulating path 274 for circulating the washing solution in the recovery vessel 263 is formed by the branch paths 274a and 274b and part of the washing solution circulating path 271. Note that a drain pipe 265 having a valve V19 is attached to the bottom portion of the recovery vessel 263.

A drain pipe 275 for discharging the rinse solution overflowing from the processing bath 4 is arranged on the bottom portion of the reception bath 42. The drain pipe 275 comprises a valve V18. Note that each of the rinse solution supply path 272 and the washing solution circulating paths 271 and 274 is formed of a PFA (tetrafluoroethylene-perfluoroalkylvinyl ether copolymer) tube having an outer diameter of ¾ inches. A washing solution replenishing portion 264 communicates with the recovery vessel 263 to replenish a washing solution so as to adjust the concentration of a recovered washing solution to a predetermined value.

A straightening plate 44 is arranged between the bottom portion of the processing bath 4 and the wafer holder 3. Slits 44a each extending parallel to each other in the longitudinal direction are formed in the straightening plate 44. A diffusion plate 43 (see FIG. 11) having a diameter almost equal to that of the supply port of the rinse solution supply path 272 is arranged at a position opposite to the supply port. Note that the washing solution circulating path 271 shown in FIG. 12 is actually connected to the central portion of the bottom portion of the processing bath 4 in the right-and-left direction.

The operation of the above apparatus will be described below.

First of all, at a loader portion 22, 25 wafers W are extracted from each of two cassettes C by a wafer chuck, and the total of 50 wafers W are transferred to the wafer holder 3. On the other hand, a hydrofluoric acid solution is supplied from the washing solution supply portion 45 into the processing bath 4. The valves V11, V12, and V13 are opened, and the remaining valves are closed. The washing solution is circulated by the pump P. At this time, the washing solution is adjusted to a predetermined temperature by the temperature controller H. The wafer holder 3 is conveyed into the processing bath 4 by the arms 227a and 227b of the holder convey means. As shown in FIGS. 11 and 12, e.g., the 50 wafers W are dipped in the washing solution to dissolve and remove oxide films on the surfaces of the wafers W with the hydrofluoric acid solution. Note that the first rinse solution supply portion 205 is positioned above in the convey operation of the wafer holder 3 and then moved down.

Then, the valves 262 of the washing solution discharge portion 206 are opened to rapidly discharge the washing solution in the processing bath 4 through the discharge pipes 261. The discharged washing solution is recovered in the recovery vessel 263. The valves V11, V12, and V13, and the valves 262 are closed, and the valves 253 of the first rinse solution supply portion 205 are opened to naturally drop a rinse solution from the rinse solution vessel 251 into the processing bath 4 through the supply pipes 252. With this operation, the rinse solution is rapidly supplied into the processing bath 4, and the processing bath 4 is sufficiently filled with the rinse solution within a short period of time. At this time, a time interval between time when the wafers W are partially exposed with a decrease in washing solution level and time when all the wafers W are dipped with an increase in solution level with the supply of the rinse solution is controlled to fall within 10 sec (including 10 sec).

Thereafter, the valve V14 is opened, and the rinse solution is supplied from the rinse solution supply source (not shown) to the bottom portion of the processing bath 4 through the rinse solution supply path 272. The rinse solution is straightened through the straightening plate 44 and goes up. The rinse solution overflows from the processing bath 4 and is discharged through the drain pipe 275.

At this time, although the rinse solution is rapidly filled in the processing bath 4 in the previous step, the rinse solution is mixed with the washing solution which attaches to the inner surface, the wafers W, the wafer holder 3, and the like in the processing bath 4. Therefore, by supplying new pure water into the processing bath 4, the pure water having a low purity is substituted with the pure water having a high purity to adjust the resistivity of the pure water in the processing bath 4 to a target value of 18 MΩ·cm or more.

On the other hand, the valves V16 and V17 are open during this rinse processing. The washing solution in the recovery vessel 263 is circulated through the circulating path 274 and kept at a predetermined temperature by the temperature controller H. At the same time, the washing solution is replenished from the washing solution replenishing portion 264 to keep the concentration of the washing solution at a predetermined value.

The washing solution is replenished as follows. First, the concentration of the washing solution in the recovery vessel 263 is measured to obtain the replenishing amount on the basis of the concentration measurement result. After the resistivity of the solution in the processing bath 4 is recovered to a target value of pure water, the valve V14 is closed, and the valves V13 and V15 are opened to discharge the rinse solution in the processing bath 4 through the drain pipe 273. Upon completion of the washing processing of the wafers W in this manner, the first rinse solution supply portion 205 is moved up, and the wafer holder 3 is removed outside the processing bath 4 by the convey means.

Subsequently, the valves V15 and V17 are closed, and the valve V12 is opened. The washing solution in the recovery vessel 263 is sent from the branch path 274a into the circulating path 271 through the pump P to supply the washing solution from the bottom portion of the processing bath 4 into the processing bath 4. Then, the valve V16 is closed, and the valve V11 is opened. The washing solution in the processing bath 4 is circulated through the washing solution circulating path 271 to wash next wafers W. Note that, when the washing solution from the recovery vessel 263 is short, or the concentration of the washing solution is low, the shortage amount of the washing solution is replenished from the washing solution supply portion 45.

In the above apparatus, since the rinse solution is dropped from above the processing bath 4, the rinse solution can be rapidly supplied into the processing bath 4. Furthermore, upon completion of washing the wafers W, the washing solution is rapidly discharged from the bottom portion of the processing bath 4 through the washing solution discharge portion 206, and then the rinse solution is rapidly supplied from the vessel 251. With this operation, the washing solution in the processing bath 4 can be substituted with the rinse solution within a short period of time. For example, the discharge of the washing solution and the supply of the rinse solution are performed so as to set the exposure time of the wafer W within 10 sec. For this reason, the dry area of the wafer W can be eliminated or decreased, and the continuous dry time of the area is short to increase the wet etching uniformity with respect to the surface of the wafer W.

Since the washing solution discharged from the processing bath 4 is temporarily kept in the recovery vessel 263 and utilized again for washing solution processing, the consumption of the washing solution can be decreased. Further, since the rinse efficiency is increased, an amount of pure water used is reduced, and the throughput is increased.

The present inventors observed the surfaces of 50 wafers by using the same test apparatus as that in the above-mentioned embodiment under conditions that a flow rate adjusting valve was arranged in the rinse solution supply pipe 252 of the first rinse solution supply portion, the exposure time of the wafers W was set to three values, i.e., 8 sec, 10 sec, and 20 sec (provided that figures after the decimal point are rounded to nearest), and a 5%-hydrofluoric acid solution was used as a washing solution. It was confirmed that the surface of any wafer W was uniformly processed with 10 sec or less, but the etching amount was slightly decreased at the upper portion of each wafer W with 20 sec. Therefore, it is preferable that the exposure time of the wafer W, i.e., a time interval between time when the wafer W is partially exposed by discharging the washing solution and time when the whole wafer W is dipped by supplying the rinse solution be within 10 sec.

If the first rinse solution supply portion 205 is set to be freely elevated, the rinse solution can be dropped from a position near the processing bath 4 and rarely spatters. Alternatively, the first rinse solution supply portion 205 may be fixed above the processing bath 4 with a space required for conveying the wafer holder 3.

Figure 13:
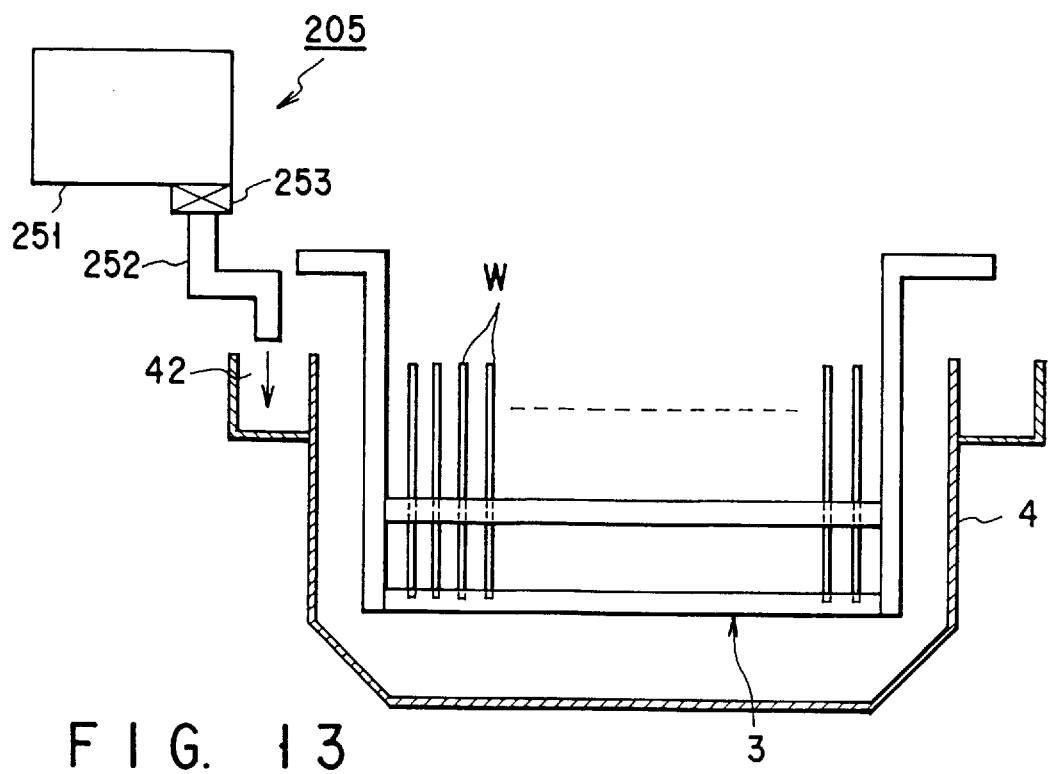
FIG. 13 is a longitudinal sectional view showing the substrate washing apparatus when viewed from the front.
Figure 14:
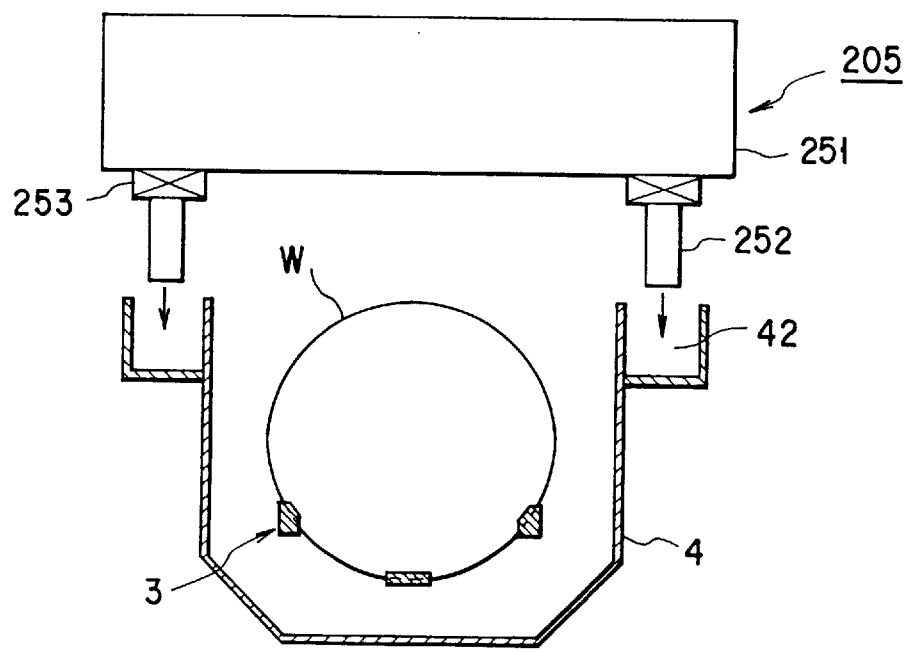
FIG. 14 is a longitudinal sectional view showing the substrate washing apparatus when viewed from the side.
Figure 15:
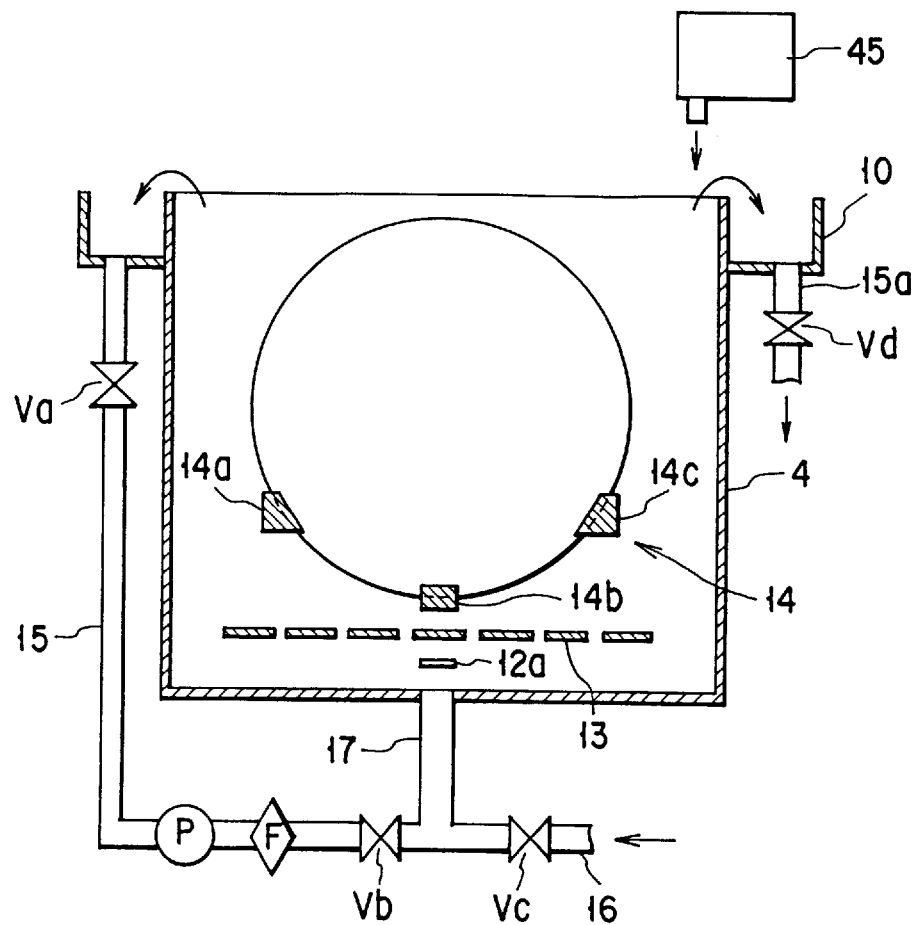
FIG. 15 is a sectional block diagram showing a conventional apparatus.

In addition, as shown in FIGS. 13 and 14, the first rinse solution supply portion 205 may be arranged at an upper position not to interfere with the wafer holder 3 in the convey operation of the wafer holder 3 to drop the rinse solution into the reception bath 42 so as not to directly hit the wafer W. To hold the wafers in the processing bath 4, the wafers may be transferred to a holding means arranged in the processing bath 4 in advance, instead of holding the wafers by the wafer holder and conveying them together with the wafer holder.

Note that the present invention can be applied to not only a case in which an oxide film is etched with a hydrofluoric acid solution, but also a case in which a nitride film is etched with a phosphoric acid solution, and a case in which aluminum is etched with a solution mixture of phosphoric acid, acetic acid, and nitric acid. In another washing processing, particles may be removed with an APM solution (ammonia+hydrogen peroxide solution+pure water), metal contamination may be cleaned with an HPM solution (hydrochloric acid+hydrogen peroxide solution+pure water), or organic matters in a resist film may be removed with an SPM solution (sulphuric acid+hydrogen peroxide solution). Note that a target substrate may include a liquid crystal substrate and a printed board.

As described above, according to the present invention, when processing with a washing solution and rinsing processing with a rinse solution are performed in a common processing bath, the washing solution is rapidly discharged from the processing bath upon completion of the processing with the washing solution, and then the rinse solution is rapidly supplied into the processing bath. In this manner, the exposure time of target substrates is shortened, so that the surface of the target substrates can be highly uniformly processed. Moreover, by temporarily keeping the washing solution discharged from the processing bath in a recovery vessel to utilize the washing solution again, the consumption of the washing solution can be reduced. In addition, since the rinse efficiency is increased, the consumption of pure water is reduced, and the throughput is increased.

The fourth embodiment will be described below with reference to FIGS. 16 to 24.

Figure 16:
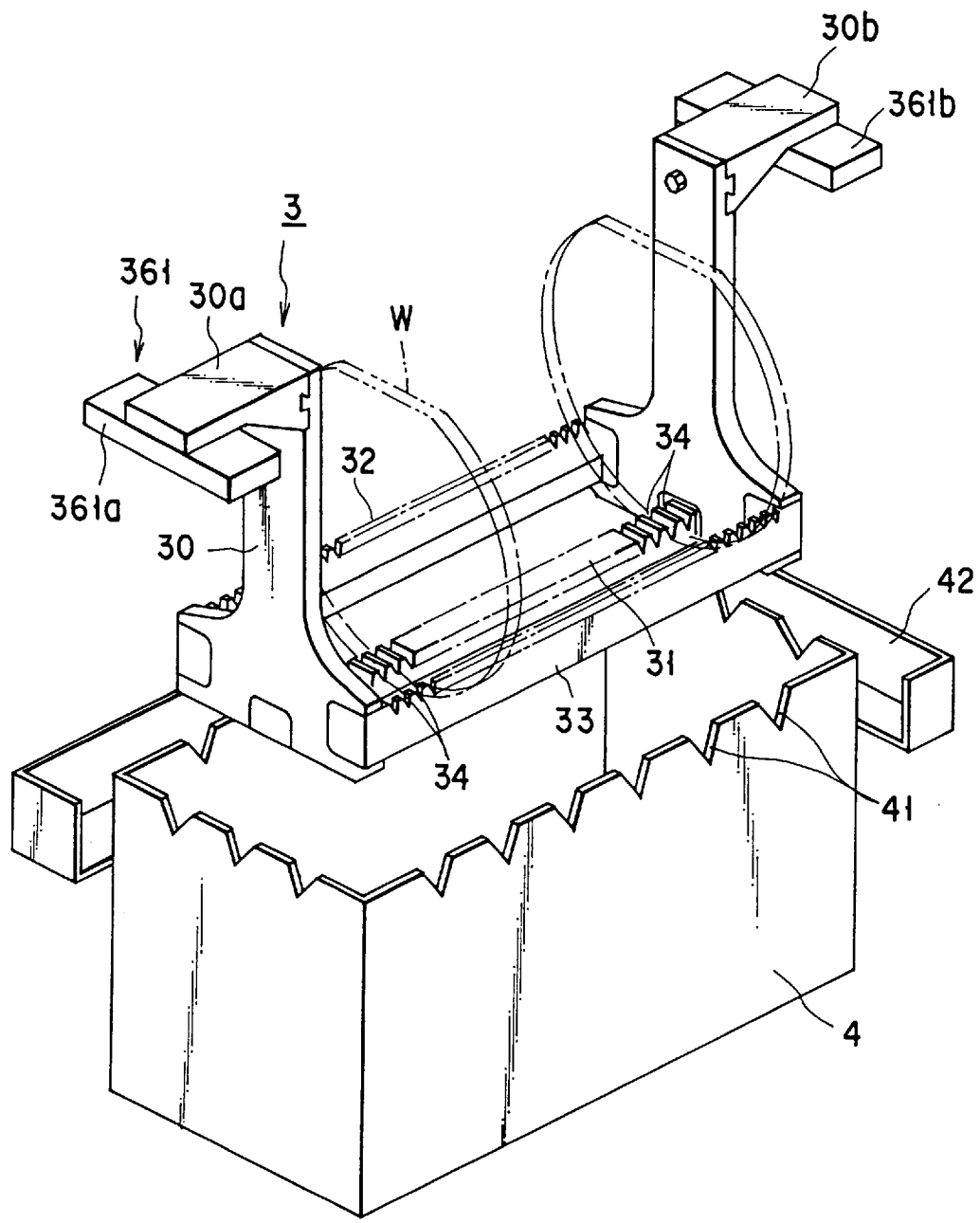
FIG. 16 is a schematic perspective view showing a substrate washing apparatus.

FIG. 16 shows a schematic appearance of the above-mentioned exclusive wafer holder and an apparatus. A wafer holder 3 is constituted by arranging a holding rod 31 for holding the lower ends of wafers W, and holding rods 32 and 33 for holding the two sides of the lower portions of each wafer W. For example, fifty holding grooves 34 for holding the wafers W at a pitch smaller than the arrangement pitch of the wafers W in the wafer cassette C, e.g., at half the arrangement pitch (e.g., 6.35 mm×½=3.175 mm for 8" wafers) are formed in each of the holding rods 31 to 33.

Figure 17:
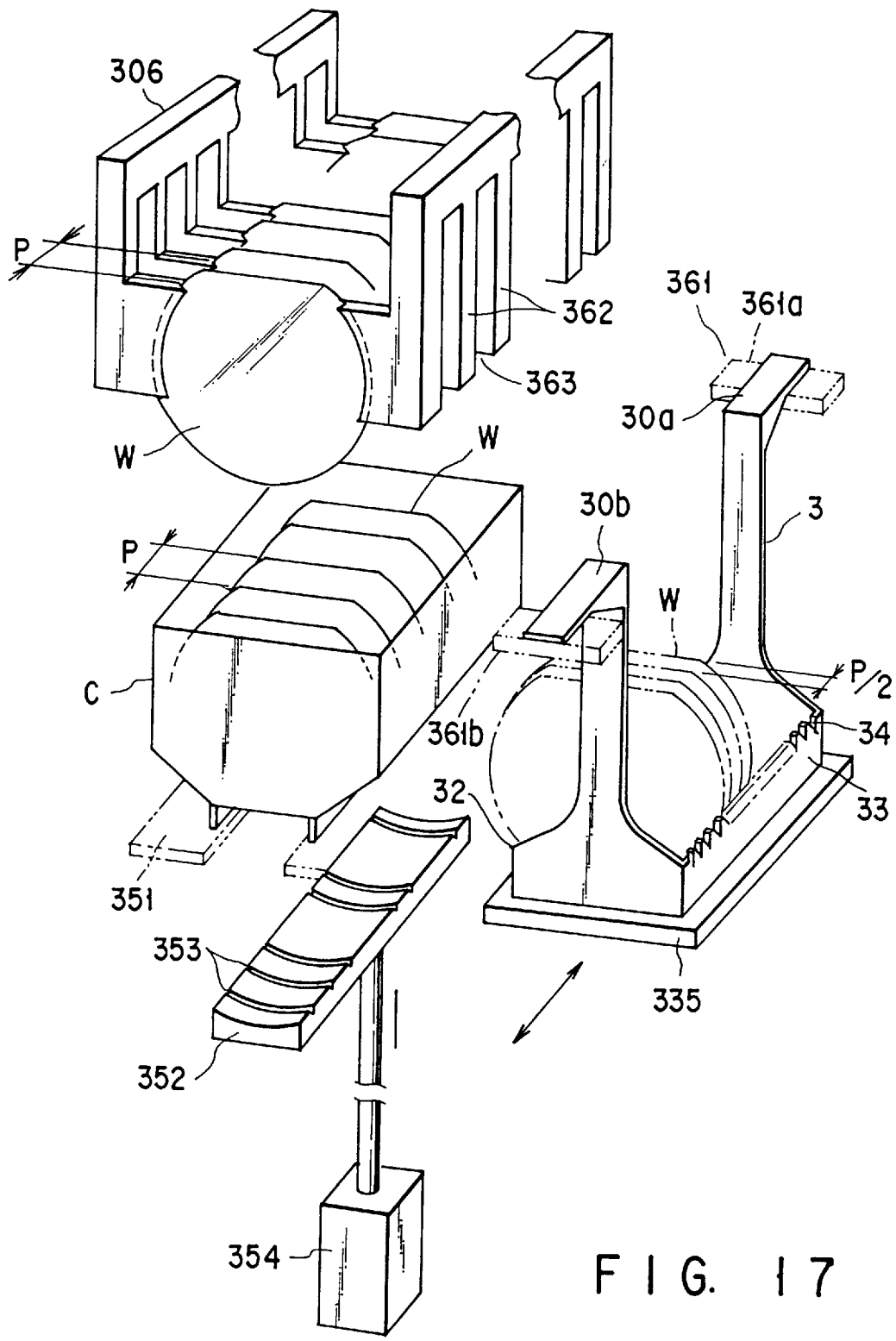
FIG. 17 is an exploded perspective view showing a substrate washing apparatus according to the third embodiment of the present invention.
Figure 18:
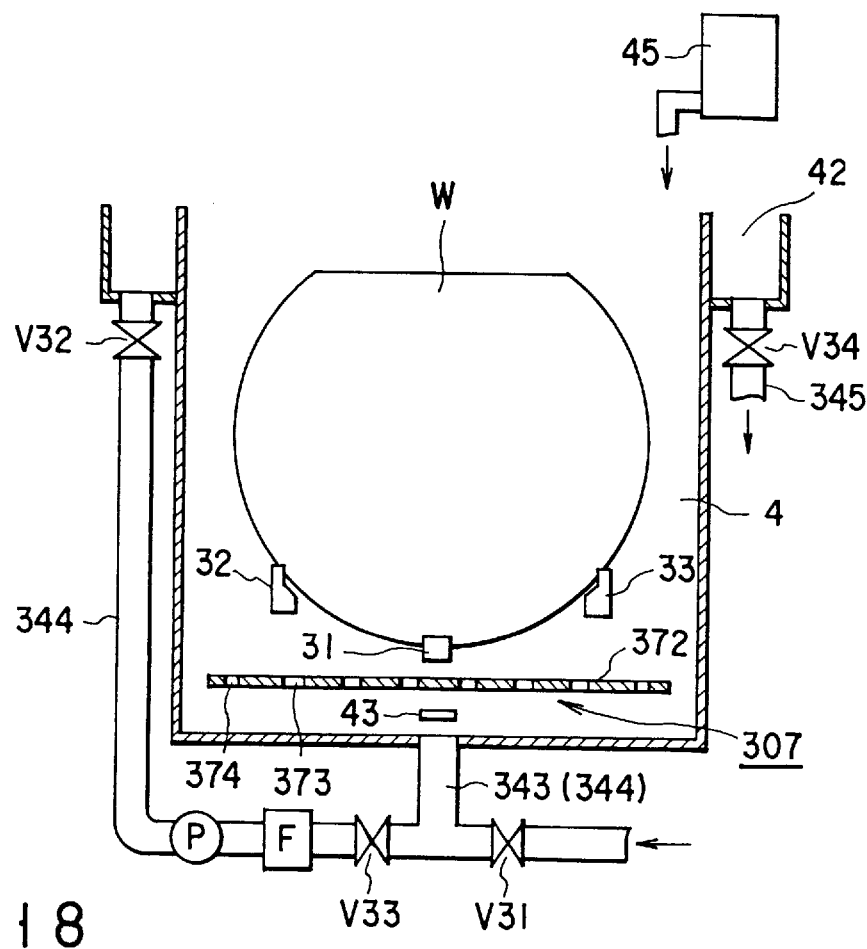
FIG. 18 is a partially cutaway sectional block diagram showing the substrate washing apparatus according to the third embodiment of the present invention.

A holder convey means denoted by reference numeral 361 in FIGS. 16 and 17 is constituted by a pair of arms 361a and 361b for supporting the lower surfaces of corresponding supported portions 30a and 30b which are respectively bent forward and backward at the upper portions of the wafer holder 3. The holder convey means conveys the wafer holder 3 between a moving base 335 (to be described later) and a processing bath 4.

Next, an example of the arrangement of each processing bath 4 (T2 to T4) and related units will be described with reference to FIGS. 16 to 19.

The processing bath 4 has a rectangular shape. In addition, triangular notched portions 41 are formed at the upper edge portion of the processing bath 4. A reception bath 42 for receiving an overflowing solution is arranged outside the upper edge portion of the processing bath 4.

As shown in FIG. 17, a wafer push-up member 352 is arranged below a table 351 of the cassette C at a loader portion 22. The push-up member 352 comprises holding grooves 353 for holding 25 wafers W in one cassette. The push-up member 352 comprises holding grooves 353 for holding 25 wafers W corresponding to one cassette. In addition, the push-up member 352 is moved by an elevating portion 354 to push up the 25 wafers W at once from the lower side of the cassette C and to hold them.

As shown in FIG. 17, a wafer chuck 306 comprises a pair of gripping members 362 which can be opened/closed to grip the wafers W. Twenty-five wafers W pushed up from the wafer cassette C by the push-up member 352 are gripped at once at a pitch P equal to an arrangement pitch P of the wafers W in the cassette C, and transferred to the wafer holder 3. At this time, since the pitch of the holding grooves 34 of the wafer holder 3 is half of a normal pitch (P/2), the wafers W are held by every other holding grooves 34.

On the other hand, the wafer holder 3 is placed on the moving base 335 which is movable in the Y-axis direction. The moving base 335 can be accurately moved by half the arrangement pitch P (half pitch P/2) of the wafers W in the cassette. After 25 wafers W (wafers corresponding to one cassette) are transferred from the wafer chuck 306, the moving base 335 is moved forward by the half pitch P/2. Therefore, next 25 wafers W gripped by the wafer chuck 306 enter between the 25 wafers W which have already been held in the wafer holder 3, and are held by the alternately empty holding grooves 34.

Note that, since a space is formed between the adjacent chuck portions 362 in the wafer chuck 306, the wafer W does not interfere with the previous wafers W. In this example, a transferring means for removing the wafers W arranged in the cassette C at the pitch P to transfer them to the wafer holder 3 which holds them at the half pitch P/2 is constituted by the push-up member 352, the wafer chuck 306, the moving base 335, and the like. To transfer 50 wafers W from the wafer chuck 306 to the wafer holder 3, the wafer chuck 306 side may be moved instead of moving the wafer holder 3 side.

A rinse solution supply pipe 343 is attached to the bottom portion of the processing bath 4 to supply pure water into the processing bath 4. A straightening means 307 is arranged between the bottom portion of the processing bath 4 and the wafer holder 3. The rinse solution supply pipe 343 also serves as part of a washing solution circulating path 344 and is connected to a pure water supply source (not shown) through a valve V31.

The circulating path 344 is arranged between the bottom portion of the reception bath 42 and the bottom portion of the processing bath 4. A valve V32, a pump P, a filter F, and a valve V33 are interposed in the circulating path 344. A discharge pipe 345 having a valve V34 is connected to the reception bath 42 to discharge pure water in rinse processing.

Figure 19:
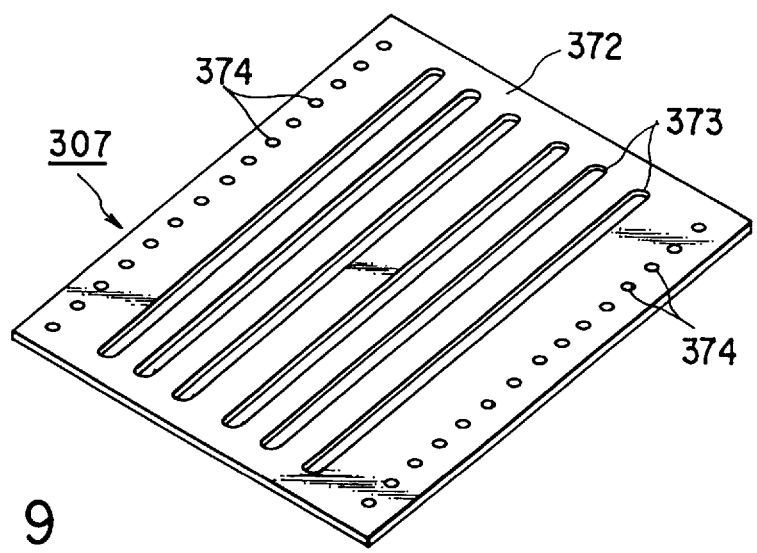
FIG. 19 is a perspective view showing an example of a straightening plate.

As shown in FIG. 19, the straightening means 307 comprises a diffusion plate 43 and a straightening plate 372. Slits 373 extending parallel to each other in the Y-axis direction, and hole portions 374 arranged in the Y-axis direction are formed in the straightening plate 372 constituted by a plate-like member slightly longer than each of the holding rods 31, 32, and 33 of the wafer holder 3. A washing solution supply portion 45 is arranged above the processing bath 4 at a position not to interfere with the wafer chuck 306.

The operation of the above apparatus will be described below.

Figures 20A, 20B:
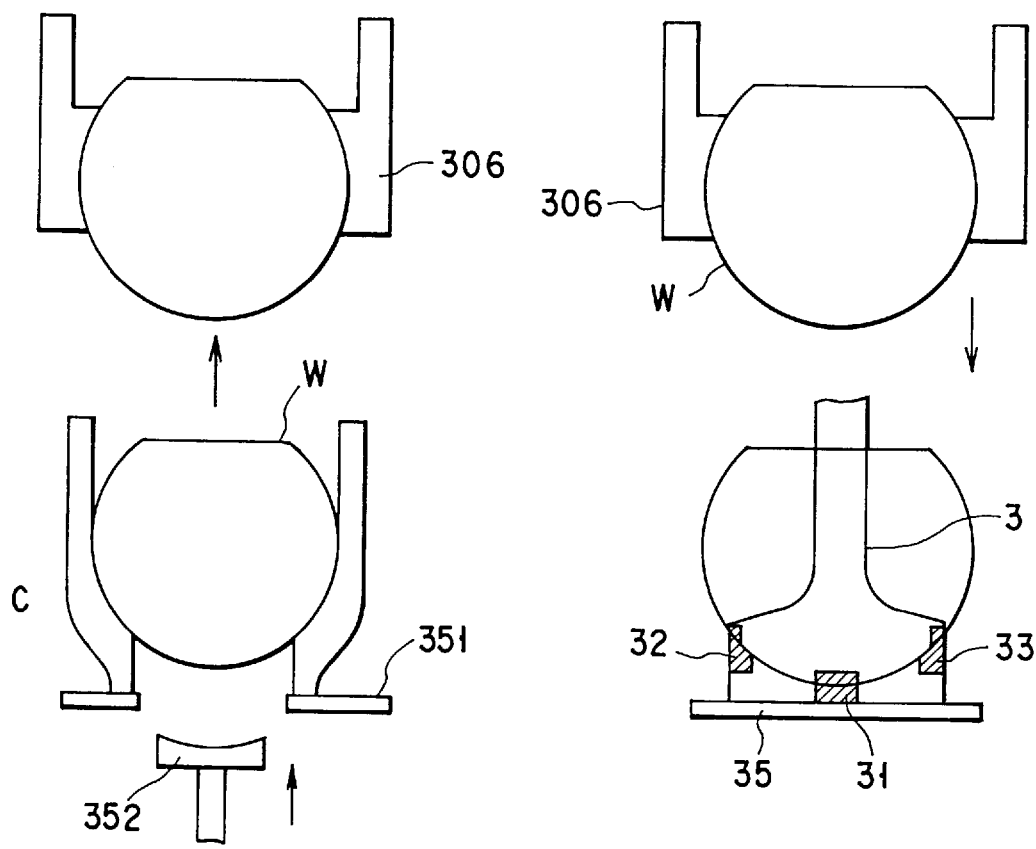
FIGS. 20A and 20B are schematic sectional views, respectively, for explaining a wafer transfer operation.

First of all, as shown in FIG. 20A, the push-up member 352 is moved up from the lower portion of the cassette C to push up 25 wafers W in the cassette C at once at the loader portion 22. As shown in FIG. 20B, the wafer chuck 306 grips these wafers W to transfer them to the wafer holder 3.

Similarly, next 25 wafers are pushed up from the cassette C, gripped, and transferred to the wafer holder 3. Any one of the wafer chuck 306 and the wafer holder 3 is moved to shift the relative position between the two members from the relative position in a previous transferring operation in the Y-axis direction by the half-pitch (P/2) distance. In this embodiment, the wafer holder 3 is moved by the half-pitch (P/2) distance, and the wafers W are transferred from the wafer chuck 306 to the wafer holder 3. In this manner, the 50 wafers W are held by the wafer holder 3 at the arrangement pitch P/2 which is half the arrangement pitch P in the cassette.

On the other hand, a hydrofluoric acid solution is supplied form a washing solution supply portion 308 into the processing bath 4. The valves V32 and V33 are opened, and the washing solution is circulated by the pump P. The wafer holder 3 is conveyed into the processing bath 4 by a holding convey means 361. As shown in FIG. 21A, the 50 wafers W are dipped in the washing solution to remove oxide films on the surfaces of the wafers W with the hydrofluoric acid solution.

Next, the circulation of the washing solution is stopped, and pure water is supplied into the processing bath 4 through the rinse solution supply pipe 343, as shown in FIG. 21B. The supplied pure water goes up from the bottom portion of the processing bath 4. The pure water is diffused through the diffusion plate 43 and straightened through the straightening plate 372, and further goes up through the wafers W. As a result, the washing solution is discharged from the processing bath 4 and substituted with the pure water. Thereafter, rinse processing is continuously performed with the pure water from the rinse solution supply pipe 43 until the resistivity is recovered. Then, the rinse solution is completed.

Since the apparatus of the above embodiment employs a so-called one-bath system for performing washing processing and rinse processing in a common processing bath, the apparatus can be downsized. In particular, when washing processing is performed with a plurality of washing solutions, this apparatus can be greatly downsized compared to a conventional apparatus in which pairs of washing baths and rinse baths are used. In addition, since the wafers W are aligned in and held by the wafer holder 3 at a pitch smaller than the arrangement pitch in the wafer cassette C, e.g., at the half pitch, and the wafers W are dipped in the processing bath 4 by the wafer holder 3, the processing bath 4 itself is downsized.

In the one-bath system, it is significant to reduce the arrangement pitch of the wafers W in the wafer holder 3. More specifically, in the conventional apparatus using the washing bath and the rinse bath, if the pitch of the wafers W is reduced, the attachment number of particles is large upon completion of a series of washing processing. To the contrary, in the one-bath system, the problem of particle attachment does not arise. The present inventors have found that the difference between the conventional system and the system of the present invention becomes remarkable when a hydrophobic hydrofluoric-acid based solution is used as a washing solution. Although the reason has not been clarified, it can be considered that, if the arrangement pitch of the wafers W is small, particles are not smoothly removed in transferring the wafers W from a washing solution to a rinse solution, and particles on the lower surface sides of the wafers W attach to the facing surfaces of the wafers W.

Since the wafers W are held by the exclusive wafer holder 3 and dipped in the processing bath, the processing bath 4 can be downsized by a cassette C introduction space or a wafer chuck entrance space for the wafer chuck, compared to a case in which the wafers W stored in the cassette C are dipped in a washing solution, or a case in which the wafers W are gripped by the wafer chuck and transferred to a wafer board in the processing bath 4.

Furthermore, the wafers are rarely contaminated with particles compared to a case in which the wafers are sequentially conveyed to each processing path by the wafer chuck. Still further, since the wafer holder 3 itself is downsized by reducing the pitch of the holding grooves 34, the holder convey means can be downsized.

In this manner, by downsizing the processing bath 4, the downsizing and cost reduction of the apparatus can be realized. At the same time, the consumption of a washing solution and a rinse solution can be reduced, and a time required for substituting the washing solution with the rinse solution can be shortened to increase the rinse efficiency. As a result, the rinse time is decreased to increase the throughput. The tact time interval between completion of processing wafers in a certain lot, and processing of wafers in the next lot can be shortened.

In the above embodiment, the pitch interval between the holding grooves 34 of the wafer holder 3 is not limited to the half pitch (P/2). However, if the pitch is set too smaller than the half pitch (P/2), the wafers W may be brought into contact with each other by a surface tension. For this reason, it is preferable to set the pitch interval between the holding grooves 34 to be 2 mm or more.

The following means may be used as a means for transferring wafers from the cassette C to the wafer holder 3. That is, the gripping grooves of a wafer chuck are elongated downward, and are close to each other downward from a certain position. When the wafers in the cassette are gripped, the wafers are aligned at a pitch in the cassette. When the wafer chuck is moved up toward the cassette, the wafers are moved down along the gripping grooves, stopped at predetermined positions, and gripped by the wafer chuck at a small pitch (the pitch on the lower portion side of the gripping grooves is reduced). In this manner, the pitches may be converted.

Moreover, to convert the pitches, e.g., 50 independent holding groove forming members for forming holding grooves may be prepared. A middle holding mechanism in which these members are set to be movable in a wafer arrangement direction to change the interval between the holding grooves may be prepared. Wafers in a cassette are removed by a wafer chuck and temporarily held by the intermediate holding mechanism. The holding groove forming members are moved to reduce the pitch. Then, the wafers on the middle holding mechanism are gripped by another wafer chuck with a smaller pitch and transferred to a wafer holder.

To supply a washing solution into the processing bath 4, it is preferable to provide a function capable of diluting the washing solution during being supplied from a washing solution supply system on a factory side to the processing bath 4. For example, a hydrofluoric acid solution having a predetermined concentration of 1:99 (50% hydrofluoric acid : pure water) is supplied from the supply system on the factory side to the processing bath 4. In this case, an oxide film on each wafer W is etched by about 30 Å/min. In the one-bath system, however, pure water is supplied into the processing bath 4 filled with a washing solution to substitute the washing solution with the rinse solution, thereby performing rinse processing. Even if the flow rate of the pure water is increased to about 50 l/min, a time of a certain degree is required to completely substitute the washing solution with the rinse solution. Accordingly, the etching uniformity on the surface of a wafer may be degraded, or the wafer may be etched by a predetermined film thickness or more unless the way of flowing the rinse solution in the processing bath 4 or the sequence of processing is implemented.

Figures 22A, 22B:
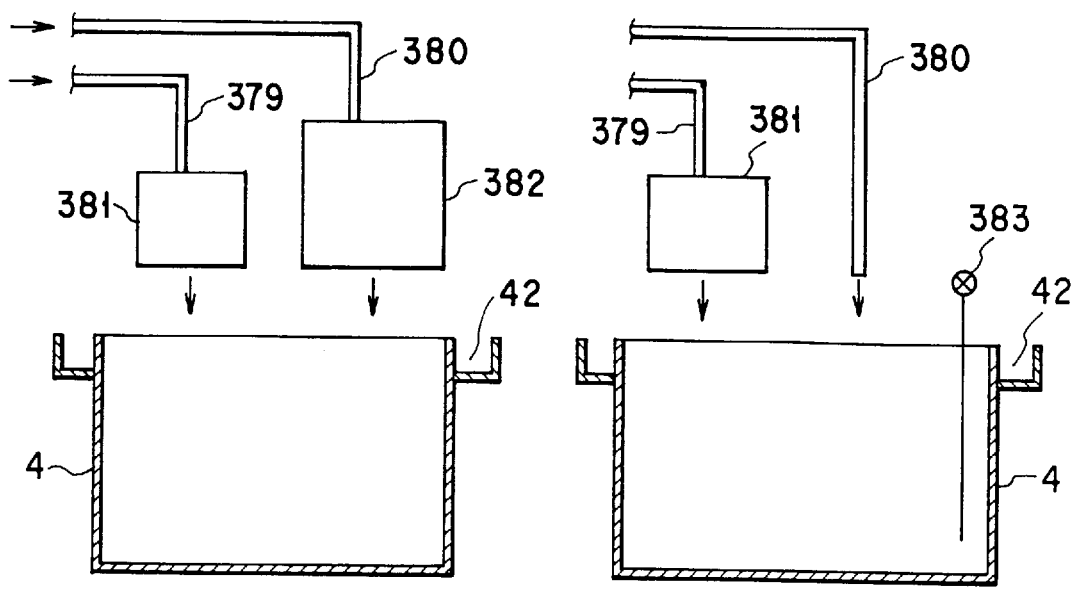
FIGS. 22A and 22B are sectional block diagrams, respectively, for explaining a washing solution supply operation.

In terms of the supply of a washing solution, as shown in FIG. 22A, it is preferable that a washing solution weighing tank 381 be arranged at an intermediate portion between the washing solution supply system (not shown) and the processing bath 4, a pure water weighing tank 382 be arranged midway along the pure water supply path, the washing solution and the pure water which are supplied to the processing bath 4 be respectively weighed to reduce the concentration of the hydrofluoric acid solution in the processing bath 4 from 0.5 vol % to, e.g., 0.2 vol %. With this operation, the etching rate can be decreased to reduce the influence of etching during substituting the washing solution with the rinse solution. For this reason, etching can be highly uniformly performed to a predetermined film thickness, and the consumption of pure water can be reduced.

To dilute the washing solution in this manner, a weighing sensor 383 may be arranged in the processing bath 4 as shown in FIG. 22B, instead of weighing pure water by the weighing tank 381. The pure water may be weighed by the weighing sensor 383, and then the washing solution weighed by the weighing tank 381 may be supplied into the processing bath 4. In this case, it is preferable for the weighing sensor 383 to employ a system in which it is determined with a nitrogen gas pressure gauge that the head pressure exceeds a predetermined value by blowing off, e.g., nitrogen gas, thereby weighing the pure water in the processing bath.

Figure 23:
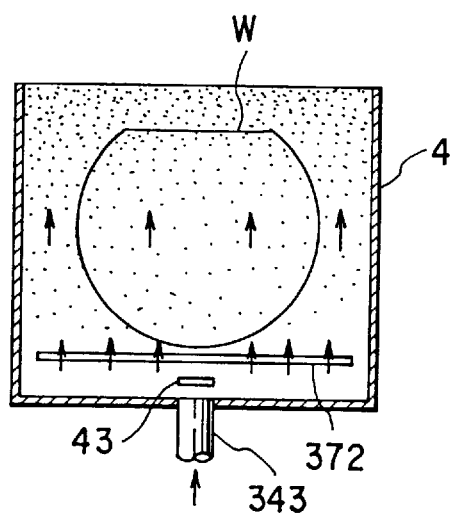
FIG. 23 is a longitudinal sectional view for explaining a washing/rinse operation.
Figure 25:
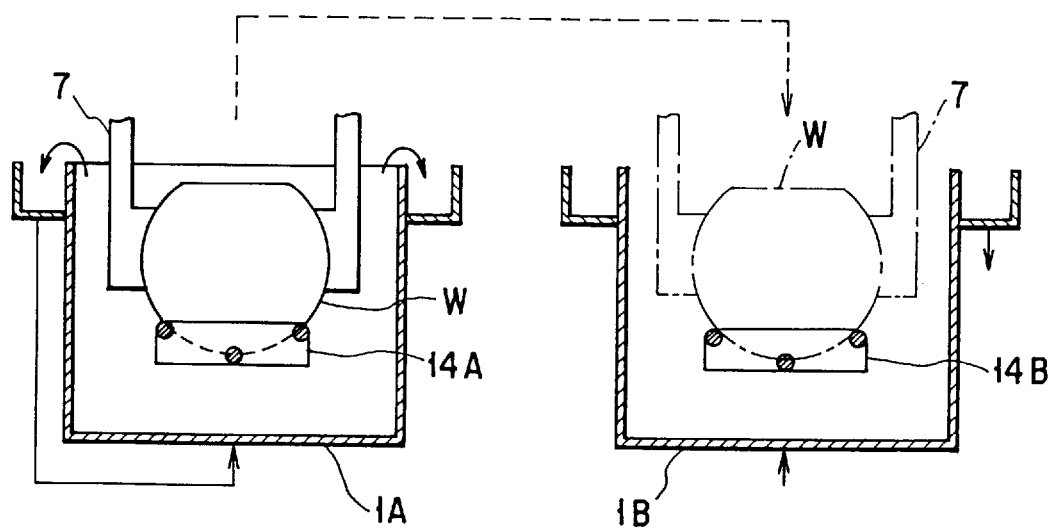
FIG. 25 is a sectional block diagram showing a conventional apparatus.

On the other hand, to improve the washing processing uniformity, the following scheme may be employed. More specifically, in the above-mentioned embodiment, pure water is supplied from the bottom portion of the processing bath 4 when washing processing is shifted to rinse processing. A flow to be straightened in the processing bath 4 is straightened by the straightening means 307. With this arrangement, as shown in FIG. 23, the hydrofluoric acid concentration is decreased from the lower portion side of the processing bath 4, and the hydrofluoric acid solution is substituted with the pure water. Therefore, in this substitution, the etching amount at the upper portion of the wafer W is smaller than that at the lower portion, so that the wafer W is not uniformly etched as a whole.

For this reason, it is preferable to introduce the wafer W into a washing solution so as to cancel the etching nonuniformity during substitution when the wafer W is dipped in the washing solution. If the wafer W is rapidly introduced into the washing solution, etching is affected by substitution. However, if the introduction speed of the wafer W into the washing solution is slightly decreased, the etching amount of the lower side portion of the wafer W is increased because the dipping time on the lower portion side is longer in the introduction process. Therefore, the nonuniformity of etching amounts in the substitution process and the introduction process can be canceled by optimizing the introduction speed of the wafer, more specifically, by optimizing the descent speed of the holding convey means 361. As a result, uniform washing processing, e.g., uniform etching can be performed.

The next test was conducted to examine the relationship between the introduction speed of wafers and the etching uniformity. The introduction speed of the wafers W was set to three values, i.e., 2.6 cm/sec, 4.4 cm/sec, and 5.4 cm/sec, oxide films on the wafers W were etched, and differences between the maximum and minimum values of the film thicknesses of the wafers were examined. It was found that the difference was smallest at 4.4 cm/sec, and the etching uniformity was the highest. A 0.5%-hydrofluoric acid solution was used as a washing solution, and the flow rate of pure water was set at 15 l/min. As is apparent from this experiment, the etching uniformity is affected by the introduction speed of wafers depending on the type and concentration of a washing solution. Therefore, it is preferable to introduce wafers into the washing solution at an optimum introduction speed.

In the one-bath washing apparatus, since a washing solution is disposable, a new solution is always supplied to wafers to keep the cleanness of the washing solution high. For this reason, a washing solution circulating path including a filter F may not be arranged as shown in FIG. 24, which realizes cost reduction. In this case, it is preferable to arrange a means for stirring a washing solution, e.g., bubbling means 391 and 392 for, e.g., an inert gas in the processing bath 4, and a heater 393 in or outside the processing bath 4 in order to adjust the temperature of the washing solution.

As described above, the present invention can be applied to not only a case in which an oxide film is etched with a hydrofluoric acid solution, but also a case in which a nitride film is etched with a phosphoric acid solution, and a case in which aluminum is etched with a solution mixture of phosphoric acid, acetic acid, and nitric acid. In another washing processing, particles may be removed with an APM solution (ammonia+hydrogen peroxide solution+pure water), metal contamination may be cleaned with an HPM solution (hydrochloric acid+hydrogen peroxide solution+pure water), or organic matters in a resist film may be removed with an SPM solution (sulphuric acid+hydrogen peroxide solution). Note that a target substrate may include a liquid crystal substrate and a printed board.

According to the above embodiment, washing processing and rinse processing are performed in a common processing bath. A plurality of substrates are held by an exclusive holder whose pitch is smaller than an arrangement pitch in a cassette, and dipped in and removed from the processing bath. Therefore, the number of processing baths can be decreased, and the washing apparatus can be downsized with downsizing of the processing bath. In addition, since substitution of a washing solution with a rinse solution can be rapidly performed with the downsizing of the processing bath, the processing efficiency can be increased.

The fourth, fifth, and sixth embodiments of the present invention will be described below with reference to FIGS. 26 to 43.

Figure 26:
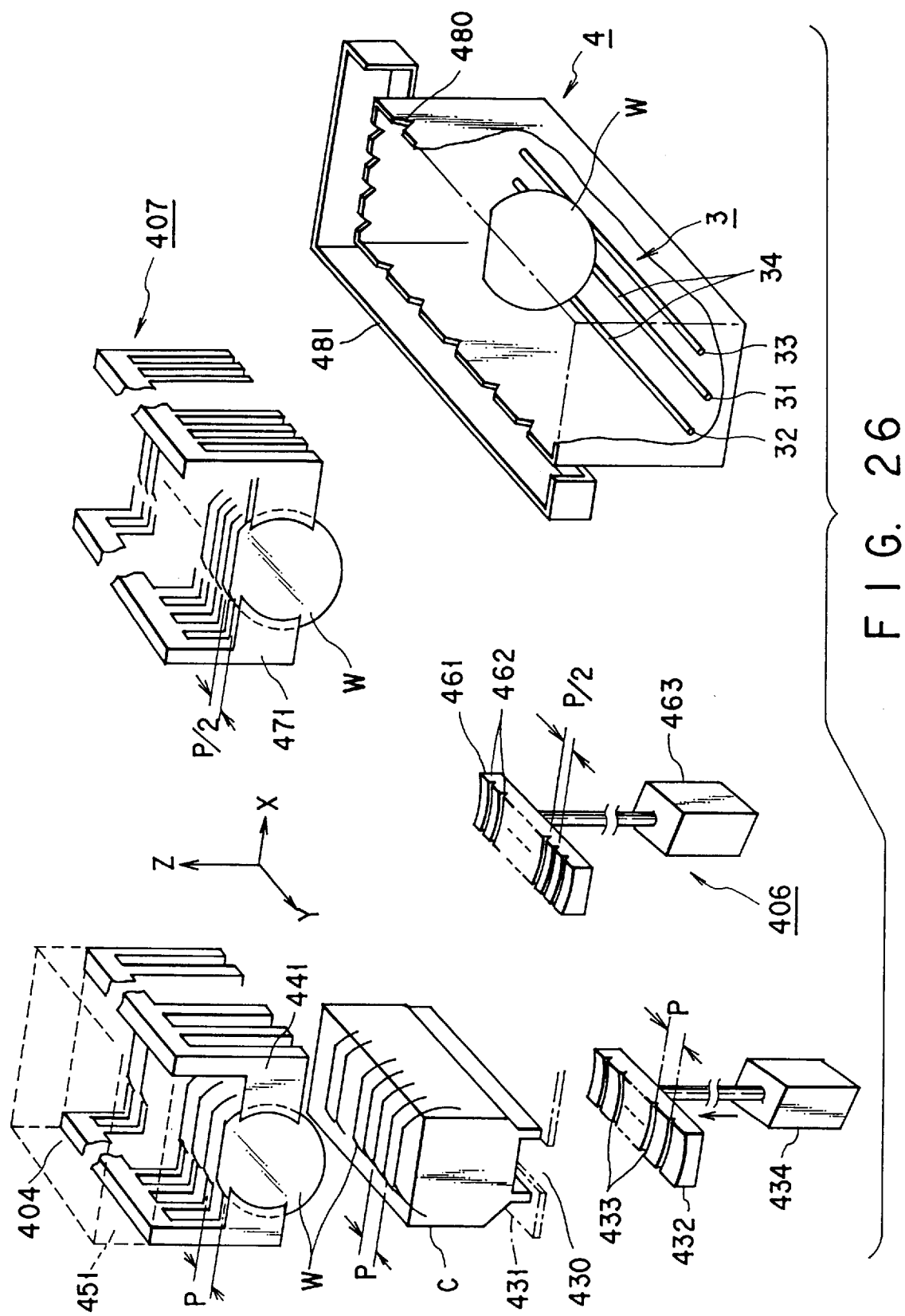
FIG. 26 is an exploded perspective view showing a substrate washing apparatus according to the fourth embodiment of the present invention.

A loader portion 22 will be described with reference to FIG. 26. In a wafer cassette C, 25 wafers W are arranged at a pitch P. The wafer cassette C is placed on a table 431 in which a passing space 430 for passing a push-up member 432 (to be described later) therethrough is formed. The push-up member 432 for the wafers W is arranged below the table 431. The push-up member 432 comprises holding grooves 433 for holding the 25 wafers W corresponding to one cassette at the pitch P. The push-up member 432 is moved up by an elevating portion 434 to push up the 25 wafers W at once from the lower side of the cassette C through the space 430 and to hold them.

Figure 27:
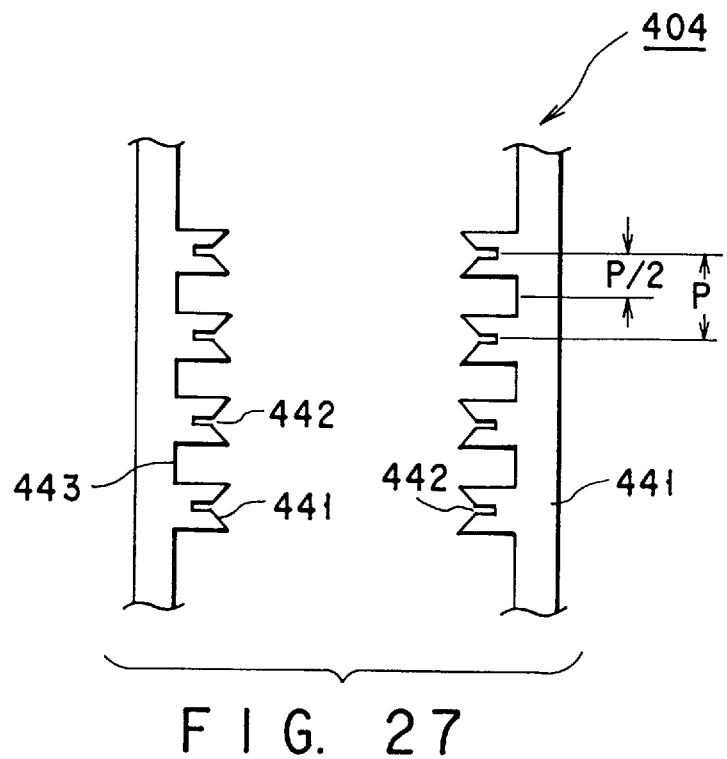
FIG. 27 is a partial enlarged view showing the first wafer chuck.

A first wafer chuck 404 serving as the first gripping means for transferring the wafers W from the cassette C to an intermediate holding portion 406 is arranged above the wafer cassette C. As shown in FIGS. 26 and 27, gripping grooves 442 are arranged inside a pair of opening/closing members 441 for horizontally opening/closing the wafer chuck 404 at a pitch equal to the arrangement pitch P of the wafers W in the cassette C. Notched portions 443 are formed between the adjacent gripping grooves 442 so as to allow one wafer W to enter between the adjacent wafers W when the wafer W is gripped. That is, the distance between the central portion of each notched portion 443 and the central portion of the adjacent gripping groove 442 in the direction of width is 1/n times (½ times in this case) the arrangement pitch P of the wafers W in the cassette. In addition, the notched portions 443 are formed such that the distance between the end portions of the opening/closing members 441 opposite to each other in the opening/closing direction becomes larger than the wafer diameter when the opening/closing members 441 grip the wafers W.

Further, the wafer chuck 404 comprises a mechanism 451 for opening/closing the opening/closing members 441, and a driving mechanism for driving the chuck main body in the X-axis direction (direction perpendicular to the wafer arrangement direction), the Y-axis direction (wafer arrangement direction), and the Z-axis direction. The driving mechanism includes a Z-axis driving portion and an X-axis driving portion.

Figure 28:
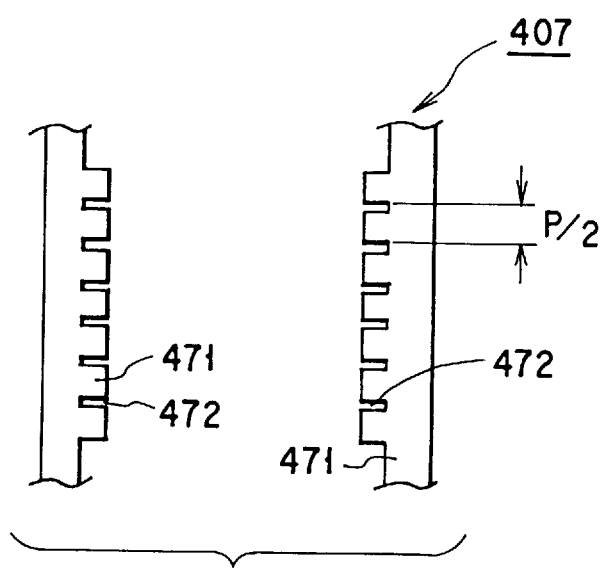
FIG. 28 is a partial enlarged view showing the second wafer chuck.

The intermediate holding portion 406 is constituted by a holding portion main body 461 having 50 holding grooves 462 formed at a pitch 1/n times (½ times in this case) the arrangement pitch P of the wafers in the wafer cassette C,.and an elevating portion 463 disposed on the lower end side of the holding portion main body 461 to vertically move the holding portion main body 461. The wafers W gripped by the wafer chuck 404 are transferred to the intermediate holding portion 406. A second wafer chuck 407 is disposed above the intermediate holding portion 406 to transfer the wafers W from the intermediate holding portion 406 to a processing bath 4. As shown in FIGS. 26 and 28, 50 gripping grooves 472 are formed in the inner sides of a pair of opening/closing member 471 of the second wafer chuck 407 at a half pitch (P/2) which is half the arrangement pitch P of the wafers in the wafer cassette C. The second wafer chuck 407 is driven by a driving mechanism (not shown) in the X-, Y-, and Z-axis directions by a driving mechanism (not shown), similar to the first wafer chuck 404.

Triangular notched portions 41 are formed in the upper edge portion of the processing bath 4. A solution overflowing from the processing bath 4 is received in a reception bath 42 through the notched portions 41. A wafer boat 3 is arranged inside the processing bath 4, and 50 wafers W are held by the boat 3.

The wafer boat 3 has three holding rods 31, 32, and 33. The two ends of each of the holding rods 31, 32, and 33 are attached to the inner wall surface of the processing bath 4 on the short edge side such that the central holding rod 31 holds the centers of the lower ends of the wafers W, and the holding rods 32 and 33 hold the two sides of the lower end of each wafer W. Fifty holding grooves 34 for holding the wafers W at the half pitch (P/2) which is half as large as the arrangement pitch P of the wafers W in the wafer cassette C are formed in each of the holding rods 31, 32, and 33.

As shown in FIG. 29, a rinse solution supply pipe 459 for supplying pure water as a rinse solution is connected to the bottom portion of the processing bath 4. Straightening means 43 and 44 are arranged between the bottom portion of the processing bath 4 and the wafer boat 3. The rinse solution supply pipe 459 serves as part of a washing solution circulating path 455 and communicates with a pure water supply source (not shown) through a valve V41. The circulating path 455 is arranged between the bottom portion of the reception bath 42 and the bottom portion of the processing bath 4. A valve V42, a pump P, a filter F, and a valve V43 are interposed in the circulating path 455. A discharge pipe 457 having a valve V44 to discharge pure water in rinse processing is connected to the reception bath 42.

The straightening means is constituted by the diffusion plate 43 having a diameter almost equal to that of a supply port formed opposite to the supply port of the rinse solution supply pipe 459, and the straightening plate 44 which is supported by support legs at a position above the diffusion plate 43 and has slits or hole portions formed along the bottom surface of the processing bath 4. A washing solution supply portion 45 is arranged above the processing bath 4 at a position not to interfere with the second wafer chuck 407.

Figure 30:
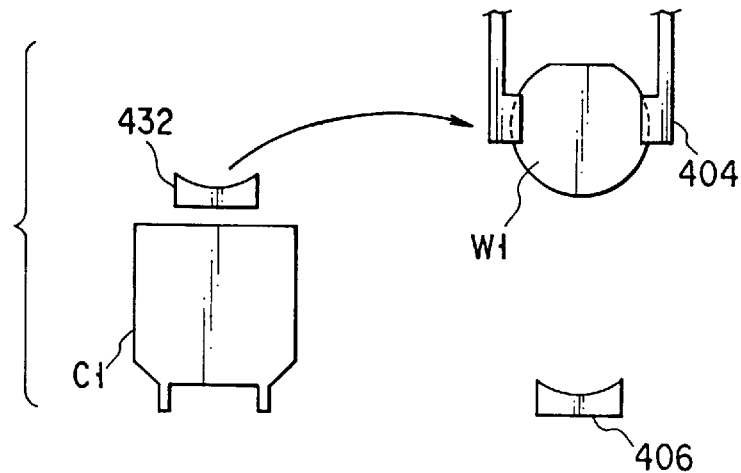
FIG. 30 is a schematic view for explaining a wafer transfer operation.
Figure 31:
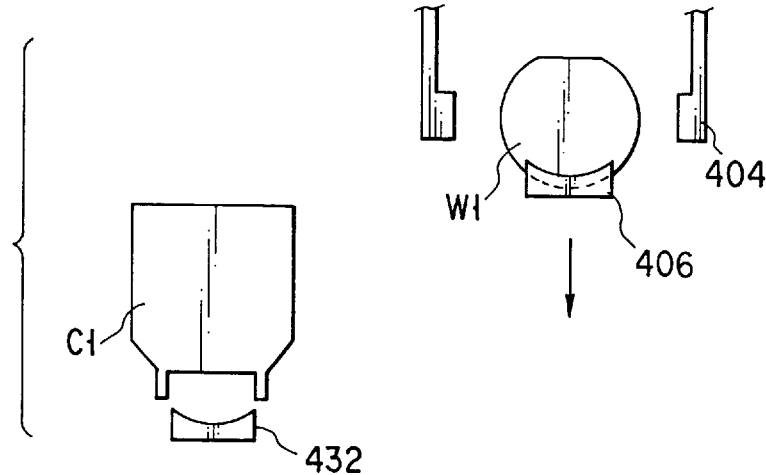
FIG. 31 is a schematic view for explaining a wafer transfer operation.
Figure 32:
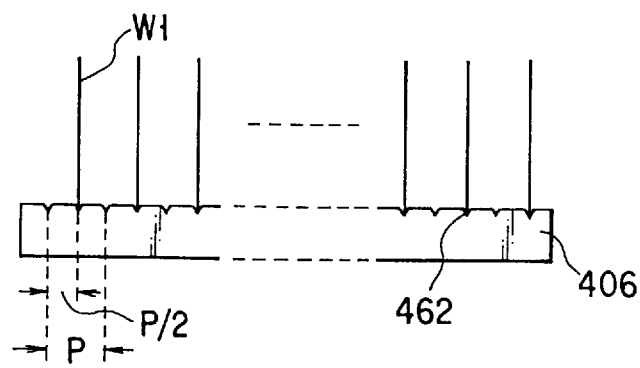
FIG. 32 is schematic view for explaining the aligned state of wafers on a boat.

Next, the operation of the above-mentioned embodiment will be described. At the loader portion 22, as shown in FIG. 30, after a first cassette C1 is placed on the table 431, the push-up member 432 is moved up from the lower portion of the cassette C1 to push up wafers W1 stored in the cassette C1 at the arrangement pitch P at once. The first wafer chuck 404 grips the pushed-up wafers W1 at the pitch P. After the lifting member 432 is moved down and spaced apart from the wafers W1, the wafer chuck 404 is moved to a position above the intermediate holding portion 406. As shown in FIG. 31, the intermediate holding portion 406 is moved up to hold the wafers W1 gripped by the wafer chuck 404. Then, the wafers W1 are transferred to the intermediate holding portion 406 at the pitch P (first transfer operation). At this time, the wafers W1 are held by every other holding grooves 462 as shown in FIG. 32 because the holding grooves 462 are formed in the intermediate holding portion 406 at the pitch P/2 as described above.

Next, as shown in FIG. 33, after a second cassette C2 is placed on the table 431, and 25 wafers W2 stored in the cassette C2 are similarly pushed up by the push-up member 432, the first wafer chuck 404 grips the wafers W2 and transfers them to the intermediate holding portion 406. At this time, as shown in FIG. 34, the wafer chuck 404 is accurately moved to a position shifted from the position in the first transfer operation in the arrangement direction of the wafers W2 by a pitch 1/n times, e.g., ½ times, the arrangement pitch P of the wafers W in the wafer cassette C. The wafers W2 are transferred to the holding grooves adjacent to the holding grooves 462 which have already held the wafers W1 stored in the cassette C1 in the first transfer operation (second transfer operation).

The notched portions 443 are formed in the wafer chuck 404 at a position to which the wafer chuck 404 is moved from the central portion of the opening/closing member 441 by P/2. The wafer chuck 404 will not contact the wafers W1 which have been held by the intermediate holding portion 406 when the wafers W2 stored in the second cassette C2 are transferred from the wafer chuck 404 to the intermediate holding portion 406. In this manner, by performing a transfer operation n times, e.g., twice, the wafers W1 in the cassette C1 and the wafers W2 in the cassette C2 are alternately arranged in the intermediate holding portion 406 at the pitch (P/2) ½ times the arrangement pitch of the wafers W in the cassette C to hold the 50 wafers W.

On the other hand, a washing solution, e.g., a hydrofluoric acid solution is supplied from the washing solution supply portion 45 to the processing bath 4. Valves V42 and V43 are opened, and the washing solution is circulated by a pump P. As shown in FIG. 35, the intermediate holding portion 406 is moved up, and the second wafer chuck 407 grips, at the pitch (P/2), the 50 wafers W held by the intermediate holding portion 406. As shown in FIG. 36, the wafers W are transferred to the wafer boat 3 in the processing bath 4 at the pitch (P/2) ½ times the arrangement pitch P. The 50 wafers W are dipped in, e.g., the hydrofluoric acid solution, and oxide films on the surfaces of the wafers W are etched.

Subsequently, pure water is supplied from the bottom portion of the processing bath 4 through the rinse solution supply pipe 459. The pure water supplied from the rinse solution supply port is diffused by the diffusion plate 43 and straightened by the straightening plate 44, and goes up from the lower side of the wafers W. As a result, the washing solution is purged and substituted with the pure water in the processing bath 4.

The pure water is continuously supplied through the rinse solution supply pipe 459 until the resistivity of the solution is recovered to the value of the pure water. Then, the rinse processing is completed, and the solution in the processing bath 4 is discharged through a drain pipe (not shown).

According to the above-mentioned embodiment, the intermediate holding portion 406 using the pitch P/2 is prepared. First, wafers in the wafer cassette C are gripped by the first wafer chuck 404 at an unchanged pitch. The relative position between the intermediate holding portion 406 and the wafer chuck 404 is adjusted. The wafers are transferred n times, e.g., twice to arrange the wafers in the intermediate holding portion 406 at the pitch P/2. Thereafter, the wafers in the intermediate holding portion 406 are transferred to the processing bath 4 by the second wafer chuck. With this operation, the arrangement pitch of wafers can be converted on the wafer chuck 404 side without employing a specific structure. Therefore, the arrangement pitch can be converted by an easy method, and wafers can be arranged at a small pitch and washed.

By holding the wafers W on the wafer boat 3 at the predetermined pitch ½ times the arrangement pitch P, the processing bath can be downsized. Accordingly, the downsizing and cost reduction of the apparatus can be realized. At the same time, the consumption of a washing solution and pure water can be reduced, and a time required for substituting the washing solution with the rinse solution can be shortened to increase the rinse efficiency. As a result, the rinse time can be shortened to increase the throughput, and to shorten the tact time (time interval between completion of processing one wafer and the start of processing the next wafer).

In the above-mentioned embodiment, the intermediate holding portion 406 side is elevated. Alternatively, the first wafer chuck 404 side may be elevated to transfer the wafers W from the first wafer chuck 404 to the intermediate holding portion 406. In this case, the intermediate holding portion 406 is moved up to the position of the wafer chuck 404 and receives the wafers W gripped by the wafer chuck 404. The gripping portions 441 of the wafer chuck 404 are horizontally opened to transfer the wafers W from the wafer chuck 404 to the intermediate holding portion 406. When the relative position between the intermediate holding portion 406 and the wafer chuck 404 is adjusted in movement in a direction perpendicular to the arrangement direction of the wafers W, the intermediate holding portion 406 side may be moved as well as movement on the wafer chuck 404 side. In this case, a mechanism for moving the intermediate holding portion 406 corresponds to a moving portion.

Next, the fifth embodiment of the present invention will be described with reference to FIG. 37. This embodiment exemplifies to a method in which an exclusive wafer holder 3 is arranged to convey wafers in this wafer holder into a processing bath. The wafer holder 3 is obtained by arranging a holding rod 31 for holding the lower ends of wafers W, and holding rods 32 and 33 for holding the two sides of the lower end of each wafer W on a holder main body 30. For example, 50 holding grooves 34 for holding the wafers W at a pitch 1/n times the arrangement pitch of the wafers W in a wafer cassette C, e.g., at a pitch ½ times the arrangement pitch are formed in each of these holding rods 31 to 33.

The wafer holder 3 is conveyed by a holder convey means 593. As shown in FIG. 37, the holder convey means 593 comprises a pair of arms 35*a* and 35*b* for supporting the lower surfaces of corresponding supported portions 30*a* and 30*b* which are respectively bent forward and backward at the upper portions of the wafer holder 3.

In this embodiment, an arrangement for transferring the wafers from the wafer cassette C to the wafer holder 3 is completely the same as in the above embodiments. As shown in FIG. 38, a push-up member for pushing up the wafers W in the cassette C, and an elevating base 595 for elevating the wafer holder 3 so as to transfer the wafers W between the wafer chuck 404 and the wafer holder 3 are arranged. Reference numeral 596 denotes an elevating mechanism.

Figure 39A:
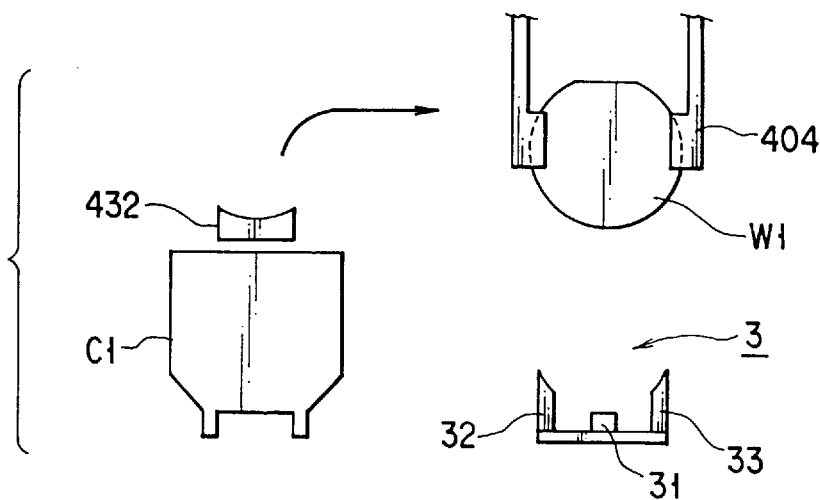
FIGS. 39A and 39B are schematic views, respectively, for explaining a wafer transfer operation.
Figure 39B:
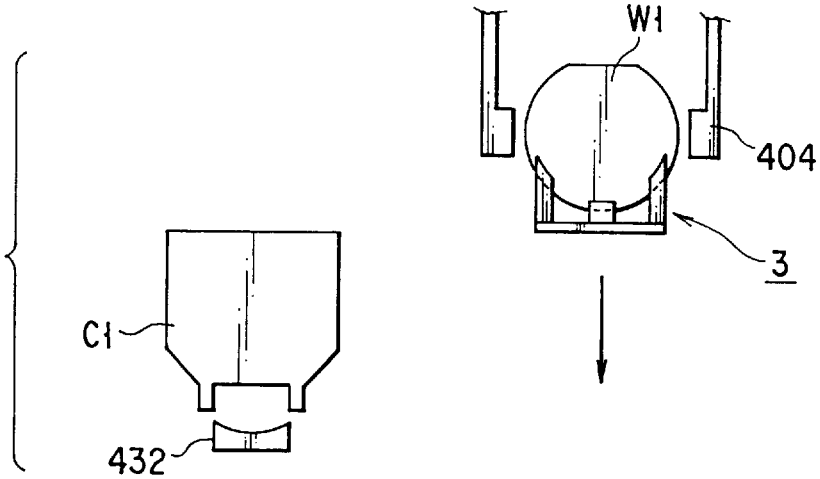
Figure 40:
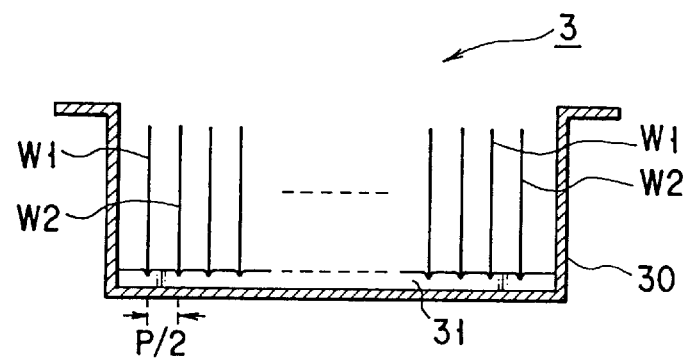
FIG. 40 is a schematic view showing a washing boat on which wafers are mounted.

In this embodiment as in the first embodiment, the wafers W in the wafer cassette C are transferred to the wafer holder 3 upon conversion of a pitch P into P/2. More specifically, as shown in FIG. 39A, the wafers W in the wafer cassette C are gripped by the wafer chuck 404 and conveyed to a position above the wafer holder 3. As shown in FIG. 39B, the wafer holder 3 is moved up by the elevating base 595 and receives the wafers W from the wafer chuck 404. Similarly, the wafers W in a next wafer cassette are transferred from the wafer chuck 404 to the wafer holder 3 such that the position of the wafer chuck 404 is shifted from the position in the previous transfer operation in the wafer arrangement direction by an amount corresponding to the pitch P/2. In this manner, the wafers W are held parallel to each other by the wafer holder 3 at the pitch P/2, as shown in FIG. 40. Note that, when the wafers W are to be transferred from the wafer chuck 404 to the wafer holder 3, the wafer chuck 404 may be moved down.

Thereafter, the wafer holder 3 holding the wafers W is conveyed into the processing bath 4 by the wafer holder convey means 593. The wafers W are similarly washed while being held by the wafer holder 3.

Figure 41:
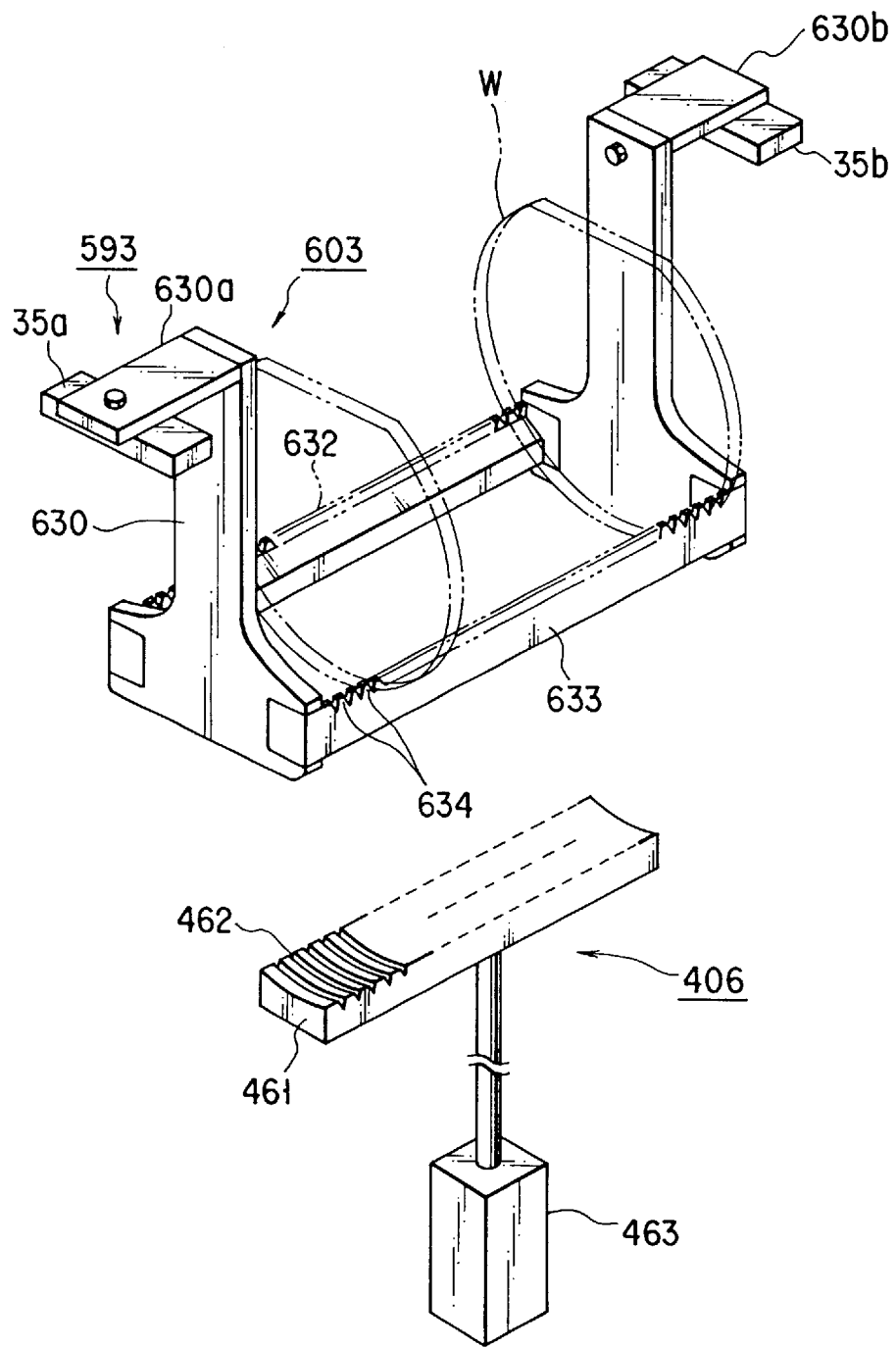
FIG. 41 is an exploded perspective view showing a substrate washing apparatus according to the sixth embodiment of the present invention.

Next, the sixth embodiment of the present invention will be described. As shown in FIG. 41, a wafer holder 603 used in this embodiment is obtained by arranging holding rods 632 and 633 for holding the two sides of the lower portion of each wafer W on an entire holder 630. For example, 50 holding grooves 634 for holding the wafers at a pitch 1/n times an arrangement pitch P of the wafers W in a wafer cassette C, e.g., at a pitch ½ times (P/2) the arrangement pitch are formed in each of the holding rods 632 and 633. As in the first embodiment described above, an intermediate holding portion 406 in which 50 holding grooves 462 are formed at the pitch P/2 is arranged to be freely elevated by an elevating mechanism 463. A passing space for the intermediate holding portion 406 is defined between the holding rods 632 and 633 of the wafer holder 603.

Figure 42A:
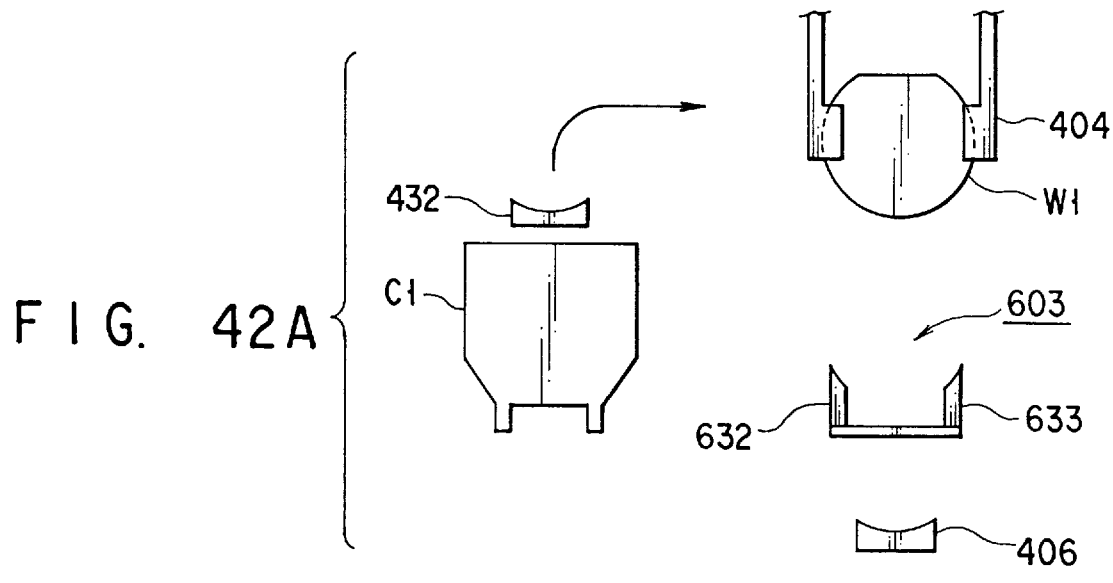
Figure 42B:
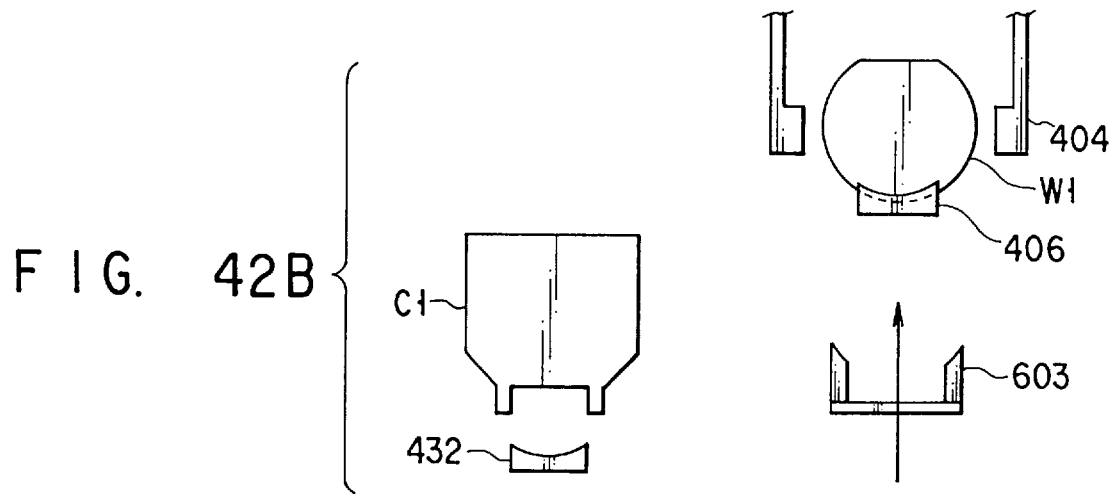

In this embodiment, as shown in FIG. 42A, a gripping wafer chuck 404 in a wafer cassette C1 is moved to a position above the wafer holder 603. Then, as shown in FIG. 42B, the intermediate holding portion 406 is moved up by the elevating portion 463 through the passing space between the holding rods 632 and 633 of the wafer holder 603 to receive and hold wafers W1 held by the wafer chuck 404. The intermediate holding portion is moved down through the passing space. During this movement, the wafers W1 are held by the holding rods 632 and 633 of the wafer holder 603, and the intermediate holding portion 406 is moved down to a position below the wafer holder 603. As shown in FIG. 42C, wafers W2 in a second wafer cassette C2 are similarly transferred from the wafer chuck 404 to the wafer holder 603. In this case, the transfer operation is performed after the wafer chuck 404 is stopped at a position shifted from a position in the first transfer operation in the arrangement direction of the wafers W by a pitch ½ times the arrangement pitch of the wafers in the wafer cassette C. In this manner, the 50 wafers W are transferred to the intermediate holding portion 406.

Also in this embodiment, after the intermediate holding portion 406 receives the first wafers, the intermediate holding portion 406 may be waited at a position above the wafer holder 603 to perform the second transfer operation.

When the wafers W in the wafer cassette C are pushed up by a push-up member, the wafers W arranged in the intermediate holding portion 406 at a pitch P/n are gripped by the chuck, or the washed wafers W are transferred from the wafer chuck to the wafer cassette C, the wafer cassette C, the intermediate holding portion, the wafer holder, or the like may be slightly inclined back and forth, as shown in FIG. 43 (in the example of FIG. 43, the intermediate holding portion 406 is illustrated), and the wafer chuck may be pulled up in the wafer standing direction. If the member is inclined in this manner, the wafers W are inclined in the same direction on one side of the holding grooves. Accordingly, the arrangement pitch of the wafers W becomes uniform, and the wafers W can be assuredly transferred by the wafer chuck. Note that, in FIG. 43, reference symbol H denotes a horizontal line, and reference symbol V denotes a perpendicular line with respect to the axis of the intermediate holding portion.

In the present invention, the pitch of the holding grooves formed in the intermediate holding portion 406 or the wafer holder 3 or 603 is not limited to a pitch half as large as the arrangement pitch P in the wafer cassette and may be 1/n times. In this case, the transfer operation of the wafers W to the intermediate holding portion 406 or the wafer holder 3 or 603 by the wafer chuck 404 is performed n times. The relative position between the wafer chuck 404 and the intermediate holding portion 406 or the wafer holder 3 or 603 in the wafer arrangement direction is shifted by a pitch P/n in each transfer operation. Further, the number of wafers W in one transfer operation is not limited to 25, and the number of wafers to be washed at once is not limited to 50.

A substrate washing apparatus according to the seventh embodiment of the present invention will be described below with reference to FIGS. 44 to 47.

Figure 44:
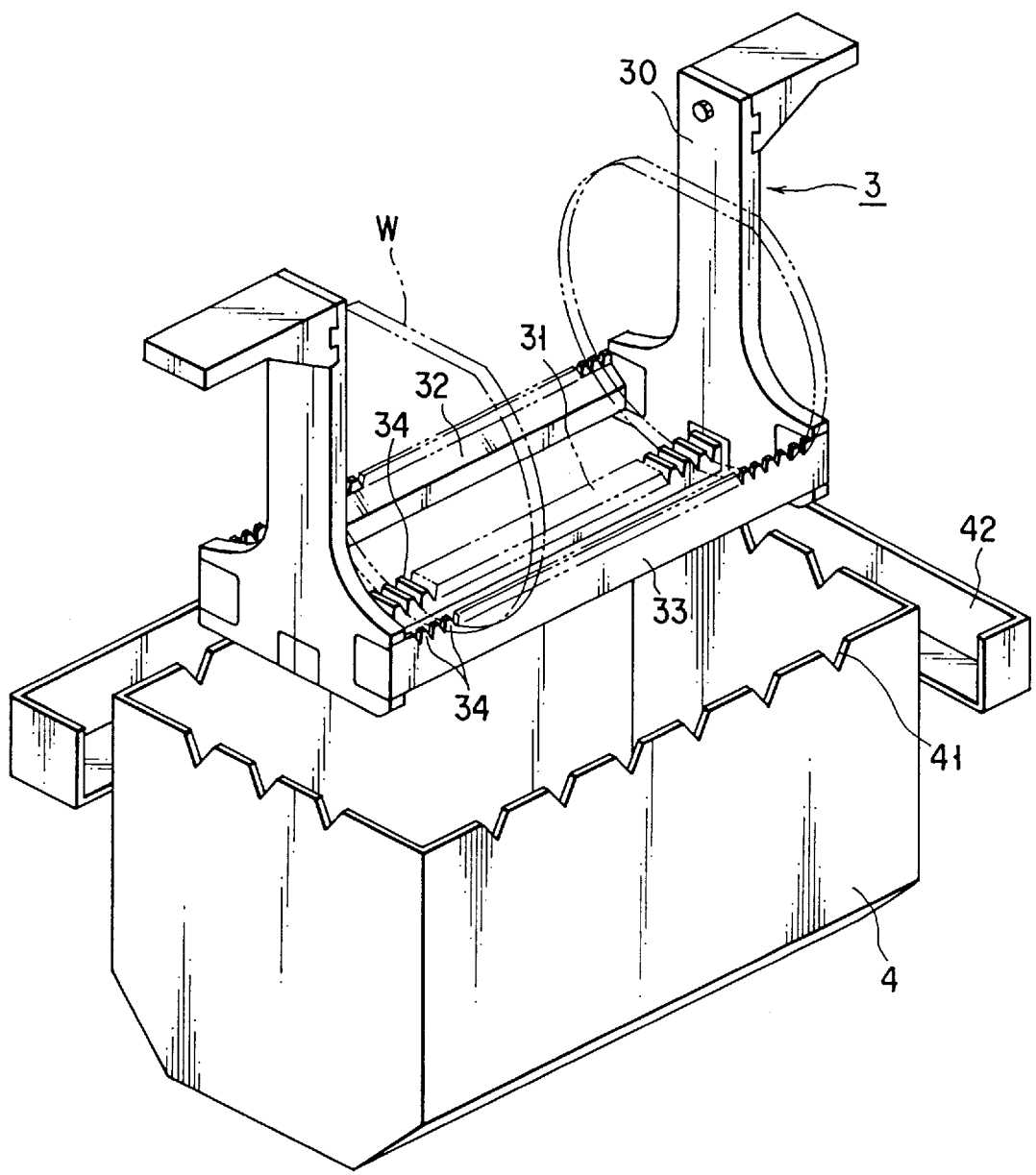
FIG. 44 is a schematic perspective view showing a substrate washing apparatus.
Figure 45:
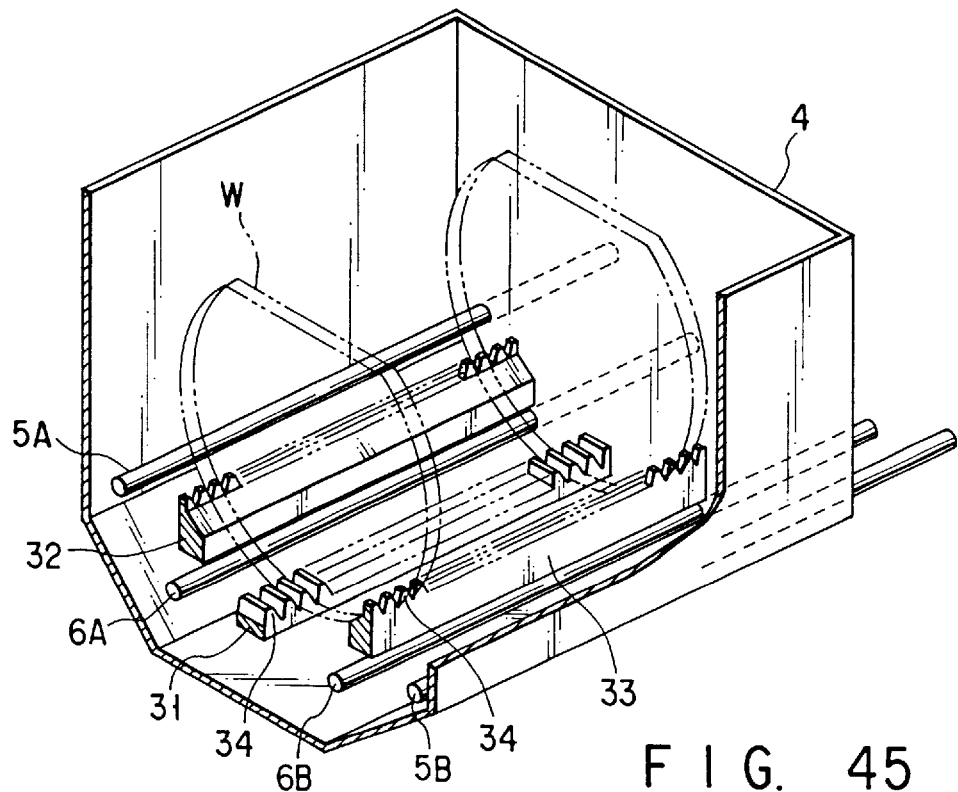
FIG. 45 is a partially cutaway sectional perspective view showing the inside of a processing bath in a substrate washing apparatus according to the seventh embodiment of the present invention.

As shown in FIG. 44, a processing bath 4 has a rectangular shape in which the left and right sides of a bottom surface are inclined inward. Triangular notched portions 41 are formed at the upper edge portion of the processing bath 4. A reception bath 42 for receiving an overflowing solution is arranged outside the upper edge portion of the processing bath 4.

Nozzles 5A, 5B, 6A, and 6B for supplying a rinse solution are disposed at positions on the left and right sides of holding rods 32 and 33 and at positions near the lower sides of the holding rods 32 and 33 in the longitudinal direction of the holding rods 32 and 33, respectively.

Figure 46:
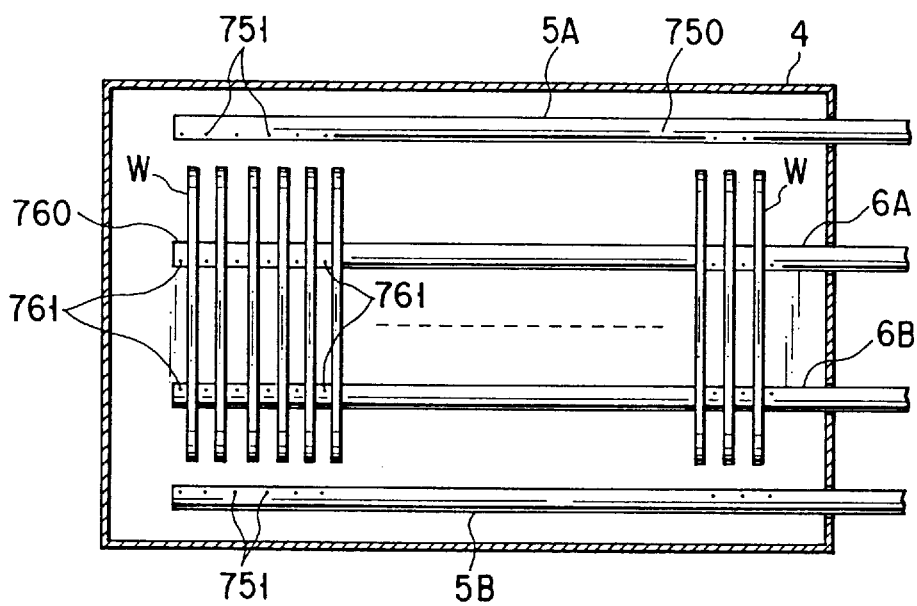
FIG. 46 is a plan view showing the arrangement of blow-off holes of rinse solution spray nozzles.
Figure 47:
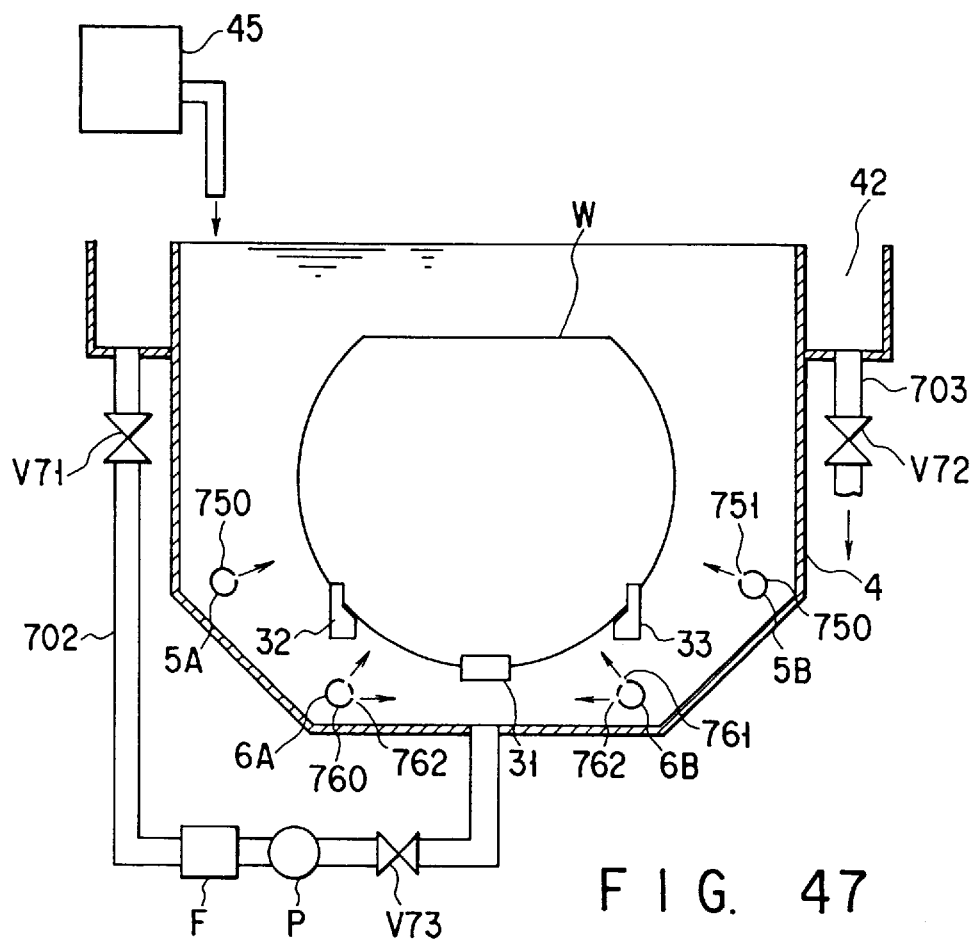
FIG. 47 is a schematic sectional block diagram showing a substrate washing apparatus.

Each of the nozzles 5A and 5B is constituted such that a large number of blow-off holes 751 (see FIGS. 46 and 47)

for blowing off a rinse solution toward the central portion of a wafer W are formed in the longitudinal direction in a rinse solution supply pipe 750 having an inner diameter of, e.g., 10 mm.

Each of the nozzles 6A and 6B is constituted such that a large number of blow-off holes 761 (see FIGS. 46 and 47) for blowing off the rinse solution toward the central portion of the wafer W, and a large number of blow-off holes 762 (see FIG. 47) for blowing off the rinse solution toward the lower side of the wafer W are formed in a rinse solution supply pipe 760 in the longitudinal direction. These nozzles 5A, 5B, 6A, and 6B extend through the wall portion of the rare surface of the processing bath 4 and are connected to an external rinse solution supply source (not shown).

The blow-off holes 751, 761, or 762 are formed at the same pitch as the arrangement pitch of the wafers held by a wafer holder 3. At the same time, the position of each of the blow-off holes 751, 761, and 762 in the arrangement direction corresponds to the central portion between the wafers W (provided that the position is horizontally shifted by a half pitch at the leading or trailing end of a group of wafers W).

A preferable hole diameter of each of the blow-off holes 751, 761, and 762 is 1.0 mm to 2.0 mm because a sufficient flow rate cannot be assured with a hole diameter less than 1.0 mm, and the blow-off distance becomes short with a hole diameter more than 2.0 mm.

A washing solution supply portion 771 for supplying a washing solution into the processing bath 4 is arranged above the processing bath 4 (see FIG. 47), and a circulating path 702 for circulating the washing solution is arranged between the bottom portion of the processing bath 4 and the reception bath 42. Valves V71 and V73, a filter F, and a pump P are interposed in the circulating path 702.

A discharge pipe 703 having a valve V72 to discharge a rinse solution is arranged in the reception bath 42. To supply the washing solution into the processing bath 4, a supply path for supplying the washing solution may be connected midway along the circulating path 702.

Next, the operation of the above-mentioned embodiment will be described.

Figure 48:
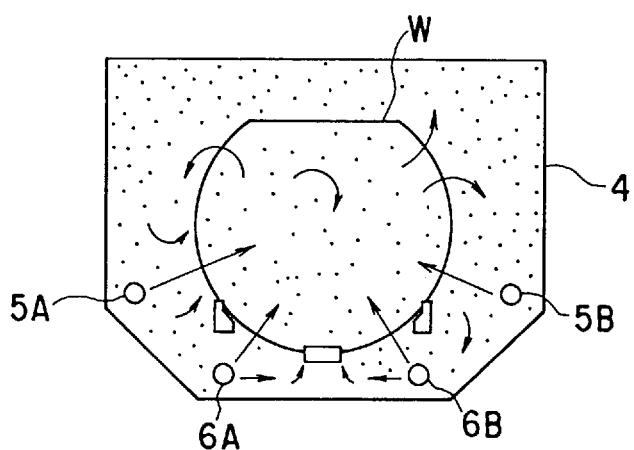
FIG. 48 is a view showing the movement of a rinse solution.

First of all, a washing solution, e.g., a 0.5-vol % hydrofluoric acid solution is supplied from a washing solution supply portion 45 into the processing bath 4. The valves V71 and V72 are opened to circulate and filter the washing solution. For example, 50 wafers W are transferred from a cassette to the wafer holder 3 by a wafer chuck 404. The wafer holder 3 is supported by a wafer convey means and conveyed into the processing bath 4 to dip the wafers W in the washing solution. In this manner, oxide films on the surfaces of the wafers W are etched with, e.g., the hydrofluoric acid solution. Then, the valves V71 and V73 are closed, and the pump P is stopped. At the same time, pure water is blown off from the blow-off holes 751, 761, and 762 of the rinse solution supply nozzles 5A, 5B, 6A, and 6B to generate turbulent flows in the processing bath 4, as shown in FIG. 48. While the solution in the processing bath 4 is stirred due to the turbulent flows, the washing solution is substituted with the pure water. At this time, the valve V72 is kept open, and the solution overflowing from the processing bath 4 is discharged outside through the discharge pipe 703.

Upon completion of the substitution in the processing bath 4 with the pure water, the pure water is blown off from the nozzles 5A, 5B, 6A, and 6B for a predetermined time to rinse the wafers W. Thereafter, the wafer holder 3 is removed from the processing bath 4 by the wafer convey means and conveyed into a processing bath for next processing, or into a wafer drying bath when the processing bath 4 is a processing bath on the final stage. Note that the rinse solution in the processing bath 4 is discharged through a drain pipe (not shown).

According to the above-mentioned embodiment, since pure water is blown off from the blow-off holes 751 and 761 toward the center of each wafer W along the plate surface of the wafer W, a washing solution near the surface of the wafer W is uniformly stirred. The concentration is decreased as a whole without generating concentration nonuniformity, thereby uniformly etching the surface of the wafer W regardless of positions. In addition, since pure water is blown off from the blow-off holes 762 toward the lower side of the wafer W, a thick washing solution is prevented from remaining on the lower side of the wafer W. The washing solution in the processing bath 4 is rapidly substituted with the pure water. Since the wafer W is highly uniformly washed, e.g., etched, the concentration of the washing solution, e.g., a hydrofluoric acid solution can be increased. Therefore, e.g., the etching time can also be shorted, the throughput can be increased, and the tact time can be shortened.

Figure 49:
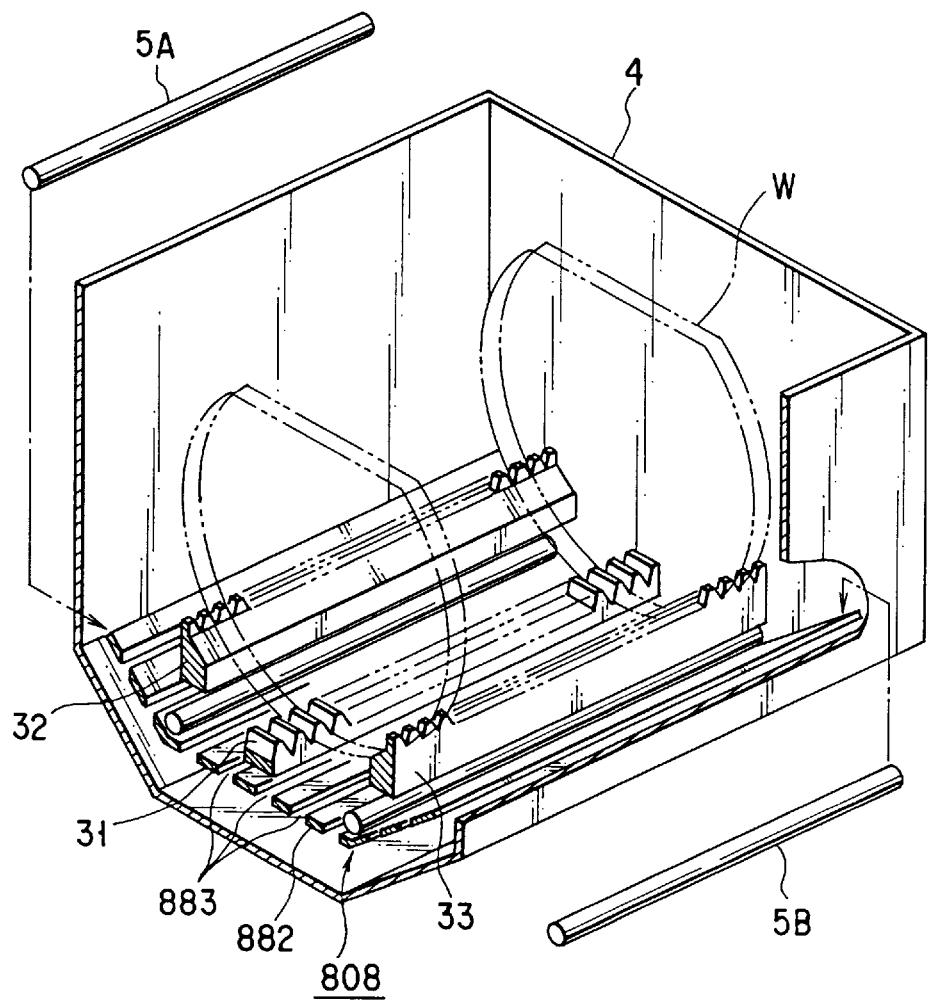
FIG. 49 is a cutaway exploded perspective view showing a substrate washing apparatus according to the eighth embodiment of the present invention.
Figure 55:
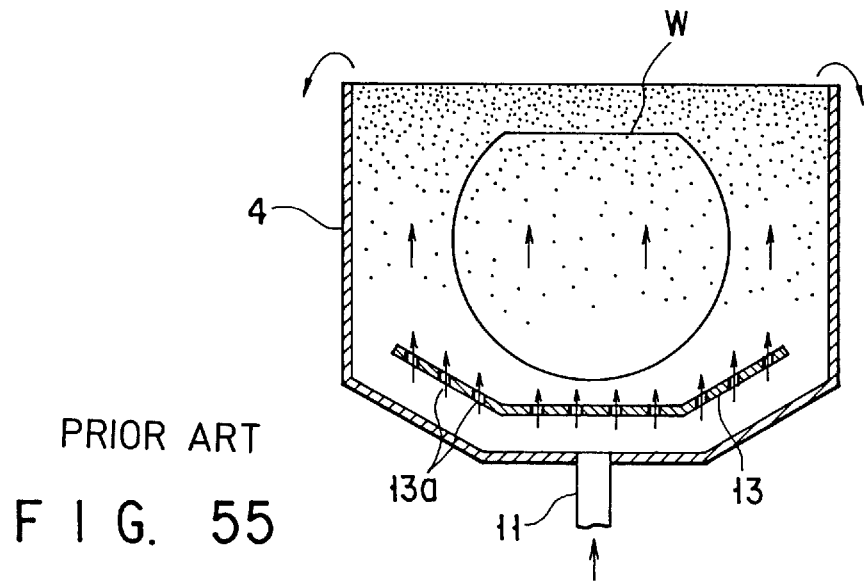
FIG. 55 is a view for explaining a conventional washing operation.

A substrate washing apparatus according to the eighth embodiment of the present invention will be described below with reference to FIGS. 49 and 50.

In this embodiment, a rinse solution supply pipe 704 for supplying, e.g., pure water is connected to the bottom portion of a processing bath 4, and a straightening means 808 is arranged below nozzles 5A, 5B, 6A, and 6B. Part of the rinse solution supply pipe 704 serves as part of a washing solution circulating path. The circulation of a washing solution and the supply of pure water are switched by valves V81, V83, and V84 shown in FIG. 50.

The straightening means 808 is constituted by a diffusion plate 43 having a diameter almost equal to that of, e.g., a supply port formed opposite to the supply port of the rinse solution supply pipe 704, and a straightening plate 882 which is supported by support legs (not shown) above the diffusion plate 43 and has two inclined sides corresponding to the bottom surface shape of the processing bath 4. The straightening plate 882 is constituted such that a plurality of slits 883 extending parallel to each other in the longitudinal direction are formed as communication holes in a plate-like member (except for the front and rear end portions) whose horizontal length is slightly larger than each of holding rods 31 to 33 of a wafer holder 3.

The straightening means 808 can include various arrangements such as an arrangement in which slits, a large number of circular holes, and the like are formed in a plate-like member, an arrangement in which a plurality of identical or different straightening plates 882 are vertically stacked at an interval, an arrangement in which a vertical plate extending in the longitudinal direction is attached near the two side portions of the straightening plate 882, and an arrangement in which the diffusion plate 43 is a batten having a length almost equal to each of the holding rods 31 to 33. The nozzles 5A, 5B, 6A, and 6B serving as rinse solution blow-off portions as in the first embodiment are respectively arranged above the edge portions of the two sides of the straightening plates 882 and above the bent portions between the horizontal portion at the center and the inclined portions such that the nozzles 5A, 5B, 6A, and 6B are in contact with or spaced apart from the corresponding portions. Note that the nozzles 5A, 5B, 6A, and 6B may be integrated into the straightening plate 882, as shown in FIG. 51.

The operation of the above apparatus will be described below.

As shown in FIG. 52A, a wafer W is placed on the wafer holder and dipped in a washing solution in the processing bath 4. Although the washing processing of the wafer W, e.g., steps up to a step of etching an oxide film on the surface of the wafer W is the same as in the above embodiments, a step of substituting the washing solution with a rinse solution is different.

More specifically, as shown in FIG. 52B, a rinse solution, e.g., pure water is blown off from the nozzles 5A, 5B, 6A, and 6B toward the central portion of the wafer W, and from the nozzles 6A and 6B along the surface of the straightening plate 882 below the wafer W. While turbulent flows are generated in the processing bath 4, the washing solution is substituted with the pure water.

When the concentration of the washing solution reaches a small value not to affect the etching uniformity with respect to the wafer W, the blow-off operation of the pure water is stopped, and pure water is supplied from the bottom portion of the processing bath 4 through the rinse solution supply pipe 704. The pure water supplied from the rinse solution supply port is first diffused by the diffusion plate 43 and straightened by the straightening plate 882, and goes up from the lower side of the wafer W. As a result, the washing solution is purged and substituted with the pure water in the processing bath 4. Thereafter, the pure water is continuously supplied for a predetermined time through the rinse solution supply pipe 704, and then the rinse processing is completed.

With such an apparatus of this embodiment, the rinse efficiency is increased compared to a case using the nozzles 5A, 5B, 6A, and 6B. That is, when a rinse solution is substituted by using only the nozzles, the substitution time (time required for recovering the resistivity of a solution) is relatively long because the solution flow in the processing bath 3 is turbulent. However, when a washing solution becomes thinned to sufficiently decrease the washing rate, e.g., the etching rate, and substitution with a rinse solution is performed through the straightening means 808, the washing solution is rapidly substituted with the rinse solution. Therefore, the washing processing uniformity, e.g., the etching uniformity can be assured in each wafer W. In addition, since the resistivity is rapidly recovered, a time required for whole rinse processing is shortened, and the consumption of pure water is decreased. Since a high-concentration solution can be used in washing processing (a high-concentration washing solution cannot be used with only a straightening means as described above), the washing processing can be efficiently performed, resulting in an increase in throughput and a decrease in tact time (a time interval between completion of processing one wafer and the start of processing a next wafer).

The supply of a rinse solution by the nozzles is transferred to the supply of the rinse solution through the straightening means at a timing when the concentration of a washing solution is decreased to a degree not to affect the washing processing uniformity. In, e.g., a hydrofluoric acid-based solution, a desirable resistivity (this resistivity corresponds to the concentration) at that time is about 0.5 to 3.0 Ω·cm. For example, the timing when the resistivity is decreased to the resistivity is checked in advance, and then the sequence can be constructed.

The present invention is very effective when an oxide film or polysilicon is etched with a hydrofluoric acid-based solution which greatly affects the etching uniformity depending on a concentration difference. However, the present invention is not limited to this and can be applied to, e.g., a case in which a nitride film is etched with a phosphoric acid solution, or a case in which aluminum is etched with a solution mixture of phosphoric acid, acetic acid, and nitric acid. In another washing processing, particles may be removed with an APM solution (ammonia+hydrogen peroxide solution+pure water), metal contamination may be cleaned with an HPM solution (hydrochloric acid+hydrogen peroxide solution+pure water), or organic matters in a resist film may be removed with an SPM solution (sulphuric acid+hydrogen peroxide solution).

Note that, in the washing apparatus constituted by combining nozzles and a straightening means like the apparatus of the eighth embodiment, when the chemical concentration hardly affects the washing processing uniformity, a rinse solution may be supplied through only the straightening means without using nozzles to perform substitution with the rinse solution.

As for the blown-off holes 751 and 761 of the nozzles 5A, 5B, 6A, and 6B, the blow-off direction of a rinse solution is not limited, provided that turbulent flows are generated in the processing solution to stir the solution. The blow-off holes 751 is exemplified with reference to FIG. 53. To uniformly stir a rinse solution, a preferable direction (browoff direction of the rinse solution) of the blow-off holes 751 is a direction along the surface of the wafer W, i.e., a direction between J1 and J3, a more preferable direction is a direction between J1 and a direction J2 toward the center of the wafer W and a still more preferable direction is the direction J2 toward the center of the wafer W.

As shown in FIG. 54A, the nozzle 5A (5B, 6A, 6B) may extend outside from the upper portion of the processing bath 4 by bending its proximal end portion to have an L shape and by further bending it to have an inverted L shape. Alternatively, as shown in FIG. 54B, i.e., as in the above embodiments, the nozzle 5A may be arranged inside from the outside through the wall portion of the processing bath 4. In the latter case, since the length can be shortened by a length α, the bath capacity can be decreased, thereby decreasing the consumption of a washing solution and a rinse solution. Since the rinse efficiency is also increased, the rinse time is shortened, and the throughput is increased.

When the nozzle 5A or the like extends through the wall portion of the processing bath 4, the connection portion may be sealed with a seal member 891 or welded. In addition, the number of nozzles such as the nozzle 5A is not limited to 4 as in the above embodiments, and, e.g., one nozzle (a total of two nozzles) may be arranged on each of the left and right sides of a wafer. Further, as for the rinse solution blow-off holes, the blow-off holes 751 of one nozzle 5A and the blow-off holes 751 of the other nozzle 751 may be alternately arranged in the longitudinal direction.

According to the present invention, when washing processing with a washing solution and rinse processing with a rinse solution are performed by using the same processing bath, the rinse solution is blown off from the rinse solution blow-off portions upon completion of the washing processing to substitute the washing solution with the rinse solution. Therefore, the washing processing can be highly uniformly performed. According to another invention, the straightening means is arranged in addition to the rinse solution blow-off portions. After the rinse solution is blown off from the rinse solution blow-off portions to decrease the concentration of the washing solution, the washing solution is substituted with the rinse solution by the flow of the rinse solution through the straightening means. Accordingly, the washing processing can be highly uniformly performed, and the washing solution can be substituted with the rinse solution within a short time.

The ninth embodiment of the present invention will be described blow with reference to FIGS. 56 to 60.

As shown in FIG. 56, a wafer holder 3 comprises a first holding rod 31, a second holding rod 32, and a third holding rod 33 which are interposed between a pair of end plates 930a and 930b. Supported portions 934a and 934b respectively bent forward and backward are formed at the upper end portions of the corresponding end plates 930a and 930b. A holder convey means comprises a pair of arms 35a and 35b. The arms 35a and 35b support the lower surfaces of corresponding supported portions 934a and 934b of the wafer holder 3 to convey the wafer holder 3 to units T2 to T4 described above.

The wafer holder described in this embodiment corresponds to the substrate holder according to one embodiment of the present invention. Note that a wafer W is not completely circular but has a linear portion F called an orientation flat. A target substrate in the present invention includes not only a completely circular substrate but also a partially cutaway substrate such as a wafer. Each of the holding rods 31 to 33 consists of, e.g., a fluoroplastic or quartz, and have, e.g., a columnar shape with a diameter of 15 mm. The holding rods 31 to 33 need not have a circular section, and need not have the same shape.

As shown in FIGS. 56 and 57, the holding rods 31 to 33 are arranged such that the holding rod 31 is positioned at a slightly upper right position with respect to a position immediately below the wafer W, the holding rod 32 is positioned at an obliquely upper right position with respect to the wafer W, and the holding rod 33 is positioned at an obliquely lower left position with respect to the wafer W. For example, 50 first holding grooves 34a, 50 second holding grooves 34b, and 50 third holding grooves 34c each for holding the peripheral portions of the wafer W are, respectively, formed in the surfaces of the holding rods 31 to 33 at a constant interval in the longitudinal direction of the holding rods 31 to 33.

The positional relationship between the holding grooves 34a to 34c will be described with reference to FIG. 57. Each first holding groove 34a is arranged near a lower end P1 of the wafer W at a position displaced from the lower end P1 to an upper right position (FIG. 57) along the peripheral edge of the wafer W to obtain an inscribed angle θ1 of, e.g., about 5° between the lower end P1 and the center of the holding groove 34a. Each second holding groove 34b is arranged near a left end P2 of the wafer W (FIG. 57) at a position displaced from the left end P2 to a lower right position (FIG. 57) along the peripheral edge of the wafer W to obtain an inscribed angle θ2 of, e.g., about 5° between the left end P2 and the center of the holding groove 34b. Each third holding groove 34c is positioned above a right end P3 (FIG. 57) of the wafer W. For example, in an 8" wafer W, the center of the holding groove 34c is positioned above a line H by, e.g., 15 to 18 mm.

When viewed from the direction of depth of the groove, i.e., from the direction indicated by a dotted arrow in FIG. 57, each of the first holding groove 34a and the second holding groove 34b is formed into a V-shape having an opening angle θ4 of 60°. The two front and rear sides of the peripheral portion of the wafer W are relatively pinched between the inclined surfaces of the holding grooves 34a and 34b each having this V-shaped section to hold the wafer W. Note that the bottom edge of each of the V-shaped holding grooves 34a and 34b extends in, e.g., almost the tangential direction of the wafer W.

When viewed from the direction indicated by the dotted arrow in FIG. 57, the third holding groove 34c has a Y shape, as shown in FIG. 58B. The third holding groove 34c holds the front and rear surfaces of the wafer W near its peripheral portion. The third holding groove 34c is constituted by a groove base portion 961 which has a U-shaped section and is formed to have a small play y with respect to the peripheral portion of the wafer W in the horizontal direction, and a guide portion 962 which is continuously enlarged from the opening edge of the groove base portion 961 to guide the peripheral portion of the wafer W into the groove base portion 961. The groove base portion 961 of the third holding groove 34c may have a V shape, as shown in FIG. 58C, or only one side surface of the guide portion 962 may be inclined, as shown in FIG. 58D. Note that the bottom edge of the groove base portion 961 of the third holding groove 34c extends in the same direction as, e.g., a direction to enter/remove the wafer W.

Figure 59:
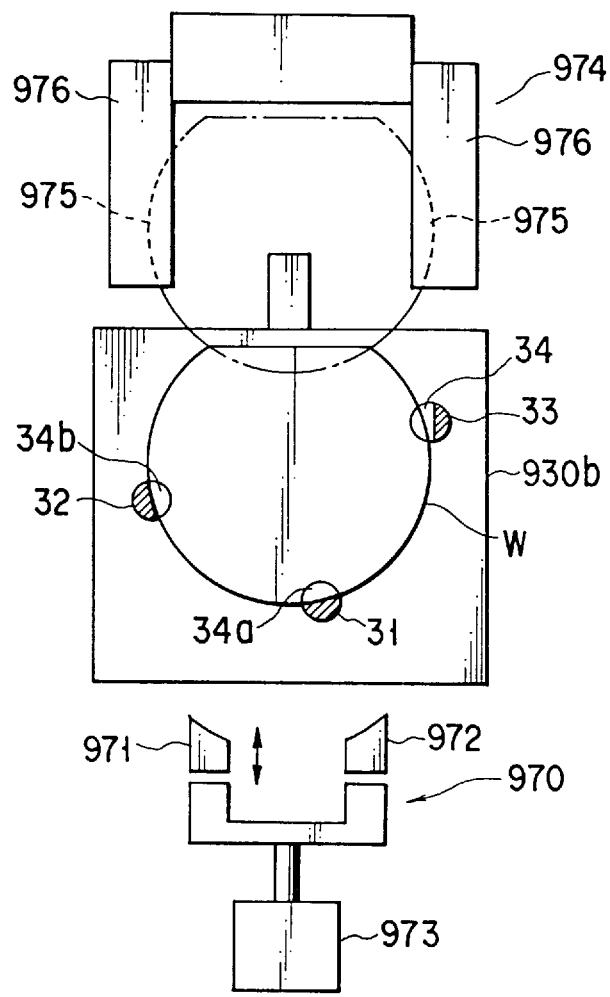
FIG. 59 is a schematic view showing a wafer boat, a lift mechanism, and a chuck mechanism.

As shown in FIG. 59, a push-up means 970 for lifting up the wafers W in the wafer holder 3 at once is arranged below the placement position of the wafer holder 3 in/from which the wafers W are enter/removed. The push-up means 970 comprises push-up members 971 and 972 for holding the obliquely lower left and right peripheral portions of the wafers W, and an elevating portion 973 for elevating the push-up members 971 and 972. Fifth grooves are formed in each of the push-up members 971 and 972 in accordance with the storage number of the holder 3 so as to push up, e.g., 50 wafers W at once.

As shown in FIG. 59, gripping grooves 975 for gripping the peripheral portions of the wafers W are formed in a wafer chuck 974 for transferring the wafers from a cassette C to wafer holder 3. In addition, the wafer chuck 974 comprises a pair of gripping portions 976 which are opened and closed. The wafers W are entered in and removed from the wafer holder 3 through the push-up members 971 and 972.

Figure 60:
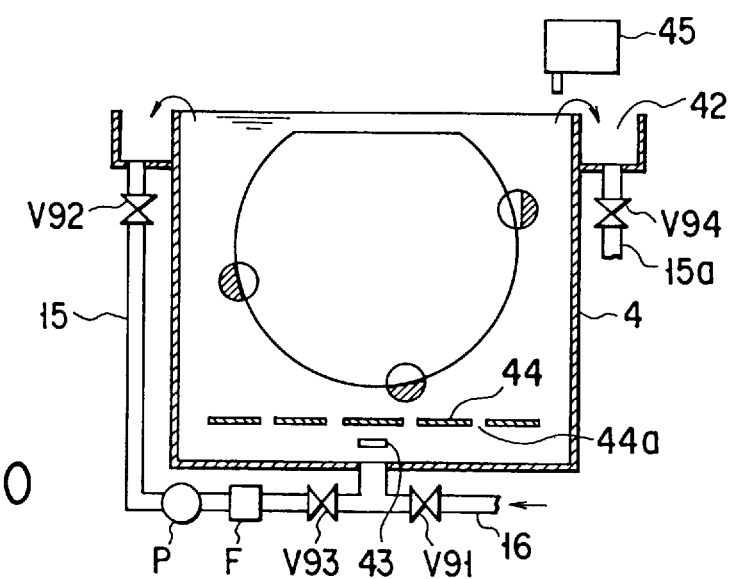
FIG. 60 is a schematic view showing a substrate washing apparatus having a wafer boat.
Figure 61:
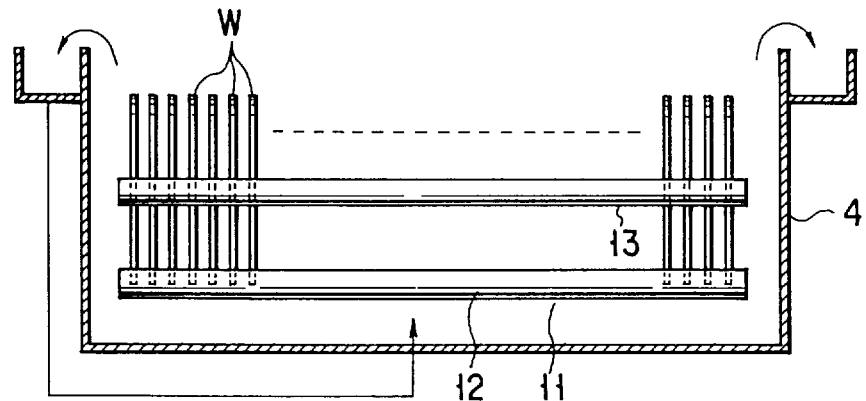
FIG. 61 is a view showing a conventional washing wafer boat.
Figure 62:
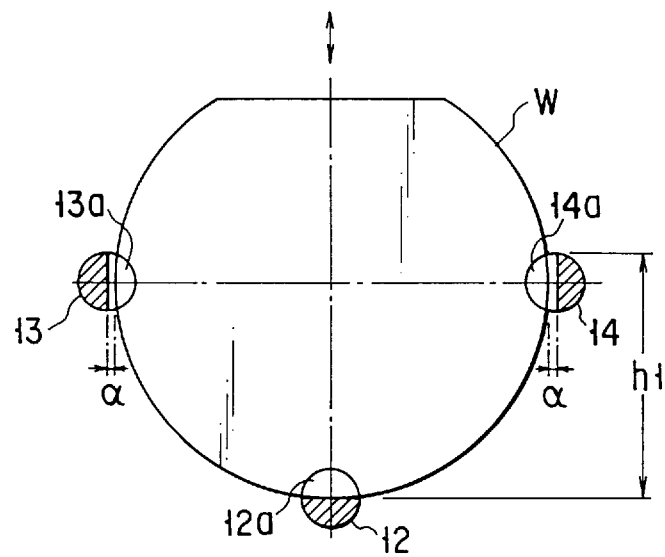
FIG. 62 is a view showing a conventional washing wafer boat.
Figure 63:
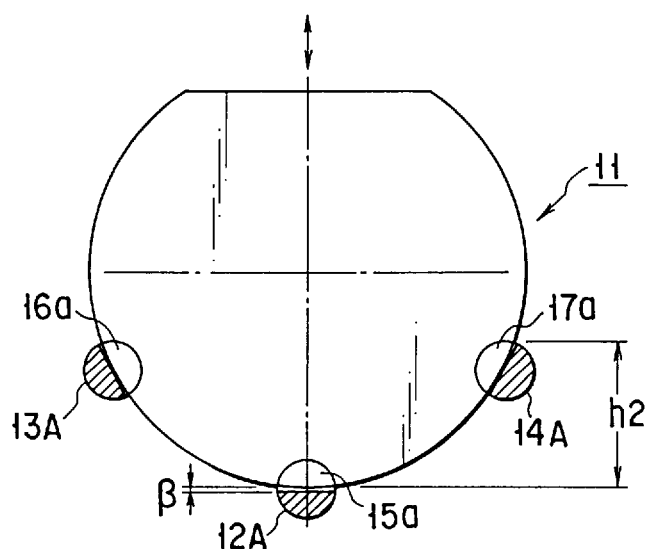
FIG. 63 is a view showing a conventional washing wafer boat.

On the other hand, the three processing bath T2 to T4 have almost the same structure, and the arrangement of each processing bath 4 (T2 to T4) and related units will be described in short with reference to FIGS. 56 and 60.

A rinse solution supply pipe 16 for supplying a rinse solution, e.g., pure water is connected to the bottom portion of the processing bath 4. A straightening plate 44 is arranged between the bottom portion of the processing bath 4 and the wafer holder 3. The rinse solution supply pipe 16 serves as part of a chemical circulating path 15 and is connected to a supply source (not shown) of, e.g., pure water through a valve V91. The circulating path 15 is arranged between the bottom portion of a reception bath 42 and the bottom portion of the processing bath 4. A valve V92, a pump P, a filter F, and a valve V93 are interposed in the circulating path 15. A discharge pipe 15a having a valve V94 to discharge pure water in rinse processing is connected to the reception bath 42.

Slits 44a extending parallel to each other in the longitudinal direction, and hole portions 44b arranged in the longitudinal direction are formed in the straightening plate 44 constituted by a plate-like member slightly longer than each of the holding rods 31, 32, and 33 of the wafer holder 3. A washing solution supply portion 45 is arranged above the processing bath 4 at a position not to interfere with the wafer chuck 974.

Prior to a description of the main part of the substrate washing apparatus according to this embodiment, a whole apparatus including a convey system will be described in short with reference to FIG. 1. The whole apparatus is constituted by three zones, i.e., a loading section A for storing target substrates, e.g., semiconductor wafers, before washing processing in units of cassettes, a washing section B for washing the wafers, and an unloading section C for extracting the washed wafers in units of cassettes.

In the loading section A, a cassette C storing, e.g., 25 wafers is temporarily loaded from the outside to a waiting portion 21 by a cassette convey means 20, and then conveyed to a loader portion 22. At this portion, wafers in the cassette C are transferred to an exclusive wafer holder by a wafer chuck (not shown). In the washing section B, e.g., three wafer convey mechanisms R1 to R3 are arranged along a line connecting the loading section A and the unloading section C. Each of the wafer convey mechanisms R1 to R3 comprises a holder convey means for conveying the wafer holder holding the wafer into the apparatus. A washing/drying bath T1 for washing/drying a holder convey means 23 of the wafer convey mechanism R1, three processing baths T2 to T4, a washing/drying bath T5 for washing/drying a holder convey means 24 of the wafer convey mechanism means R3, and a wafer drying bath T6 for drying wafers with steam are sequentially arranged from the loading section A side.

Each of the processing baths T2 to T4 is constituted such that wafers are washed with a washing solution and rinsed with, e.g., pure water. For example, e.g., 50 wafers are held by an exclusive holder (to be described later) at once and sequentially washed in the processing baths T2 to T4 through the wafer convey mechanisms R1 to R3. A washing/drying line 25 for washing/drying the hollow cassette C from which the wafer chuck extracts wafers is arranged at an upper portion in the washing section B. The cassette C is supplied to the washing/drying line at the loader portion 22 and an elevating mechanism 26.

FIG. 2 shows the schematic outer appearance of the above-mentioned exclusive wafer holder and processing bath unit. A wafer holder 3 is constituted such that a holding rod 31 for holding the lower ends of wafers W, and holding rods 32 and 33 for holding the two sides of the lower portions of each wafer W are arranged on a holder main body 30. For example, 50 holding grooves 34 each for holding the corresponding wafer W are formed in these holding rods 31 to 33 at a predetermined pitch. The holder convey means is constituted by a pair of arms 61a and 61b for supporting the lower surfaces of corresponding supported portions 30a and 30b which are respectively bent forward and backward at the upper portions of the wafer holder 3.

What is claimed is:

1. A substrate washing method of extracting, from a cassette, a plurality of substrates which are arranged at a substantially equal pitch interval in said cassette, and conveying said substrates into a processing bath to wash said substrates in said processing bath, comprising the steps of:

(a) transferring said plurality of substrates to a holder a pitch interval narrower than the arrangement pitch interval in said cassette;

(b) supplying a washing solution into said processing bath;

(c) conveying said holder holding said substrates into said processing bath;

(d) dipping said substrates into the washing solution in said processing bath together with said holder to wash said substrates; and (e) introducing a rinse solution into said processing bath to substitute the washing solution in said processing bath with the rinse solution to rinse said substrates in said processing bath.

2. A method according to claim 1, wherein said step (e) includes the steps of:

discharging the washing solution from said processing bath to temporarily keep the discharged washing solution outside said processing bath; and supplying said rinse solution into said processing bath to substitute the washing solution in said processing bath with the rinse solution;

wherein a time interval between the step of discharging the washing solution and the step of supplying the rinse solution into said processing bath is within 10 seconds.

3. A method according to claim 1, wherein the wash solution comprises a hydrofluoric acid solution, a solution mixture of ammonia/hydrogen peroxide, or a solution mixture of hydrochloric acid/hydrogen peroxide.

4. A method according to claim 1, wherein water having a resistivity of not less than 18 MΩ·cm is used as the rinse solution.

5. A method according to claim 1, wherein said step (e) includes the steps of:

supplying the rinse solution towards the substrates from a plurality of ports positioned in said processing bath.

6. A substrate washing method of extracting, from a cassette, a plurality of substrates which are arranged at a substantially equal pitch interval in said cassette, and conveying said substrates into a processing bath containing a washing solution to wash said substrates in said processing bath, comprising:

(a) a step of preparing first and second gripping means for gripping said substrates in said cassette, and an intermediate holding portion for holding substrates whose number is an integral multiple of a number of substrates that each gripping means can hold;

(b) a first transfer step of transferring said substrates from said cassette to said intermediate holding portion by said first gripping means at the arrangement pitch interval in said cassette;

(c) a moving step of moving said first gripping means and said intermediate holding portion from predetermined positions in the first transfer step to positions shifted in an arrangement direction of said substrates by a pitch interval m/n (n is an integer of not less than 2, and m is an integer of not less than 1) times the arrangement pitch interval in said cassette;

(d) a second transfer step of transferring said substrates from said intermediate holding portion to a holder in said processing bath by said second gripping means at a pitch interval 1/n times the arrangement pitch interval in said cassette, wherein said intermediate holding portion holds said substrates at the pitch interval 1/n times larger than the arrangement pitch interval in said cassette by repeating the first transfer step (b) and the moving step (c) so as to perform the first transfer step (b) n times, and said second gripping means extracts said substrates from said intermediate holding portion to transfer said substrates to said holder in said processing bath; and (e) a step of dipping said substrates and said holder in said processing bath to wash said substrate therein.

7. A substrate washing method of extracting, from a cassette, a plurality of substrates which are arranged at a substantially equal pitch interval in said cassette, and conveying said substrates into a processing bath containing a washing solution to wash said substrates in said processing bath, comprising:

(a) a step of preparing gripping means for gripping said substrates in said cassette, and a holder for receiving said substrates from said gripping means to hold said substrate;

(b) transfer step of transferring said substrates from said cassette to said holder by said gripping means at the arrangement pitch interval in said cassette; and (c) a moving step of moving said gripping means and said holder from predetermined positions in the transfer step to positions shifted in an arrangement direction of said substrates by a distance m/n (n is an integer of not less than 2, and m is an integer of not less than 1) times the arrangement pitch interval in said cassette;

wherein said holder holds said substrates at a pitch interval 1/n times the arrangement pitch interval in said cassette by repeating the transfer step (b) and the moving step (c) so as to perform the transfer step (b) n times, and said holder holding said substrates is conveyed into said processing bath to dip said substrates in the washing solution together with said holder to wash said substrates therein.

* * * * *